(12) United States Patent
Kodas et al.

(10) Patent No.: US 7,384,447 B2
(45) Date of Patent: *Jun. 10, 2008

(54) COATED NICKEL-CONTAINING POWDERS, METHODS AND APPARATUS FOR PRODUCING SUCH POWDERS AND DEVICES FABRICATED FROM SAME

(75) Inventors: Toivo T. Kodas, Albuquerque, NM (US); Mark J. Hampden-Smith, Albuquerque, NM (US); James Caruso, Albuquerque, NM (US); Quint H. Powell, Albuquerque, NM (US); Clive D. Chandler, Portland, OR (US); Daniel J. Skamser, Albuquerque, NM (US)

(73) Assignee: Cabot Corporation, Boston, MA (US)

( * ) Notice: Subject to any disclaimer, the term of this patent is extended or adjusted under 35 U.S.C. 154(b) by 608 days.

This patent is subject to a terminal disclaimer.

(21) Appl. No.: 10/904,254

(22) Filed: Nov. 1, 2004

(65) Prior Publication Data

US 2005/0097988 A1 May 12, 2005

Related U.S. Application Data

(60) Continuation of application No. 09/991,270, filed on Nov. 9, 2001, now Pat. No. 7,097,686, which is a division of application No. 09/028,678, filed on Feb. 24, 1998, now Pat. No. 6,316,100.

(60) Provisional application No. 60/039,450, filed on Feb. 24, 1997, provisional application No. 60/038,258, filed on Feb. 24, 1997.

(51) Int. Cl.
*B22F 1/02* (2006.01)

(52) U.S. Cl. ............................. 75/332; 75/351; 75/370

(58) Field of Classification Search ................... 75/332, 75/351, 370
See application file for complete search history.

(56) References Cited

U.S. PATENT DOCUMENTS

| 2,398,301 | A | 4/1946 | Frevel |
| 3,510,292 | A | 5/1970 | Hardy et al. |
| 3,620,713 | A | 11/1971 | Short |
| 3,620,714 | A | 11/1971 | Short |

(Continued)

FOREIGN PATENT DOCUMENTS

EP 0 537 502 4/1993

(Continued)

OTHER PUBLICATIONS

U.S. Appl. No. 10/904,237 by Kodas et al.; filed Oct. 29, 2004; entitled "Coated Copper-Containing Powders, Methods and Apparatus for Producing Such Powders and Copper-Containing Devices Fabricated From Same".

(Continued)

*Primary Examiner*—George Wyszomierski
(74) *Attorney, Agent, or Firm*—Marsh Fischmann & Breyfogle LLP

(57) ABSTRACT

Nickel powder batches including coated nickel-containing particles and methods for producing the same. The coated nickel-containing particles having have a small particle size, narrow size distribution and a spherical morphology. The present invention is also directed to devices incorporating the coated nickel-containing particles.

67 Claims, 44 Drawing Sheets

U.S. PATENT DOCUMENTS

| | | |
|---|---|---|
| 3,711,274 A | 1/1973 | Montino et al. |
| 3,717,481 A | 2/1973 | Short |
| 3,725,035 A | 4/1973 | Short et al. |
| 3,748,118 A | 7/1973 | Montino et al. |
| 3,768,994 A | 10/1973 | Daiga |
| 3,785,801 A | 1/1974 | Benjamin |
| 3,816,097 A | 6/1974 | Daiga |
| 3,830,435 A | 8/1974 | Hill |
| 3,846,345 A | 11/1974 | Mason et al. |
| 3,850,612 A | 11/1974 | Montino et al. |
| 3,865,744 A | 2/1975 | Parker et al. |
| 3,881,914 A | 5/1975 | Heidelberg |
| 3,882,050 A | 5/1975 | Niebylski |
| 3,885,955 A | 5/1975 | Lutz et al. |
| 3,902,102 A | 8/1975 | Burn |
| 3,966,463 A | 6/1976 | Fraioli et al. |
| 3,988,651 A | 10/1976 | Hertz |
| 4,020,206 A | 4/1977 | Beil |
| 4,023,961 A | 5/1977 | Douglas et al. |
| 4,036,634 A | 7/1977 | Fraioli et al. |
| 4,044,193 A | 8/1977 | Petrow et al. |
| 4,072,771 A | 2/1978 | Grier, Sr. |
| 4,089,676 A | 5/1978 | Grundy |
| 4,096,316 A | 6/1978 | Tamai et al. |
| 4,115,493 A | 9/1978 | Sakabe et al. |
| 4,122,232 A | 10/1978 | Kuo |
| 4,130,671 A | 12/1978 | Nagesh et al. |
| 4,136,059 A | 1/1979 | Jalan et al. |
| 4,140,817 A | 2/1979 | Brown |
| 4,146,957 A | 4/1979 | Toenshoff |
| 4,223,369 A | 9/1980 | Burn |
| 4,252,558 A | 2/1981 | Touboul et al. |
| 4,274,877 A | 6/1981 | Collier et al. |
| 4,326,889 A | 4/1982 | Sperner |
| 4,364,974 A | 12/1982 | Lask |
| 4,383,852 A | 5/1983 | Yoshizawa |
| 4,396,420 A | 8/1983 | Schmidberger et al. |
| 4,396,899 A | 8/1983 | Ohno |
| 4,409,135 A | 10/1983 | Akimune et al. |
| 4,410,457 A | 10/1983 | Fujimura et al. |
| 4,450,188 A | 5/1984 | Kawasumi |
| 4,464,420 A | 8/1984 | Taguchi et al. |
| 4,477,296 A | 10/1984 | Nair |
| 4,517,018 A | 5/1985 | Tadashi et al. |
| 4,539,041 A | 9/1985 | Figlarz et al. |
| 4,578,114 A | 3/1986 | Rangaswamy et al. |
| 4,600,604 A | 7/1986 | Siuta |
| 4,612,048 A | 9/1986 | German et al. |
| 4,613,371 A | 9/1986 | Cheney et al. |
| 4,645,532 A | 2/1987 | Mackiw et al. |
| 4,670,047 A | 6/1987 | Kopatz et al. |
| 4,687,511 A | 8/1987 | Paliwal et al. |
| 4,689,075 A | 8/1987 | Uda et al. |
| 4,721,524 A | 1/1988 | Sheldon et al. |
| 4,728,359 A | 3/1988 | Huther et al. |
| 4,731,110 A | 3/1988 | Kopatz et al. |
| 4,778,517 A | 10/1988 | Kopatz et al. |
| 4,781,980 A | 11/1988 | Yoshitake et al. |
| 4,802,933 A | 2/1989 | Rabinkin |
| 4,804,167 A | 2/1989 | Kock et al. |
| 4,810,285 A | 3/1989 | Otsuka et al. |
| 4,832,912 A | 5/1989 | Yabuki et al. |
| 4,857,233 A | 8/1989 | Teichmann et al. |
| 4,863,510 A | 9/1989 | Tamemasa et al. |
| 4,892,579 A * | 1/1990 | Hazelton .................. 419/46 |
| 4,897,110 A | 1/1990 | Kock et al. |
| 4,913,731 A | 4/1990 | Kopatz et al. |
| 4,915,733 A | 4/1990 | Schutz et al. |
| 4,948,739 A | 8/1990 | Charmot |
| 4,954,926 A | 9/1990 | Pepin |
| 5,039,552 A | 8/1991 | Riemer |
| 5,063,021 A | 11/1991 | Anand et al. |
| 5,073,409 A | 12/1991 | Anderson et al. |
| 5,102,452 A | 4/1992 | Taskinen et al. |
| 5,122,182 A | 6/1992 | Dorfman et al. |
| 5,126,915 A | 6/1992 | Pepin et al. |
| 5,139,891 A | 8/1992 | Cowie et al. |
| 5,147,484 A | 9/1992 | Chance et al. |
| 5,149,516 A | 9/1992 | Han et al. |
| 5,167,869 A | 12/1992 | Nebe et al. |
| 5,171,734 A | 12/1992 | Sanjurjo |
| 5,236,523 A | 8/1993 | Shibata |
| 5,250,229 A | 10/1993 | Hara et al. |
| 5,283,104 A | 2/1994 | Aoude et al. |
| 5,288,430 A | 2/1994 | Amemiya |
| 5,296,189 A | 3/1994 | Kang et al. |
| 5,338,330 A | 8/1994 | Polizzotti et al. |
| 5,350,727 A | 9/1994 | Tsurumi et al. |
| 5,356,842 A | 10/1994 | Yamakawa et al. |
| 5,358,585 A | 10/1994 | Shibata |
| 5,399,432 A | 3/1995 | Schleifstein et al. |
| 5,402,305 A | 3/1995 | Asada et al. |
| 5,405,707 A | 4/1995 | Tani et al. |
| 5,418,193 A | 5/1995 | Tani et al. |
| 5,420,744 A | 5/1995 | Asada et al. |
| 5,421,854 A | 6/1995 | Kodas et al. |
| 5,424,140 A | 6/1995 | Rabinkin |
| 5,429,657 A | 7/1995 | Glicksman et al. |
| 5,429,670 A | 7/1995 | Miyoshi |
| 5,439,502 A | 8/1995 | Kodas et al. |
| 5,470,373 A | 11/1995 | Edelstein et al. |
| 5,495,386 A | 2/1996 | Kulkarni |
| 5,505,991 A | 4/1996 | Schmid et al. |
| 5,512,379 A | 4/1996 | Kawasumi et al. |
| 5,523,006 A | 6/1996 | Strumban |
| 5,545,360 A | 8/1996 | Yang |
| 5,588,983 A | 12/1996 | Tani et al. |
| 5,614,346 A | 3/1997 | Adel et al. |
| 5,616,165 A | 4/1997 | Glicksman et al. |
| 5,623,725 A | 4/1997 | Disam et al. |
| 5,728,362 A | 3/1998 | Greuter et al. |
| 5,741,522 A | 4/1998 | Violante et al. |
| 5,759,939 A | 6/1998 | Klabunde et al. |
| 5,763,106 A | 6/1998 | Blanchard et al. |
| 5,770,126 A | 6/1998 | Singh et al. |
| 5,852,768 A | 12/1998 | Jacobsen et al. |
| 5,853,451 A | 12/1998 | Ishikawa |
| 5,861,136 A | 1/1999 | Glicksman et al. |
| 5,882,802 A | 3/1999 | Ostolski |
| 5,928,405 A | 7/1999 | Ranade et al. |
| 5,958,361 A | 9/1999 | Laine et al. |
| 5,964,918 A | 10/1999 | Asada et al. |
| 5,981,069 A | 11/1999 | Tani et al. |
| 6,007,743 A | 12/1999 | Asada et al. |
| 6,045,769 A | 4/2000 | Kambe et al. |
| 6,103,393 A | 8/2000 | Kodas et al. |
| 6,159,267 A | 12/2000 | Hampden-Smith et al. |
| 6,165,247 A | 12/2000 | Kodas et al. |
| 6,277,169 B1 | 8/2001 | Hampden-Smith et al. |
| 6,316,100 B1 | 11/2001 | Kodas et al. |
| 6,338,809 B1 | 1/2002 | Hampden-Smith et al. |
| 6,565,774 B2 | 5/2003 | Ohashi et al. |
| 6,635,348 B1 | 10/2003 | Hampden-Smith et al. |
| 6,679,937 B1 | 1/2004 | Kodas et al. |
| 6,689,186 B1 | 2/2004 | Hampden-Smith et al. |
| 6,699,304 B1 | 3/2004 | Hampden-Smith et al. |
| 6,780,350 B1 | 8/2004 | Kodas et al. |
| 6,830,823 B1 | 12/2004 | Kodas et al. |
| 7,078,008 B2 | 7/2006 | Allison et al. |
| 7,083,747 B2 * | 8/2006 | Hampden-Smith et al. .... 264/7 |
| 7,097,686 B2 * | 8/2006 | Chandler et al. ............ 75/331 |

2005/0097987 A1    5/2005  Kodas et al.

FOREIGN PATENT DOCUMENTS

| EP | 0 540 054 | 5/1993 |
|----|-----------|--------|
| EP | 0 593 167 | 4/1994 |
| EP | 0 776 717 | 6/1997 |
| JP | 59-103301 | 6/1984 |
| JP | 62-2404 | 1/1987 |
| JP | 63-31522 | 6/1988 |
| JP | 6-172802 | 6/1994 |
| JP | 8-170112 | 7/1996 |

OTHER PUBLICATIONS

U.S. Appl. No. 10/949,601 by Kodas et al.; filed Sep. 24, 2004; entitled "Coated Silver-Containing Particles, Method and Apparatus of Manufacture, Silver-Containing Devices Made Therefrom".

U.S. Appl. No. 10/904,257 by Kodas et al.; filed Nov. 1, 2004; entitled Aerosol Method and Apparatus, Coated Particulate Products, and Electronic Devices Made Therefrom.

U.S. Appl. No. 09/991,270 by Kodas et al.; filed Nov. 9, 2001; entitled "Nickel Powders, Methods for Producing Powders and Devices Fabricated From Same".

U.S. Appl. No. 10/653,722 by Hampden-Smith et al.; filed Sep. 2, 2003; entitled "Aerosol Method and Apparatus, Particulate Products, And Electronic Devices Made Therefrom".

Ahmadi et al., "Shape-Controlled Synthesis of Colloidal Platinum Nanoparticles", Science, vol. 272, pp. 1924-1925, Jun. 28, 1996.

Champion et al., "Preparation and Characterization of Nanocrystalline Copper Powders", Scripta Materialia, vol. 35, No. 4, pp. 517-522 (1996).

Che, Shenglei et al., "Evolution of Particle Structure During the Formation of Single-Crystal Spherical Palladium Particles by Spray Pyrolysis" J. Ceram. Soc. Japan, vol. 105, No. 4 (1997), pp. 299-303.

Che, Shenglei et al. "Preparation and Formation Mechanism of Silica-Encapsulated Palladium Particles by Spray Pyrolysis," J. Ceram. Soc. Japan, vol. 105, No. 3 (1997), pp. 269-271 [Japanese text with English Abstract].

Che, Shenglei et al., "Effects of Starting Materials on the Preparation of Spherical Pd Powders by Ultrasonic Spray Pyrolysis," J. Ceram. Soc. Japan, Int. Ed. vol. 104, (1996), pp. 39-44.

Che, Shenglei et al., "Effect of Calcium Modification on the Microstructure and Oxidation Property of Submicron Spherical Palladium Powders," J. Mater. Res., vol. 12, No. 2 (Feb. 1997), pp. 392-397.

Ducamp-Sanguesa, C. et al., "Synthesis and Characterization of Fine and Monodisperse Silver Particles of Uniform Shape," J. Solid State Chem., 100 (1992), pp. 272-280.

Fievet, F. et al., Homogenous and Heterogeneous Nucleations in the Polyol Process For the Preparation of Micron and Submicron Size Metal Particles, Solid State Ionics 32/33, pp. 198-205 (1989).

Fievet et al., "Preparing Monodisperse Metal Powders in Micrometer and Submicrometer Sizes by the Polyol Process", MRS Bulletin, pp. 29-34, Dec. 1989.

Fievet, et al., "Controlled Nucleation and Growth of Micrometre-size Copper Particles Prepared by the Polyol Process", J. Mater. Chem., vol. 3, pp. 627-632 (1993).

Getty et al., "High Performance Thick Film Gold Conductors", International Journal for Hybrid Microelectronics, vol. 5, No. 2, pp. 487-495, Nov. 1982.

Gurav, Abhijit et al., "Aerosol Processing of Materials," Aerosol Sci. & Tech., vol. 19 (1993), pp. 411-452.

Hsu et al., "Preparation and Characterization of Uniform Particles of Pure and Coated Metallic Copper", Powder Technology, vol. 63, pp. 265-275 (1990).

Jain, Sanjeev et al., "in Situ Formation of Coated and Composite Palladium Particles via Spray Pyrolysis," J. Electrochem. Soc., vol. 143, No. 11 (Nov. 1996), pp. 3762-3770.

Kang, Yun Chan and Seung Bin Park, "Morphology and Size of Fine Silver Particles Prepared by Using the Filter Expansion Aerosol Generator," J. Korean Institute of Chemical Engineers, vol. 34, No. 2 (Apr. 1996), pp. 183-187 [Korean Text, with English Abstract].

Majumdar et al., "Gold Particle Generation by Spray Pyrolysis", Adv. Mater., vol. 8, No. 12., pp. 1020-1022, 1996.

Nagashima et al., "Preparation of Fine, Spherical Copper Particles By Spray-Pyrolysis Technique", Nippon Kagaku Kaishi, vol. 1, pp. 17-24 (1990) (translation missing every other page).

Nagashima et al., "Preparation of Fine Ni Particles by the Spray-Pyrolysis Technique and Their Film Forming Properties in the Thick Film Method", Journal of Materials Research, vol. 5, No. 12, (1990) pp. 2828-2834.

Nagashima, K. et al., "Properties of Conductive Films Made From Fine Spherical Silver-Palladium Alloy Particles," J. Mater. Sci., 26 (1991), pp. 2477-2482.

Park, Seung Bin et al., "Preparation of Fine Silver Particles by Decomposing Droplets Produced From Filter Expansion Aerosol Generator," J. Aerosol Sci, vol. 26, Suppl. 1 (1995), pp. S605-S606.

Pluym, Tammyh C. et al., "Silver-Palladium Alloy Particle Production by Spray Pyrolysis," J. Mater. Res., vol. 10, No. 7 (Jul. 1995), pp. 1661-1673.

Pluym, T.C. et al., "Solid Silver Particle Production by Spray Pyrolysis," J. Aerosol Sci., vol. 24, No. 3 (1993), pp. 383-392.

Seshadri et al., "Preparation of Monodispersed, Submicron Gold Particles", Materials Research Bulletin, vol. 29, No. 7, pp. 795-799, 1994.

Silvert et al., "Synthesis of Monodisperse Submicronic Gold Particles by the Polyol Process", Solid State Ionics, vol. 82 (1995), pp. 53-60.

Stopic et al., "Preparation of Nickel Submicron Powder by Ultrasonic Spray Pyrolysis", The International Journal of Powder Metallurgy, vol. 32, No. 1, pp. 59-65, (1996).

Viau et al., "Preparation and Microwave Characterization of Spherical and Monodisperse Co-Ni Particles", Journal of Applied Physics, vol. 76, No. 10, pp. 6570-6572 (1994).

Van Rheenan et al., "Synthesis and Characterization of Small Platinum Particles Formed by the Chemical Reduction of Chloroplatinic Acid", J. of Solid State Chemistry, vol. 67, Issue 1, Mar. 1987 (Abstract only).

Wang, Sea Fue et al., "Silver-Palladium Thick-Film Conductors," J. Am. Ceram. Soc., vol. 77, No. 12 (1994), pp. 3051-3072.

"Researchers Succeed in Controllings Size and Shape of Colloidal Platinum Nanoparticles", Georgia Tech Research News, Jun. 28, 1996.

* cited by examiner

AEROSOL GENERATOR 106 → 108 → FURNACE 110 → 112 → PARTICLE COLLECTOR 114 → 116

COATED NICKEL-CONTAINING POWDERS, METHODS AND APPARATUS FOR PRODUCING SUCH POWDERS AND DEVICES FABRICATED FROM SAME

CROSS-REFERENCE TO RELATED APPLICATIONS

This application is a continuation application of U.S. patent application Ser. No. 09/991,270 filed Nov. 9, 2001, now U.S. Pat. No. 7,097,686 which is a divisional application of U.S. patent application Ser. No. 09/028,678 filed Feb. 24, 1998, now U.S. Pat. No. 6,316,100, issued Nov. 13, 2001 which claims priority to U.S. Provisional Application No. 60/038,258 filed Feb. 24, 1997 and to U.S. Provisional Application No. 60/039,450 filed Feb. 24, 1997. The foregoing patent applications are incorporated herein by reference in their entirety.

STATEMENT REGARDING FEDERALLY-SPONSORED RESEARCH/DEVELOPMENT

This invention was made with Government support under contracts N00014-95-C-0278 and N00014-96-C-0395 awarded by the Office of Naval Research. The Government has certain rights in the invention.

BACKGROUND OF THE INVENTION

1. Field of the Invention

The present invention relates to nickel powders and to methods for producing such powders, as well as intermediate products and devices fabricated using the powders. In particular, the present invention is directed to powder batches of nickel particles with a small average particle size, well controlled particle size distribution, spherical morphology and high crystallinity.

2. Description of Related Art

Many product applications require metal-containing powders with one or more of the following properties: high purity; high crystallinity; small average particle size; narrow particle size distribution; spherical particle morphology; controlled surface chemistry; reduced agglomeration of particles; and high density (low porosity). Examples of metal powders requiring such characteristics include, but are not limited to, those useful in microelectronic applications, such as for multilayer ceramic capacitors (MLCC's), multichip modules and other devices, including flat panel displays.

Electronic devices such as capacitors, and in particular MLCC's, have traditionally incorporated electrodes fabricated from noble metals such as palladium. MLCC's are fabricated by stacking alternate layers of a ceramic dielectric and a conductive metal and then sintering (heating) the stack to densify the layers and obtain a monolithic device. Most ceramic dielectric compounds are oxides that must be sintered at an elevated temperature in an oxygen-containing atmosphere to avoid reduction of the ceramic and the loss of the dielectric properties. Noble metals such as palladium advantageously resist oxidation under these conditions. However, noble metals are relatively expensive and significantly increase the fabrication cost of such devices. Therefore, it would be advantageous to utilize less costly base metals for such applications. Base metals such as nickel are generally at least an order of magnitude less costly than noble metals. But most base metals have a tendency to oxidize when held in an oxygen-containing atmosphere at elevated sintering temperatures, thereby ruining the electrical properties of the metal and creating other problems in the device, such as delamination of the stacked layers.

There have been attempts in the art to address some of the problems associated with using base metals in such microelectronic devices. U.S. Pat. No. 3,902,102 by Burn discloses a ceramic capacitor utilizing electrodes fabricated from nickel or copper powder having a particle size of less than about 325 mesh (44 µm). The metal is protected from oxidation during sintering of the capacitor by the addition of a barium borate glass to the thick film paste composition used to apply the electrode.

U.S. Pat. Nos. 3,966,463, 4,010,025 and 4,036,634, all by Fraioli et al., disclose an oxidation resistant powder which includes gold or nickel metal and small amounts of a co-nucleated oxide, such as titania or zirconia, formed by co-nucleation and precipitation from an ammoniacal solution with sodium bisulfite. The powder has good tap density, which improves the rheological properties of pastes made from the powder. It is disclosed that nickel oxidizes to nickel oxide in air between 350° C. and 700° C. and that a high surface area nickel powder can oxidize at room temperature. The nickel/zirconia powder with about 2 weight percent zirconia is able to withstand one hour in air at 450° C. with no measurable weight gain due to oxidation.

U.S. Pat. No. 4,115,493 by Sakabe et al. discloses a ceramic dielectric for an MLCC that can be sintered in a reducing atmosphere, and therefore permits nickel electrodes to be utilized. It is disclosed that a paste, including nickel powder having an average particle size of about 1 µm, can be screened onto the ceramic dielectric to form the MLCC structure.

U.S. Pat. No. 4,122,232 by Kuo discloses a thick film paste for forming a conductor, including 50 to 80 weight percent nickel powder and 5 to 20 weight percent boron powder. It is disclosed that the boron powder advantageously reduces oxidation of the nickel powder. In one example, nickel powder having a particle size between about 2.9 µm and 3.6 µm is utilized in the thick film paste.

U.S. Pat. No. 4,223,369 by Burn discloses a zirconate dielectric composition including boron that can be sintered in a reducing atmosphere. The use of a reducing atmosphere during sintering allows nickel electrodes to be used. U.S. Pat. No. 4,700,264 by Kishi et al. also discloses a dielectric that can be sintered in a reducing atmosphere. Nickel electrodes are utilized in the ceramic capacitor and it is disclosed that the nickel powder has an average particle size of about 1.5 µm.

U.S. Pat. No. 4,954,926 by Pepin discloses a thick film paste composition including organometallics that advantageously reduce delamination defects in the MLCC. The metal powder can include nickel powder.

It can be seen from the foregoing that there are significant advantages to using base metals, such as nickel, for the formation of electrodes in microelectronic applications or other devices such as flat panel displays. Nickel powders are less expensive than noble metals and provide good conductivity. Nickel metal also resists leaching (degradation) during soldering.

Other uses for fine nickel metal powders include their use to form dispersion strengthened alloys or for porous barriers for the gaseous phase separation of uranium isotopes. Such applications are disclosed in U.S. Pat. No. 3,748,118 by Montino et al. U.S. Pat. No. 3,850,612 by Montino et al. also discloses that spherical nickel metal powders can be advantageously utilized for slip casting of metal components because such powders yield green castings of greater uniformity and density. The powders are also useful as catalysts where the high surface area accelerates chemical reactions. The powders can also be used to fabricate porous electrodes and filters or membranes having controlled permeability. U.S. Pat. No. 4,578,114 by Rangaswamy et al. also discloses the use of composite nickel powders as a thermal spray powder for the deposition of a thermal spray coating onto a substrate. A similar application is also disclosed in U.S. Pat. No. 5,063,021 by Anand et al. Each of these U.S. Patents is incorporated herein by reference in its entirety.

Different methods have been proposed to produce nickel metal powders. U.S. Pat. No. 3,711,274 by Montino et al. discloses a process for preparing spherical, sub-micron nickel powder by heating a suspension of bis-acrylonitrile-nickel in methanol to produce nickel particles. It is disclosed that the nickel retains up to 15 percent organic impurities and can be purified by hydrogenating the powder at elevated temperatures. The average particle size is about 57 nanometers.

U.S. Pat. No. 3,748,118 by Montino et al. discloses a process for producing spherical nickel powder by heating a hydroalcoholic suspension of a nickel compound under hydrogen pressure. The average particle size of the nickel is from about 0.07 µm to about 2 µm. U.S. Pat. No. 3,850,612 by Montino et al. discloses a similar process for producing nickel powder having an average particle size of from about 0.03 µm to about 0.7 µm.

The article entitled "Preparing Monodispersed Metal Powders in Micrometer and Submicrometer Sizes by the Polyol Process" by Fievet et al. (MRS Bulletin, December, 1989) discloses the preparation of nickel metal powders by the reduction of nickel hydroxide in ethylene glycol. It is disclosed that the nickel powders have a small size and a narrow size distribution. As with most liquid preparation routes, the particles have low crystallinity (i.e. a small average crystallite size). Viau et al., in an article entitled "Preparation and Microwave Characterization of Spherical and Monodisperse $Co_{20}Ni_{80}$ Particles" (J. Appl. Phys., 76, (10), 1994), disclose cobalt-nickel alloy particles produced using a similar process.

Spray pyrolysis is not in common use for the production of nickel powders containing small particles, such as those having an average particle size of not greater than about 5 µm. This is believed to be due to the high processing costs and low production rates typically associated with spray pyrolysis. Further, spray pyrolysis methods often produce hollow particles that are not sufficiently densified for most applications. Generally, spray pyrolysis methods include the generation of liquid droplets wherein the liquid is a solution of a particle precursor. The droplets are then heated to evaporate the liquid, react the precursors, and form solid particles.

The article entitled "Preparation of Fine Ni Particles by the Spray-Pyrolysis Technique and Their Film Forming Properties in the Thick Film Method," by Nagashima et al. (*Journal of Materials Research*, Vol. 5, No. 12, December 1990) discloses the formation of nickel metal particles by spray pyrolysis and the use of those particles for thick film pastes. Nickel particles are formed from nickel nitrate ($Ni(NO_3)_2$) and nickel chloride ($NiCl_2$) solutions. The solutions were atomized by an ultrasonic atomizer and an $N_2/H_2$ carrier gas was utilized to carry the droplets to a heated reaction zone. The reaction temperature was varied from 500° C. to 1600° C.

The article entitled "Preparation of Nickel Submicron Powder by Ultrasonic Spray Pyrolysis" by Stopic et al. (*The International Journal of Powder Metallurgy*, Vol. 32, No. 1, 1996) discloses the formation of nickel powder by spray pyrolysis. Powders were formed at temperatures of 900° C. to 1000° C. under a reducing atmosphere. The authors state that the powders had a spherical morphology and were substantially crystalline.

There remains a need for nickel powders having a small particle size, narrow size distribution, high crystallinity (large crystals) and spherical morphology. It would be particularly advantageous if such powders could be produced in large quantities on a substantially continuous basis.

SUMMARY OF THE INVENTION

According to one embodiment of the present invention, a powder batch comprising nickel particles is provided. The particles are substantially spherical, have a weight average particle size of not greater than about 5 µm and a narrow particle size distribution and high crystallinity.

According to another embodiment of the present invention, a powder batch of metal alloy particles comprising nickel metal is provided wherein the particles have a small particle size and a narrow particle size distribution. According to yet another embodiment of the present invention, a powder batch of coated nickel metal particles is provided. According to yet another embodiment of the present invention, a powder batch of metal composite particles which include nickel metal and a non-metallic phase is provided.

The present invention also provides thick film paste compositions including nickel particles, including coated nickel metal particles and composite nickel metal particles. The present invention also provides green bodies suitable for sintering to form multilayer ceramic capacitors wherein the green bodies include a thick film paste composition comprising nickel metal particles.

The present invention is also directed to microelectronic devices, including multilayer ceramic capacitors, which incorporate the nickel metal particles of the present invention.

The present invention is further directed to a method for the production of nickel particles which generally includes generating an aerosol of droplets including a nickel metal precursor and moving the droplets through a heating zone to form nickel particles. The method of the present invention is applicable to the formation of metal alloy particles, composite particles and coated particles.

The present invention is also directed to devices fabricated from the nickel particles, including flat panel display devices.

BRIEF DESCRIPTION OF THE DRAWINGS

FIG. 1 is a process block diagram showing one embodiment of the process of the present invention.

FIG. 25 is a process block diagram of one embodiment in the present invention including an aerosol concentrator.

FIG. 49 is a block diagram of one embodiment of the process of the present invention including the addition of a dry gas between the aerosol generator and the furnace.

DETAILED DESCRIPTION OF THE INVENTION

Figure 2:
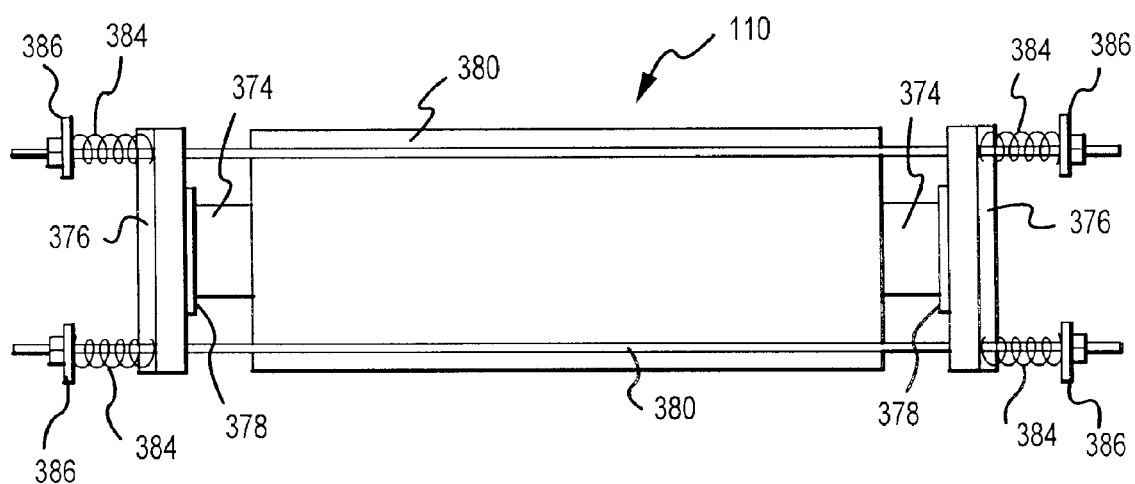
FIG. 2 is a side view of a furnace and showing one embodiment of the present invention for sealing the end of a furnace tube.

The present invention is generally directed to nickel powders and methods for producing the powders. The invention is also directed to novel intermediate products and devices fabricated using the nickel powders. As used herein, nickel powders or nickel particles are those that include nickel or a nickel-based compound such as pure nickel metal, nickel metal alloys, intermetallic compounds and other nickel compounds, composite particles, coated particles, and the like.

In one aspect, the present invention provides a method for preparing a particulate product. A feed of liquid-containing, flowable medium, including at least one precursor for the desired particulate product, is converted to aerosol form, with droplets of the medium being dispersed in and suspended by a carrier gas. Liquid from the droplets in the aerosol is then removed to permit formation in a dispersed state of the desired particles. Typically, the feed precursor is pyrolyzed in a furnace to make the particles. In one embodiment, the particles are subjected, while still in a dispersed state, to compositional or structural modification, if desired. Compositional modification may include, for example, coating the particles. Structural modification may include, for example, crystallization, recrystallization or morphological alteration of the particles. The term powder is often used herein to refer to the particulate product of the present invention. The use of the term powder does not indicate, however, that the particulate product must be dry or in any particular environment. Although the particulate product is typically manufactured in a dry state, the particulate product may, after manufacture, be placed in a wet environment, such as in a paste or slurry.

The process of the present invention is particularly well suited for the production of particulate products of finely divided particles having a small weight average size. In addition to making particles within a desired range of weight average particle size, with the present invention the particles may be produced with a desirably narrow size distribution, thereby providing size uniformity that is desired for many applications.

In addition to control over particle size and size distribution, the method of the present invention provides significant flexibility for producing particles of varying composition, crystallinity and morphology. For example, the present invention may be used to produce homogeneous particles involving only a single phase or multi-phase particles including multiple phases. In the case of multi-phase particles, the phases may be present in a variety of morphologies. For example, one phase may be uniformly dispersed throughout a matrix of another phase. Alternatively, one phase may form an interior core while another phase forms a coating that surrounds the core. Other morphologies are also possible, as discussed more fully below.

Figure 1:
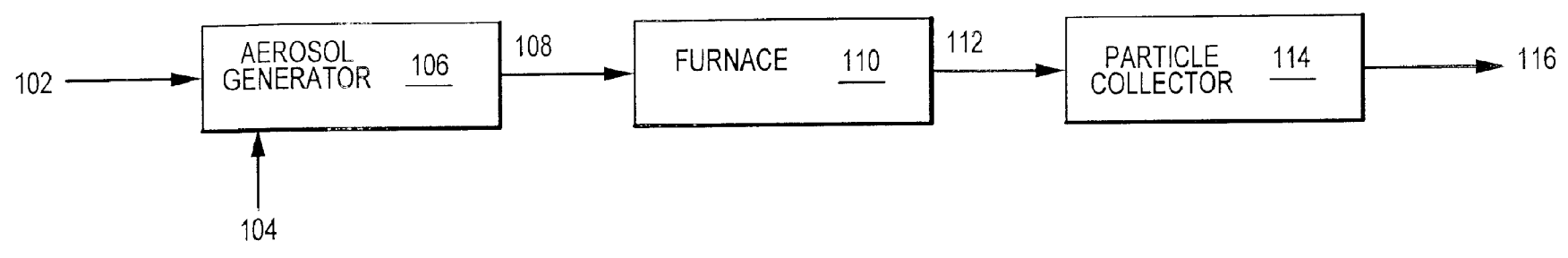

Referring now to FIG. 1, one embodiment of the process of the present invention is described. A liquid feed 102, including at least one precursor for the desired particles, and a carrier gas 104 are fed to an aerosol generator 106 where an aerosol 108 is produced. The aerosol 108 is then fed to a furnace 110 where liquid in the aerosol 108 is removed to produce particles 112 that are dispersed in and suspended by gas exiting the furnace 110. The particles 112 are then collected in a particle collector 114 to produce a particulate product 116.

As used herein, the liquid feed 102 is a feed that includes one or more flowable liquids as the major constituent(s), such that the feed is a flowable medium. The liquid feed 102 need not comprise only liquid constituents. The liquid feed 102 may comprise only constituents in one or more liquid phase, or it may also include particulate material suspended in a liquid phase. The liquid feed 102 must, however, be capable of being atomized to form droplets of sufficiently small size for preparation of the aerosol 108. Therefore, if the liquid feed 102 includes suspended particles, those particles should be relatively small in relation to the size of droplets in the aerosol 108. Such suspended particles should typically be smaller than about 1 μm in size, preferably smaller than about 0.5 μm in size, and more preferably smaller than about 0.3 μm in size and most preferably smaller than about 0.1 μm in size. Most preferably, the suspended particles should be able to form a colloid. The suspended particles could be finely divided particles, or could be agglomerate masses comprised of agglomerated smaller primary particles. For example, 0.5 μm particles could be agglomerates of nanometer-sized primary particles. When the liquid feed 102 includes suspended particles, the particles typically comprise no greater than about 25 to 50 weight percent of the liquid feed.

As noted, the liquid feed 102 includes at least one precursor for preparation of the particles 112. The precursor may be a substance in either a liquid or solid phase of the liquid feed 102. Frequently, the precursor will be a material, such as a salt, dissolved in a liquid solvent of the liquid feed 102. The precursor may undergo one or more chemical reactions in the furnace 110 to assist in production of the particles 112. Alternatively, the precursor material may contribute to formation of the particles 112 without undergoing chemical reaction. This could be the case, for example, when the liquid feed 102 includes, as a precursor material, suspended particles that are not chemically modified in the furnace 110. In any event, the particles 112 comprise at least one component originally contributed by the precursor.

The liquid feed 102 may include multiple precursor materials, which may be present together in a single phase or separately in multiple phases. For example, the liquid feed 102 may include multiple precursors in solution in a single liquid vehicle. Alternatively, one precursor material could be in a solid particulate phase and a second precursor material could be in a liquid phase. Also, one precursor material could be in one liquid phase and a second precursor material could be in a second liquid phase, such as could be the case when the liquid feed 102 comprises an emulsion. Different components contributed by different precursors may be present in the particles together in a single material phase, or the different components may be present in different material phases when the particles 112 are composites of multiple phases. Specific examples of preferred precursor materials are discussed more fully below.

The carrier gas 104 may comprise any gaseous medium in which droplets produced from the liquid feed 102 may be dispersed in aerosol form. Also, the carrier gas 104 may be inert, in that the carrier gas 104 does not participate in formation of the particles 112. Alternatively, the carrier gas may have one or more active component(s) that contribute to formation of the particles 112. In that regard, the carrier gas may include one or more reactive components that react in the furnace 110 to contribute to formation of the particles 112. Preferred carrier gas compositions are discussed more fully below.

The aerosol generator 106 atomizes the liquid feed 102 to form droplets in a manner to permit the carrier gas 104 to sweep the droplets away to form the aerosol 108. The droplets comprise liquid from the liquid feed 102. The droplets may, however, also include nonliquid material, such as one or more small particles held in the droplet by the liquid. For example, when the particles 112 are composite, or multi-phase, particles, one phase of the composite may be provided in the liquid feed 102 in the form of suspended precursor particles and a second phase of the composite may be produced in the furnace 110 from one or more precursors in the liquid phase of the liquid feed 102. Furthermore the precursor particles could be included in the liquid feed 102, and therefore also in droplets of the aerosol 108, for the purpose only of dispersing the particles for subsequent compositional or structural modification during or after processing in the furnace 110.

An important aspect of the present invention is generation of the aerosol 108 with droplets of a small average size, narrow size distribution. In this manner, the particles 112 may be produced at a desired small size with a narrow size distribution, which are advantageous for many applications.

The aerosol generator 106 is capable of producing the aerosol 108 such that it includes droplets having a weight average size in a range having a lower limit of about 1 $\mu$m and preferably about 2 $\mu$m; and an upper limit of about 10 $\mu$m; preferably about 7 $\mu$m, more preferably about 5 $\mu$m and most preferably about 4 $\mu$m. A weight average droplet size in a range of from about 2 $\mu$m to about 4 $\mu$m is more preferred for most applications, with a weight average droplet size of about 3 $\mu$m being particularly preferred for some applications. The aerosol generator is also capable of producing the aerosol 108 such that it includes droplets in a narrow size distribution. Preferably, the droplets in the aerosol are such that at least about 70 percent (more preferably at least about 80 weight percent and most preferably at least about 85 weight percent) of the droplets are smaller than about 10 $\mu$m and more preferably at least about 70 weight percent (more preferably at least about 80 weight percent and most preferably at least about 85 weight percent) are smaller than about 5 $\mu$m. Furthermore, preferably no greater than about 30 weight percent, more preferably no greater than about 25 weight percent and most preferably no greater than about 20 weight percent, of the droplets in the aerosol 108 are larger than about twice the weight average droplet size.

Another important aspect of the present invention is that the aerosol 108 may be generated without consuming excessive amounts of the carrier gas 104. The aerosol generator 106 is capable of producing the aerosol 108 such that it has a high loading, or high concentration, of the liquid feed 102 in droplet form. In that regard, the aerosol 108 preferably includes greater than about $1\times10^6$ droplets per cubic centimeter of the aerosol 108, more preferably greater than about $5\times10^6$ droplets per cubic centimeter, still more preferably greater than about $1\times10^7$ droplets per cubic centimeter, and most preferably greater than about $5\times10^7$ droplets per cubic centimeter. That the aerosol generator 106 can produce such a heavily loaded aerosol 108 is particularly surprising considering the high quality of the aerosol 108 with respect to small average droplet size and narrow droplet size distribution. Typically, droplet loading in the aerosol is such that the volumetric ratio of liquid feed 102 to carrier gas 104 in the aerosol 108 is larger than about 0.04 milliliters of liquid feed 102 per liter of carrier gas 104 in the aerosol 108, preferably larger than about 0.083 milliliters of liquid feed 102 per liter of carrier gas 104 in the aerosol 108, more preferably larger than about 0.167 milliliters of liquid feed 102 per liter of carrier gas 104, still more preferably larger than about 0.25 milliliters of liquid feed 102 per liter of carrier gas 104, and most preferably larger than about 0.333 milliliters of liquid feed 102 per liter of carrier gas 104.

This capability of the aerosol generator 106 to produce a heavily loaded aerosol 108 is even more surprising given the high droplet output rate of which the aerosol generator 106 is capable, as discussed more fully below. It will be appreciated that the concentration of liquid feed 102 in the aerosol 108 will depend upon the specific components and attributes of the liquid feed 102 and, particularly, the size of the droplets in the aerosol 108. For example, when the average droplet size is from about 2 $\mu$m to about 4 $\mu$m, the droplet loading is preferably larger than about 0.15 milliliters of aerosol feed 102 per liter of carrier gas 104, more preferably larger than about 0.2 milliliters of liquid feed 102 per liter of carrier gas 104, even more preferably larger than about 0.2 milliliters of liquid feed 102 per liter of carrier gas 104, and most preferably larger than about 0.3 milliliters of liquid feed 102 per liter of carrier gas 104. When reference is made herein to liters of carrier gas 104, it refers to the volume that the carrier gas 104 would occupy under conditions of standard temperature and pressure.

The furnace 110 may be any suitable device for heating the aerosol 108 to evaporate liquid from the droplets of the aerosol 108 and thereby permit formation of the particles 112. The maximum average stream temperature, or reaction temperature, refers to the maximum average temperature that an aerosol stream attains while flowing through the furnace. This is typically determined by a temperature probe inserted into the furnace. Preferred reaction temperatures according to the present invention are discussed more fully below.

Although longer residence times are possible, for many applications, residence time in the heating zone of the furnace 110 of shorter than about 4 seconds is typical, with shorter than about 2 seconds being preferred, shorter than about 1 second being more preferred, shorter than about 0.5 second being even more preferred, and shorter than about 0.2 second being most preferred. The residence time should be long enough, however, to assure that the particles 112 attain the desired maximum stream temperature for a given heat transfer rate. In that regard, with extremely short residence times, higher furnace temperatures could be used to increase the rate of heat transfer so long as the particles 112 attain a maximum temperature within the desired stream temperature range. That mode of operation, however, is not preferred. Also, it is preferred that, in most cases, the maximum stream temperature not be attained in the furnace 110 until substantially at the end of the heating zone in the furnace 110. For example, the heating zone will often include a plurality of heating sections that are each independently controllable. The maximum stream temperature should typically not be attained until the final heating section, and more preferably until substantially at the end of the last heating section. This is important to reduce the potential for thermophoretic losses of material. Also, it is noted that as used herein, residence time refers to the actual time for a material to pass through the relevant process equipment. In the case of the furnace, this includes the effect of increasing velocity with gas expansion due to heating.

Typically, the furnace 110 will be a tube-shaped furnace, so that the aerosol 108 moving into and through the furnace does not encounter sharp edges on which droplets could collect. Loss of droplets to collection at sharp surfaces results in a lower yield of particles 112. More important, however, the accumulation of liquid at sharp edges can result in re-release of undesirably large droplets back into the aerosol 108, which can cause contamination of the particulate product 116 with undesirably large particles. Also, over time, such liquid collection at sharp surfaces can cause fouling of process equipment, impairing process performance.

The furnace 110 may include a heating tube made of any suitable material. The tube material may be a ceramic material, for example, mullite, silica or alumina. Alternatively, the tube may be metallic. Advantages of using a metallic tube are low cost, ability to withstand steep temperature gradients and large thermal shocks, machinability and weldability, and ease of providing a seal between the tube and other process equipment. Disadvantages of using a metallic tube include limited operating temperature and increased reactivity in some reaction systems.

When a metallic tube is used in the furnace 110, it is preferably a high nickel content stainless steel alloy, such as a 330 stainless steel, or a nickel-based super alloy. As noted, one of the major advantages of using a metallic tube is that the tube is relatively easy to seal with other process equipment. In that regard, flange fittings may be welded directly to the tube for connecting with other process equipment. Metallic tubes are generally preferred for making particles that do not require a maximum tube wall temperature of higher than about 1100° C. during particle manufacture.

When higher temperatures are required, ceramic tubes are typically used. One major problem with ceramic tubes, however, is that the tubes can be difficult to seal with other process equipment, especially when the ends of the tubes are maintained at relatively high temperatures, as is often the case with the present invention.

Figure 3:
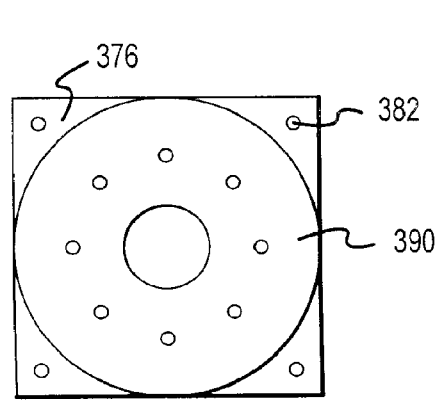
FIG. 3 is a view of the side of an end cap that faces away from the furnace shown in FIG. 2.
Figure 4:
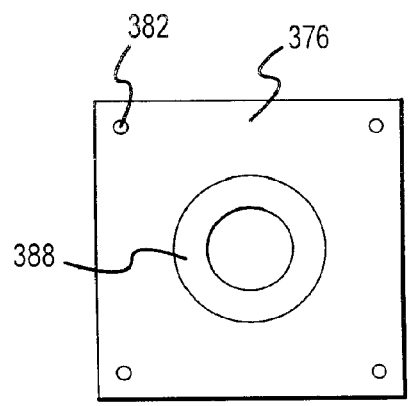
FIG. 4 is a view of the side of an end cap that faces toward the furnace shown in FIG. 2.

One configuration for sealing a ceramic tube is shown in FIGS. 2, 3 and 4. The furnace 110 includes a ceramic tube 374 having an end cap 376 fitted to each end of the tube 374, with a gasket 378 disposed between corresponding ends of the ceramic tube 374 and the end caps 376. The gasket may be of any suitable material for sealing at the temperature encountered at the ends of the tubes 374. Examples of gasket materials for sealing at temperatures below about 250° C. include silicone, TEFLON™ and VITON™. Examples of gasket materials for higher temperatures include graphite, ceramic paper, thin sheet metal, and combinations thereof.

Tension rods 380 extend over the length of the furnace 110 and through rod holes 382 through the end caps 376. The tension rods 380 are held in tension by the force of springs 384 bearing against bearing plates 386 and the end caps 376. The tube 374 is, therefore, in compression due to the force of the springs 384. The springs 384 may be compressed any desired amount to form a seal between the end caps 376 and the ceramic tube 374 through the gasket 378. As will be appreciated, by using the springs 384, the tube 374 is free to move to some degree as it expands upon heating and contracts upon cooling. To form the seal between the end caps 376 and the ceramic tube 374, one of the gaskets 378 is seated in a gasket seat 388 on the side of each end cap 376 facing the tube 374. A mating face 390 on the side of each of the end caps 376 faces away from the tube 374, for mating with a flange surface for connection with an adjacent piece of equipment.

Also, although the present invention is described with primary reference to a furnace reactor, which is preferred, it should be recognized that, except as noted, any other thermal reactor, including a flame reactor or a plasma reactor, could be used instead. A furnace reactor is, however, preferred, because of the generally even heating characteristic of a furnace for attaining a uniform stream temperature.

The particle collector 114, may be any suitable apparatus for collecting particles 112 to produce the particulate product 116. One preferred embodiment of the particle collector 114 uses one or more filter to separate the particles 112 from gas. Such a filter may be of any type, including a bag filter. Another preferred embodiment of the particle collector uses one or more cyclone to separate the particles 112. Other apparatus that may be used in the particle collector 114 includes an electrostatic precipitator. Also, collection should normally occur at a temperature above the condensation temperature of the gas stream in which the particles 112 are suspended. Also, collection should normally be at a temperature that is low enough to prevent significant agglomeration of the particles 112.

Figure 5:
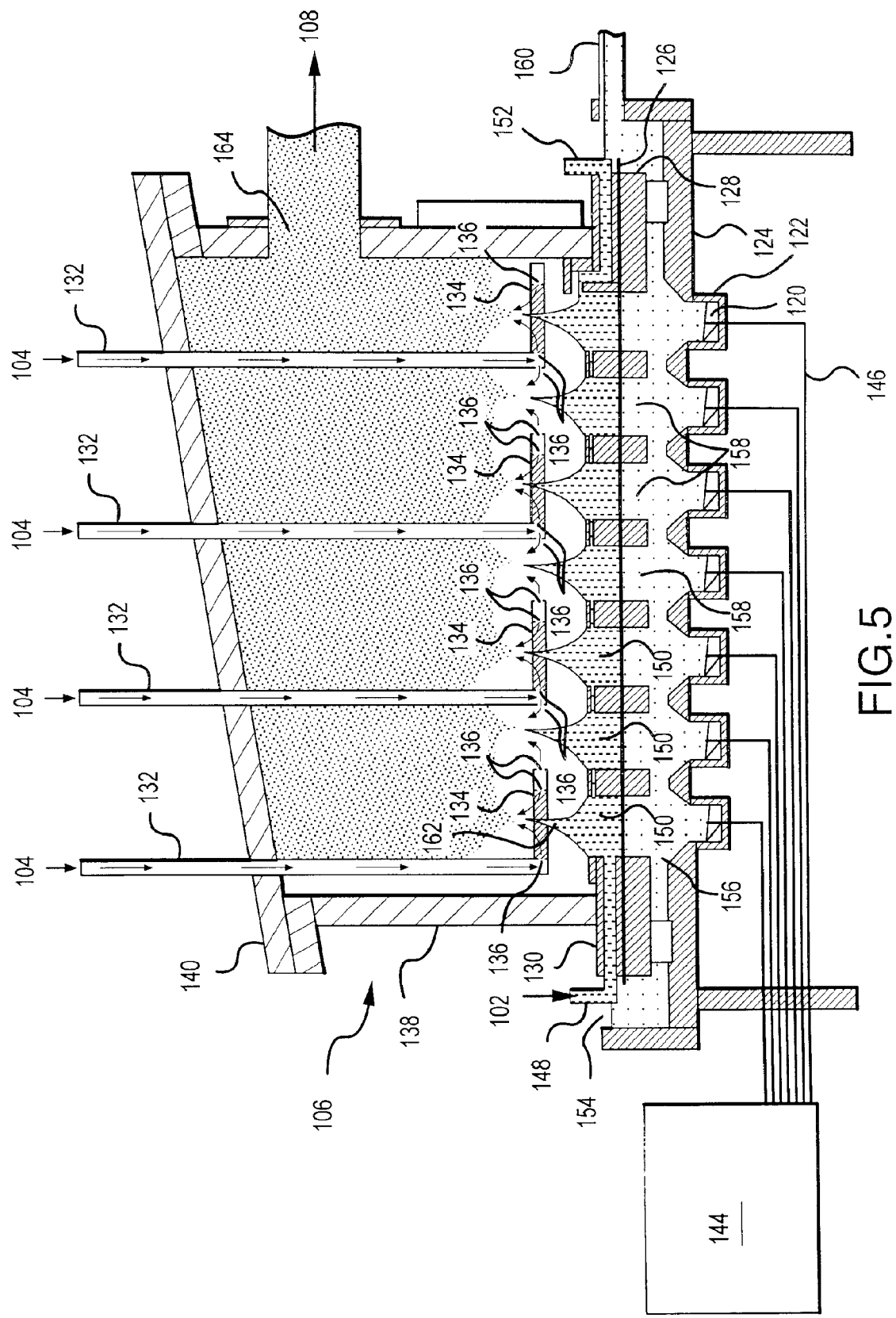
FIG. 5 is a side view in cross section of one embodiment of aerosol generator of the present invention.
Figure 6:
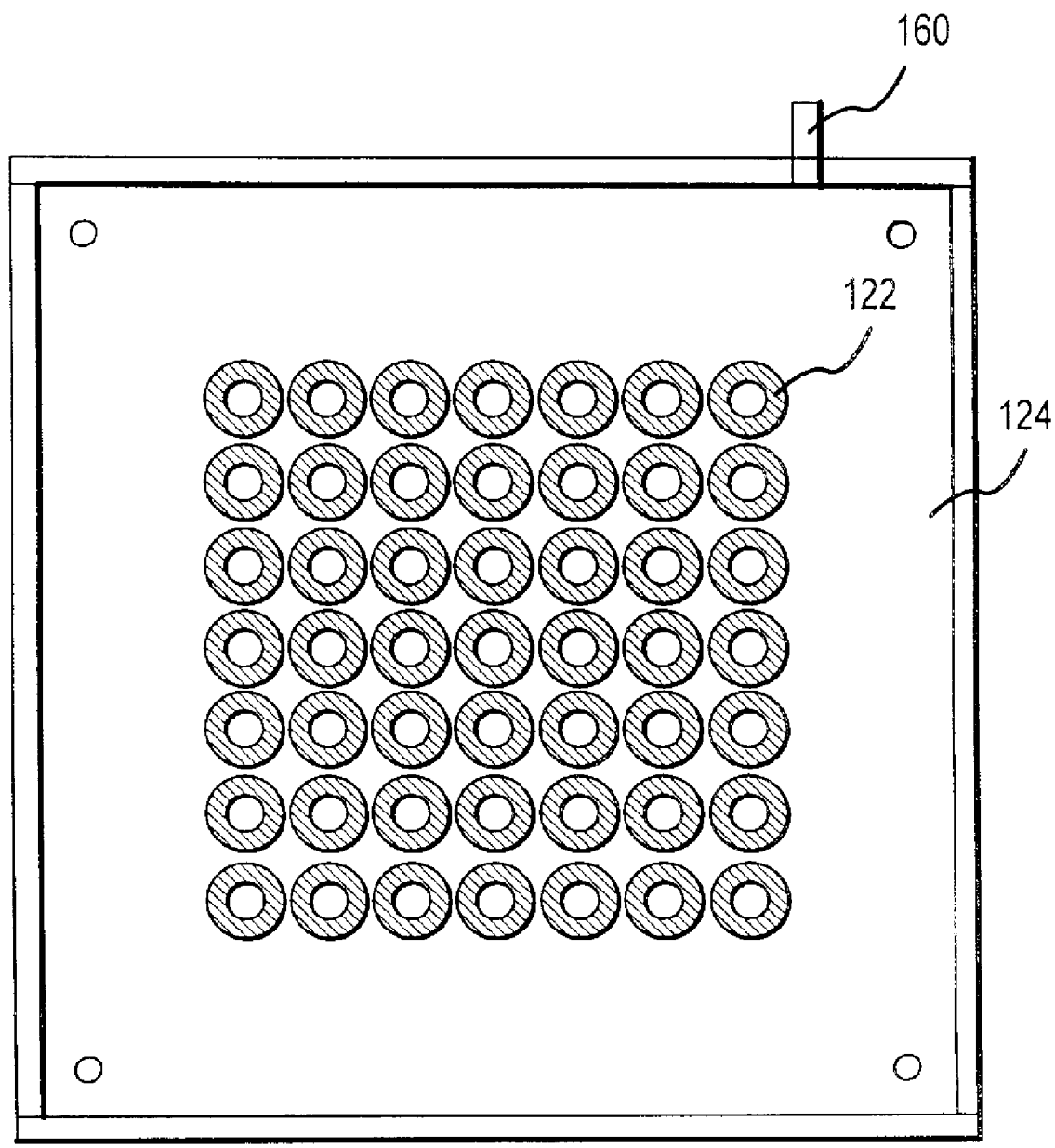
FIG. 6 is a top view of a transducer mounting plate showing a 49 transducer array for use in an aerosol generator of the present invention.

Of significant importance to the operation of the process of the present invention is the aerosol generator 106, which must be capable of producing a high quality aerosol with high droplet loading, as previously noted. With reference to FIG. 5, one embodiment of an aerosol generator 106 of the present invention is described. The aerosol generator 106 includes a plurality of ultrasonic transducer discs 120 that are each mounted in a transducer housing 122. The transducer housings 122 are mounted to a transducer mounting plate 124, creating an array of the ultrasonic transducer discs 120. Any convenient spacing may be used for the ultrasonic transducer discs 120. Center-to-center spacing of the ultrasonic transducer discs 120 of about 4 centimeters is often adequate. The aerosol generator 106, as shown in FIG. 5, includes forty-nine transducers in a 7×7 array. The array configuration is as shown in FIG. 6, which depicts the locations of the transducer housings 122 mounted to the transducer mounting plate 124.

With continued reference to FIG. 5, a separator 126, in spaced relation to the transducer discs 120, is retained between a bottom retaining plate 128 and a top retaining plate 130. Gas delivery tubes 132 are connected to gas distribution manifolds 134, which have gas delivery ports 136. The gas distribution manifolds 134 are housed within a generator body 138 that is covered by generator lid 140. A transducer driver 144, having circuitry for driving the transducer discs 120, is electronically connected with the transducer discs 120 via electrical cables 146.

During operation of the aerosol generator 106, as shown in FIG. 5, the transducer discs 120 are activated by the transducer driver 144 via the electrical cables 146. The transducers preferably vibrate at a frequency of from about 1 MHz to about 5 MHz, more preferably from about 1.5

MHz to about 3 MHz. Frequently used frequencies are at about 1.6 MHz and about 2.4 MHz. Furthermore, all of the transducer discs 110 should be operating at substantially the same frequency when an aerosol with a narrow droplet size distribution is desired. This is important because commercially available transducers can vary significantly in thickness, sometimes by as much as 10%. It is preferred, however, that the transducer discs 120 operate at frequencies within a range of 5% above and below the median transducer frequency, more preferably within a range of 2.5%, and most preferably within a range of 1%. This can be accomplished by careful selection of the transducer discs 120 so that they all preferably have thicknesses within 5% of the median transducer thickness, more preferably within 2.5%, and most preferably within 1%.

Liquid feed 102 enters through a feed inlet 148 and flows through flow channels 150 to exit through feed outlet 152. An ultrasonically transmissive fluid, typically water, enters through a water inlet 154 to fill a water bath volume 156 and flow through flow channels 158 to exit through a water outlet 160. A proper flow rate of the ultrasonically transmissive fluid is necessary to cool the transducer discs 120 and to prevent overheating of the ultrasonically transmissive fluid. Ultrasonic signals from the transducer discs 120 are transmitted, via the ultrasonically transmissive fluid, across the water bath volume 156, and ultimately across the separator 126, to the liquid feed 102 in flow channels 150.

The ultrasonic signals from the ultrasonic transducer discs 120 cause atomization cones 162 to develop in the liquid feed 102 at locations corresponding with the transducer discs 120. Carrier gas 104 is introduced into the gas delivery tubes 132 and delivered to the vicinity of the atomization cones 162 via gas delivery ports 136. Jets of carrier gas exit the gas delivery ports 136 in a direction so as to impinge on the atomization cones 162, thereby sweeping away atomized droplets of the liquid feed 102 that are being generated from the atomization cones 162 and creating the aerosol 108, which exits the aerosol generator 106 through an aerosol exit opening 164.

Efficient use of the carrier gas 104 is an important aspect of the aerosol generator 106. The embodiment of the aerosol generator 106 shown in FIG. 5 includes two gas exit ports per atomization cone 162, with the gas ports being positioned above the liquid medium 102 over troughs that develop between the atomization cones 162, such that the exiting carrier gas 104 is horizontally directed at the surface of the atomization cones 162, thereby efficiently distributing the carrier gas 104 to critical portions of the liquid feed 102 for effective and efficient sweeping away of droplets as they form about the ultrasonically energized atomization cones 162. Furthermore, it is preferred that at least a portion of the opening of each of the gas delivery ports 136, through which the carrier gas exits the gas delivery tubes, should be located below the top of the atomization cones 162 at which the carrier gas 104 is directed. This relative placement of the gas delivery ports 136 is very important to efficient use of carrier gas 104. Orientation of the gas delivery ports 136 is also important. Preferably, the gas delivery ports 136 are positioned to horizontally direct jets of the carrier gas 104 at the atomization cones 162. The aerosol generator 106 permits generation of the aerosol 108 with heavy loading with droplets of the carrier liquid 102, unlike aerosol generator designs that do not efficiently focus gas delivery to the locations of droplet formation.

Another important feature of the aerosol generator 106, as shown in FIG. 5, is the use of the separator 126, which protects the transducer discs 120 from direct contact with the liquid feed 102, which is often highly corrosive. The height of the separator 126 above the top of the transducer discs 120 should normally be kept as small as possible, and is often in the range of from about 1 centimeter to about 2 centimeters. The top of the liquid feed 102 in the flow channels above the tops of the ultrasonic transducer discs 120 is typically in a range of from about 2 centimeters to about 5 centimeters, whether or not the aerosol generator includes the separator 126, with a distance of about 3 to 4 centimeters being preferred. Although the aerosol generator 106 could be made without the separator 126, in which case the liquid feed 102 would be in direct contact with the transducer discs 120, the highly corrosive nature of the liquid feed 102 can often cause premature failure of the transducer discs 120. The use of the separator 126, in combination with use of the ultrasonically transmissive fluid in the water bath volume 156 to provide ultrasonic coupling, significantly extending the life of the ultrasonic transducers 120. One disadvantage of using the separator 126, however, is that the rate of droplet production from the atomization cones 162 is reduced, often by a factor of two or more, relative to designs in which the liquid feed 102 is in direct contact with the ultrasonic transducer discs 102. Even with the separator 126, however, the aerosol generator 106 used with the present invention is capable of producing a high quality aerosol with heavy droplet loading, as previously discussed. Suitable materials for the separator 126 include, for example, polyamides (such as Kapton™ membranes from DuPont) and other polymer materials, glass, and plexiglass. The main requirements for the separator 126 are that it be ultrasonically transmissive, corrosion resistant and impermeable.

One alternative to using the separator 126 is to bind a corrosion-resistant protective coating onto the surface of the ultrasonic transducer discs 120, thereby preventing the liquid feed 102 from contacting the surface of the ultrasonic transducer discs 120. When the ultrasonic transducer discs 120 have a protective coating, the aerosol generator 106 will typically be constructed without the water bath volume 156 and the liquid feed 102 will flow directly over the ultrasonic transducer discs 120. Examples of such protective coating materials include platinum, gold, TEFLON™, epoxies and various plastics. Such coating typically significantly extends transducer life. Also, when operating without the separator 126, the aerosol generator 106 will typically produce the aerosol 108 with a much higher droplet loading than when the separator 126 is used.

One surprising finding with operation of the aerosol generator 106 of the present invention is that the droplet loading in the aerosol may be affected by the temperature of the liquid feed 102. It has been found that when the liquid feed 102 includes an aqueous liquid at an elevated temperature, the droplet loading increases significantly. The temperature of the liquid feed 102 is preferably higher than about 30° C., more preferably higher than about 35° C. and most preferably higher than about 40° C. If the temperature becomes too high, however, it can have a detrimental effect on droplet loading in the aerosol 108. Therefore, the temperature of the liquid feed 102 from which the aerosol 108 is made should generally be lower than about 50° C., and preferably lower than about 45° C. The liquid feed 102 may be maintained at the desired temperature in any suitable fashion. For example, the portion of the aerosol generator 106 where the liquid feed 102 is converted to the aerosol 108 could be maintained at a constant elevated temperature. Alternatively, the liquid feed 102 could be delivered to the aerosol generator 106 from a constant temperature bath maintained separate from the aerosol generator 106. When the ultrasonic generator 106 includes the separator 126, the ultrasonically transmissive fluid adjacent the ultrasonic transducer disks 120 are preferably also at an elevated temperature in the ranges just discussed for the liquid feed 102.

The design for the aerosol generator 106 based on an array of ultrasonic transducers is versatile and is easily modified to accommodate different generator sizes for different specialty applications. The aerosol generator 106 may be designed to include a plurality of ultrasonic transducers in any convenient number. Even for smaller scale production, however, the aerosol generator 106 preferably has at least nine ultrasonic transducers, more preferably at least 16 ultrasonic transducers, and even more preferably at least 25 ultrasonic transducers. For larger scale production, however, the aerosol generator 106 includes at least 40 ultrasonic transducers, more preferably at least 100 ultrasonic transducers, and even more preferably at least 400 ultrasonic transducers. In some large volume applications, the aerosol generator may have at least 1000 ultrasonic transducers.

Figure 7:
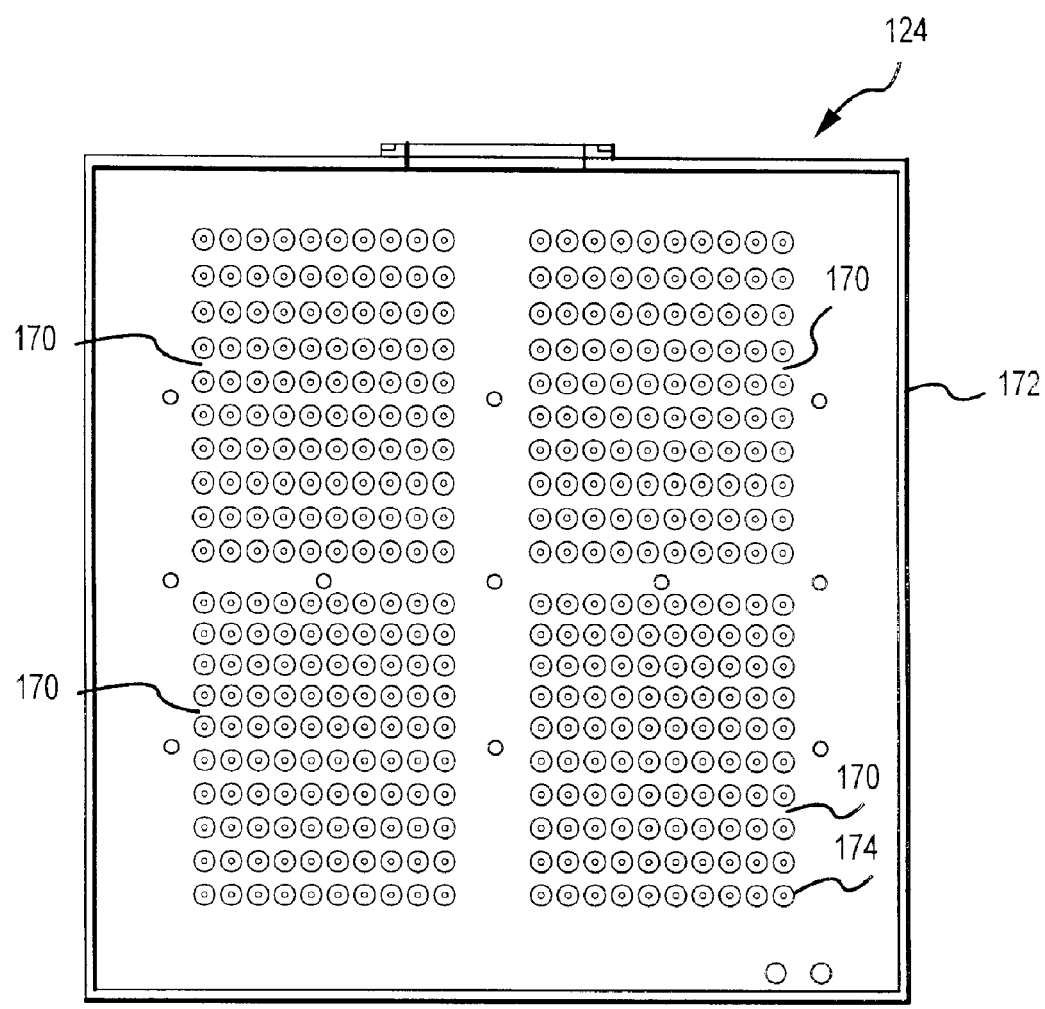
FIG. 7 is a top view of a transducer mounting plate for a 400 transducer array for use in an ultrasonic generator of the present invention.
Figure 8:
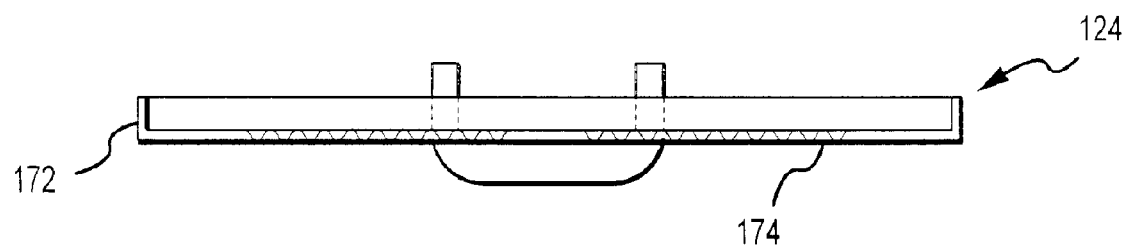
FIG. 8 is a side view of the transducer mounting plate shown in FIG. 7.

FIGS. 7-24 show component designs for an aerosol generator 106 including an array of 400 ultrasonic transducers. Referring first to FIGS. 7 and 8, the transducer mounting plate 124 is shown with a design to accommodate an array of 400 ultrasonic transducers, arranged in four subarrays of 100 ultrasonic transducers each. The transducer mounting plate 124 has integral vertical walls 172 for containing the ultrasonically transmissive fluid, typically water, in a water bath similar to the water bath volume 156 described previously with reference to FIG. 5.

Figure 9:
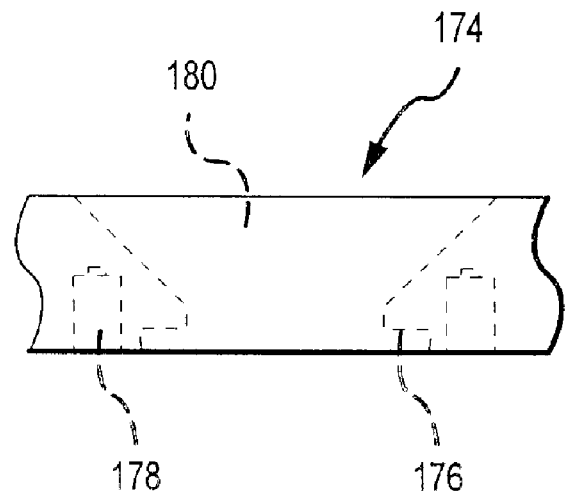
FIG. 9 is a partial side view showing the profile of a single transducer mounting receptacle of the transducer mounting plate shown in FIG. 7.

As shown in FIGS. 7 and 8, four hundred transducer mounting receptacles 174 are provided in the transducer mounting plate 124 for mounting ultrasonic transducers for the desired array. With reference to FIG. 9, the profile of an individual transducer mounting receptacle 174 is shown. A mounting seat 176 accepts an ultrasonic transducer for mounting, with a mounted ultrasonic transducer being held in place via screw holes 178. Opposite the mounting receptacle 176 is a flared opening 180 through which an ultrasonic signal may be transmitted for the purpose of generating the aerosol 108, as previously described with reference to FIG. 5.

Figure 10:
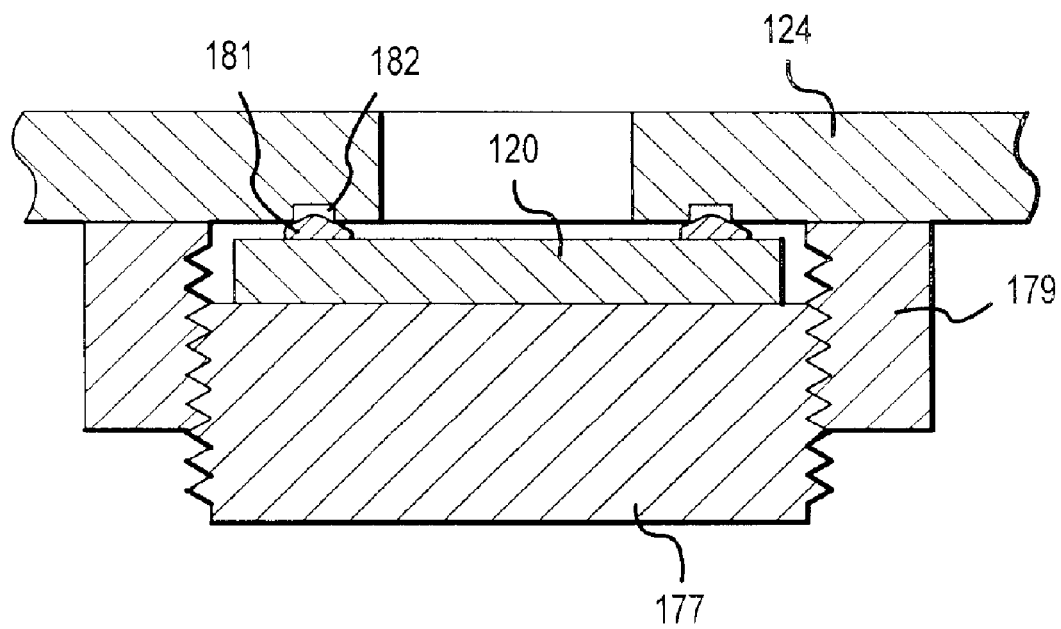
FIG. 10 is a partial side view in cross-section showing an alternative embodiment for mounting an ultrasonic transducer.

A preferred transducer mounting configuration, however, is shown in FIG. 10 for another configuration for the transducer mounting plate 124. As seen in FIG. 10, an ultrasonic transducer disc 120 is mounted to the transducer mounting plate 124 by use of a compression screw 177 threaded into a threaded receptacle 179. The compression screw 177 bears against the ultrasonic transducer disc 120, causing an o-ring 181, situated in an o-ring seat 182 on the transducer mounting plate, to be compressed to form a seal between the transducer mounting plate 124 and the ultrasonic transducer disc 120. This type of transducer mounting is particularly preferred when the ultrasonic transducer disc 120 includes a protective surface coating, as discussed previously, because the seal of the o-ring to the ultrasonic transducer disc 120 will be inside of the outer edge of the protective seal, thereby preventing liquid from penetrating under the protective surface coating from the edges of the ultrasonic transducer disc 120.

Figure 11:
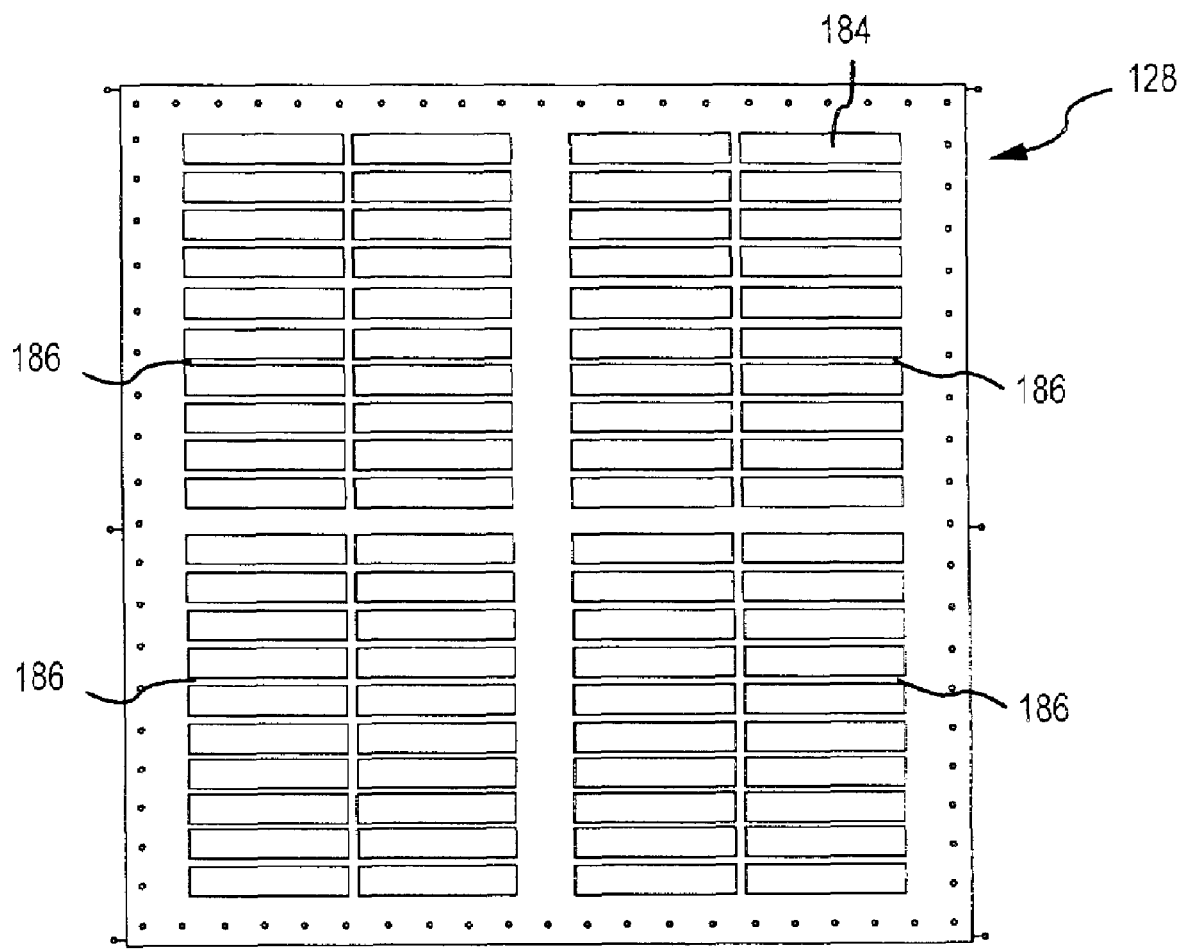
FIG. 11 is a top view of a bottom retaining plate for retaining a separator for use in an aerosol generator of the present invention.

Referring now to FIG. 11, the bottom retaining plate 128 for a 400 transducer array is shown having a design for mating with the transducer mounting plate 124 (shown in FIGS. 7-8). The bottom retaining plate 128 has eighty openings 184, arranged in four subgroups 186 of twenty openings 184 each. Each of the openings 184 corresponds with five of the transducer mounting receptacles 174 (shown in FIGS. 7 and 8) when the bottom retaining plate 128 is mated with the transducer mounting plate 124 to create a volume for a water bath between the transducer mounting plate 124 and the bottom retaining plate 128. The openings 184, therefore, provide a pathway for ultrasonic signals generated by ultrasonic transducers to be transmitted through the bottom retaining plate.

Figure 12:
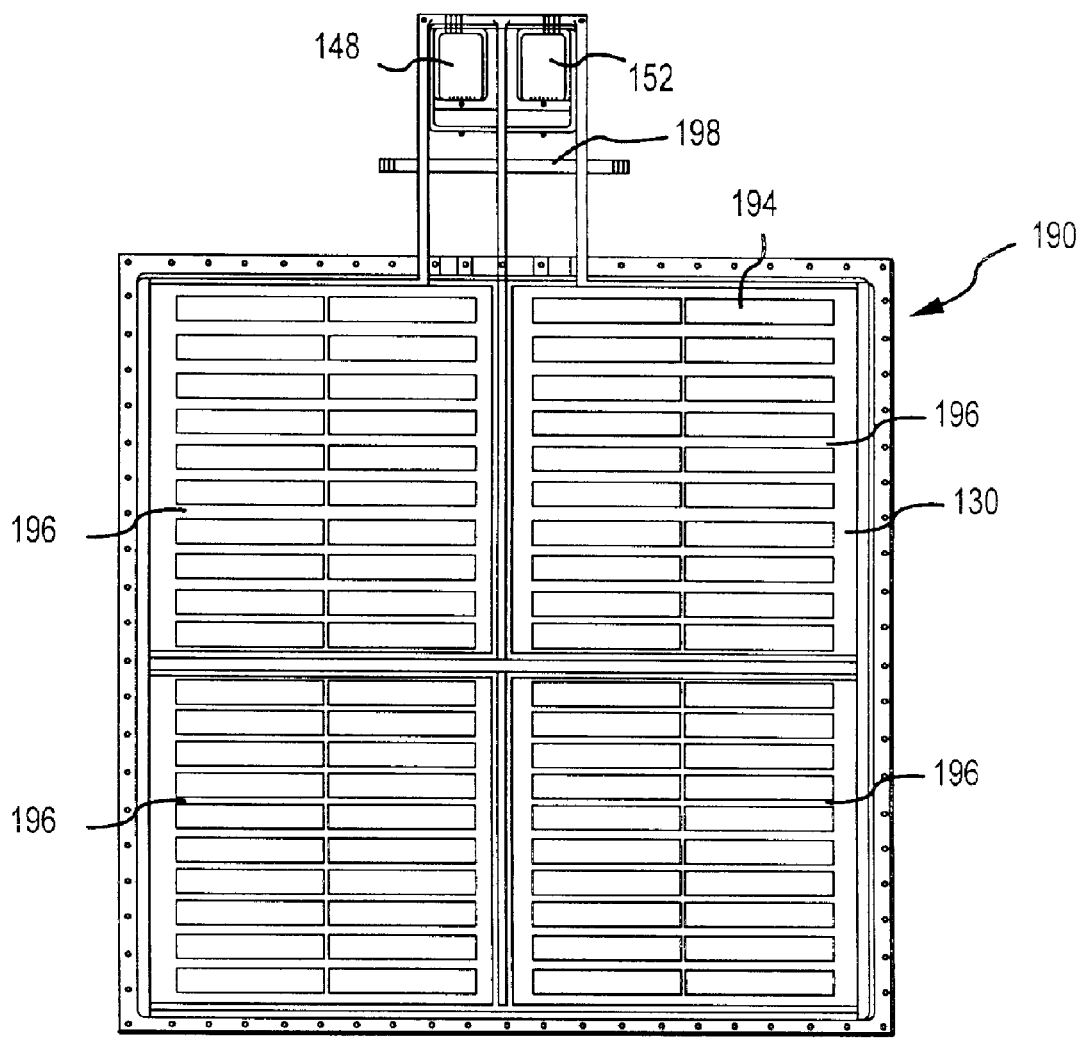
FIG. 12 is a top view of a liquid feed box having a bottom retaining plate to assist in retaining a separator for use in an aerosol generator of the present invention.
Figure 13:
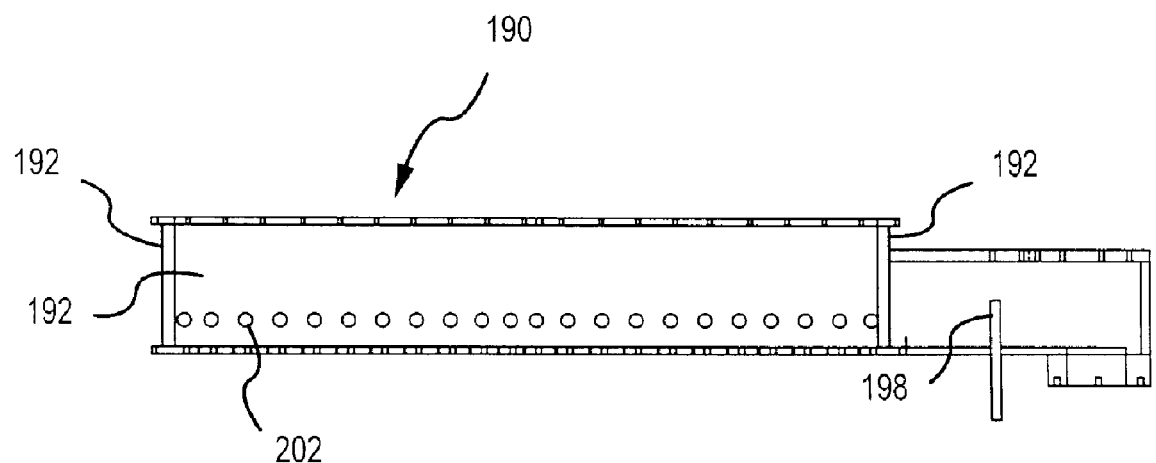
FIG. 13 is a side view of the liquid feed box shown in FIG. 8.

Referring now to FIGS. 12 and 13, a liquid feed box 190 for a 400 transducer array is shown having the top retaining plate 130 designed to fit over the bottom retaining plate 128 (shown in FIG. 11), with a separator 126 (not shown) being retained between the bottom retaining plate 128 and the top retaining plate 130 when the aerosol generator 106 is assembled. The liquid feed box 190 also includes vertically extending walls 192 for containing the liquid feed 102 when the aerosol generator is in operation. Also shown in FIGS. 12 and 13 is the feed inlet 148 and the feed outlet 152. An adjustable weir 198 determines the level of liquid feed 102 in the liquid feed box 190 during operation of the aerosol generator 106.

The top retaining plate 130 of the liquid feed box 190 has eighty openings 194 therethrough, which are arranged in four subgroups 196 of twenty openings 194 each. The openings 194 of the top retaining plate 130 correspond in size with the openings 184 of the bottom retaining plate 128 (shown in FIG. 11). When the aerosol generator 106 is assembled, the openings 194 through the top retaining plate 130 and the openings 184 through the bottom retaining plate 128 are aligned, with the separator 126 positioned therebetween, to permit transmission of ultrasonic signals when the aerosol generator 106 is in operation.

Figure 14:
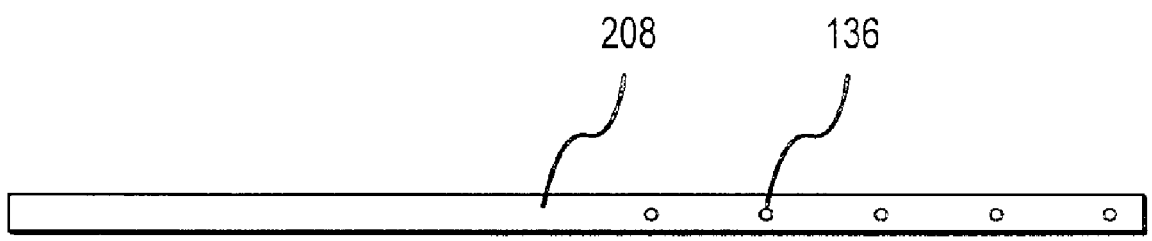
FIG. 14 is a side view of a gas tube for delivering gas within an aerosol generator of the present invention.

Referring now to FIGS. 12-14, a plurality of gas tube feed-through holes 202 extend through the vertically extending walls 192 to either side of the assembly including the feed inlet 148 and feed outlet 152 of the liquid feed box 190. The gas tube feed-through holes 202 are designed to permit insertion therethrough of gas tubes 208 of a design as shown in FIG. 14. When the aerosol generator 106 is assembled, a gas tube 208 is inserted through each of the gas tube feed-through holes 202 so that gas delivery ports 136 in the gas tube 208 will be properly positioned and aligned adjacent the openings 194 in the top retaining plate 130 for delivery of gas to atomization cones that develop in the liquid feed box 190 during operation of the aerosol generator 106. The gas delivery ports 136 are typically holes having a diameter of from about 1.5 millimeters to about 3.5 millimeters.

Figure 15:
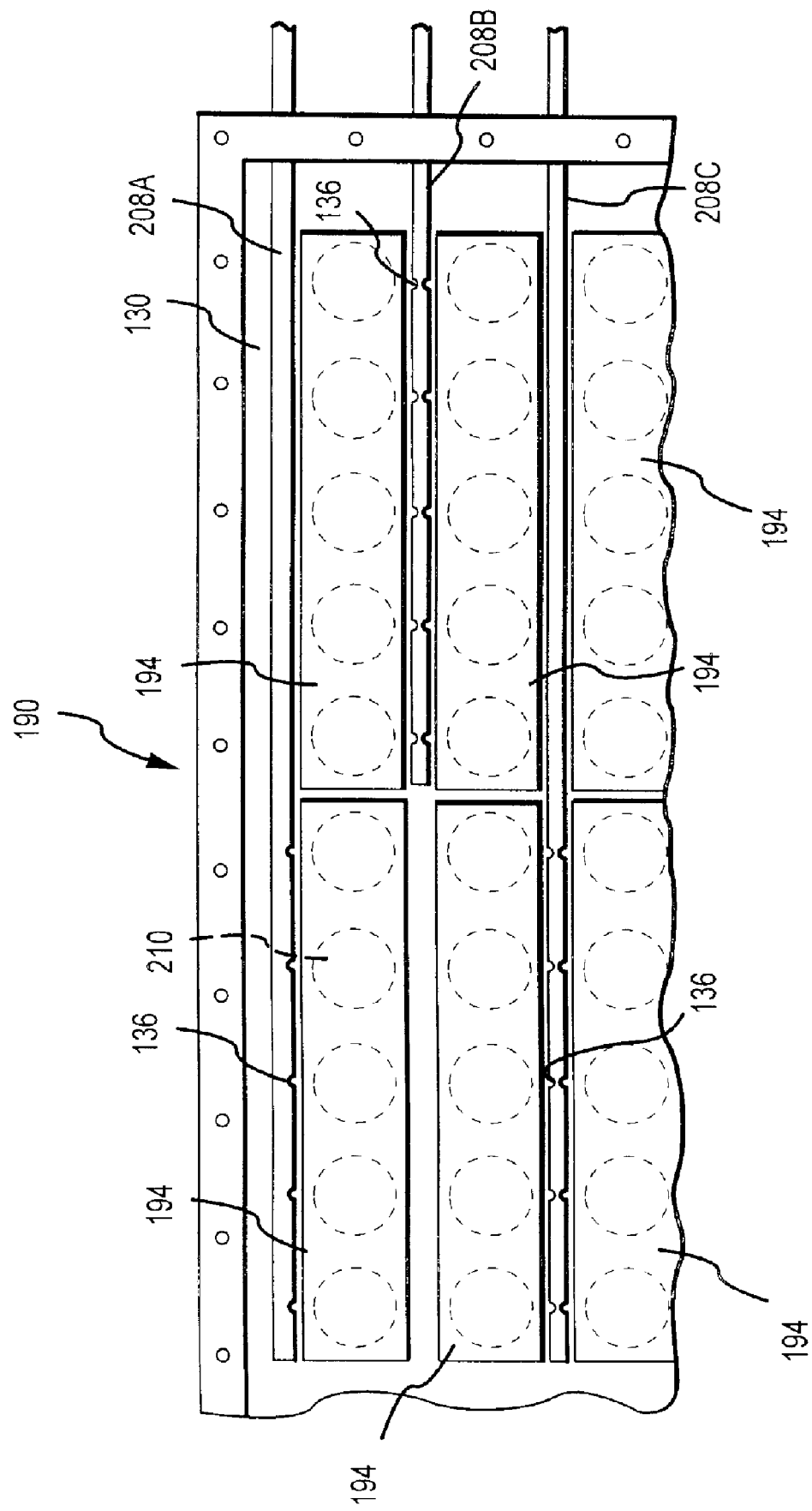
FIG. 15 shows a partial top view of gas tubes positioned in a liquid feed box for distributing gas relative to ultrasonic transducer positions for use in an aerosol generator of the present invention.

Referring now to FIG. 15, a partial view of the liquid feed box 190 is shown with gas tubes 208A, 208B and 208C positioned adjacent to the openings 194 through the top retaining plate 130. Also shown in FIG. 15 are the relative locations that ultrasonic transducer discs 120 would occupy when the aerosol generator 106 is assembled. As seen in FIG. 15, the gas tube 208A, which is at the edge of the array, has five gas delivery ports 136. Each of the gas delivery ports 136 is positioned to divert carrier gas 104 to a different one of atomization cones that develop over the array of ultrasonic transducer discs 120 when the aerosol generator 106 is operating. The gas tube 208B, which is one row in from the edge of the array, is a shorter tube that has ten gas delivery ports 136, five each on opposing sides of the gas tube 208B. The gas tube 208B, therefore, has gas delivery ports 136 for delivering gas to atomization cones corresponding with each of ten ultrasonic transducer discs 120. The third gas tube, 208C, is a longer tube that also has ten gas delivery ports 136 for delivering gas to atomization cones corresponding with ten ultrasonic transducer discs 120. The design shown in FIG. 15, therefore, includes one gas delivery port per ultrasonic transducer disc 120. Although this is a lower density of gas delivery ports 136 than for the embodiment of the aerosol generator 106 shown in FIG. 5, which includes two gas delivery ports per ultrasonic transducer disc 120, the design shown in FIG. 15 is, nevertheless, capable of producing a dense, high-quality aerosol without unnecessary waste of gas.

Figure 16:
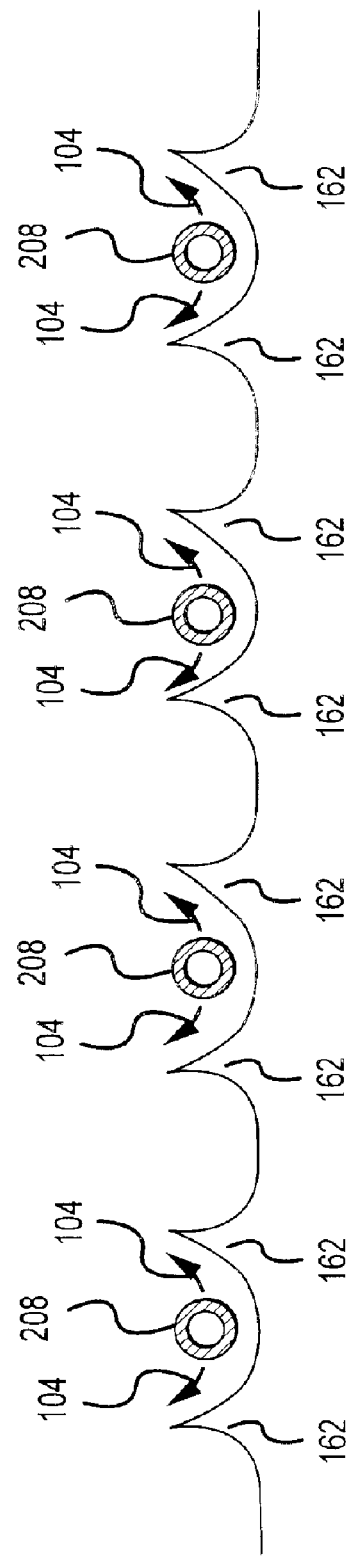
FIG. 16 shows one embodiment for a gas distribution configuration for the aerosol generator of the present invention.

Referring now to FIG. 16, the flow of carrier gas 104 relative to atomization cones 162 during operation of the aerosol generator 106 having a gas distribution configuration to deliver carrier gas 104 from gas delivery ports on both sides of the gas tubes 208, as was shown for the gas tubes 208A, 208B and 208C in the gas distribution configuration shown in FIG. 14. The carrier gas 104 sweeps both directions from each of the gas tubes 208.

Figure 17:
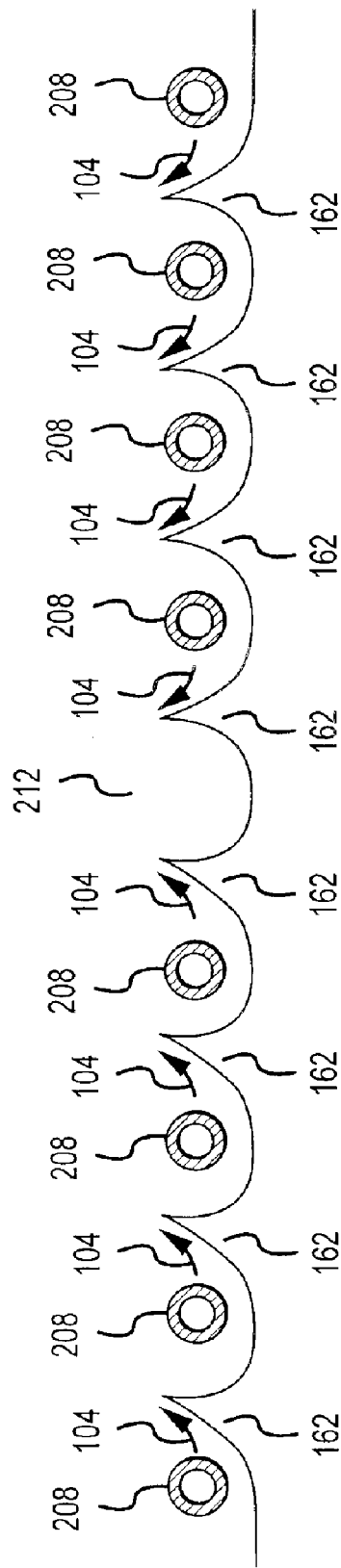
FIG. 17 shows another embodiment for a gas distribution configuration for the aerosol generator of the present invention.

An alternative, and preferred, flow for carrier gas 104 is shown in FIG. 17. As shown in FIG. 17, carrier gas 104 is delivered from only one side of each of the gas tubes 208. This results in a sweep of carrier gas from all of the gas tubes 208 toward a central area 212. This results in a more uniform flow pattern for aerosol generation that may significantly enhance the efficiency with which the carrier gas 104 is used to produce an aerosol. The aerosol that is generated, therefore, tends to be more heavily loaded with liquid droplets.

Figure 18:
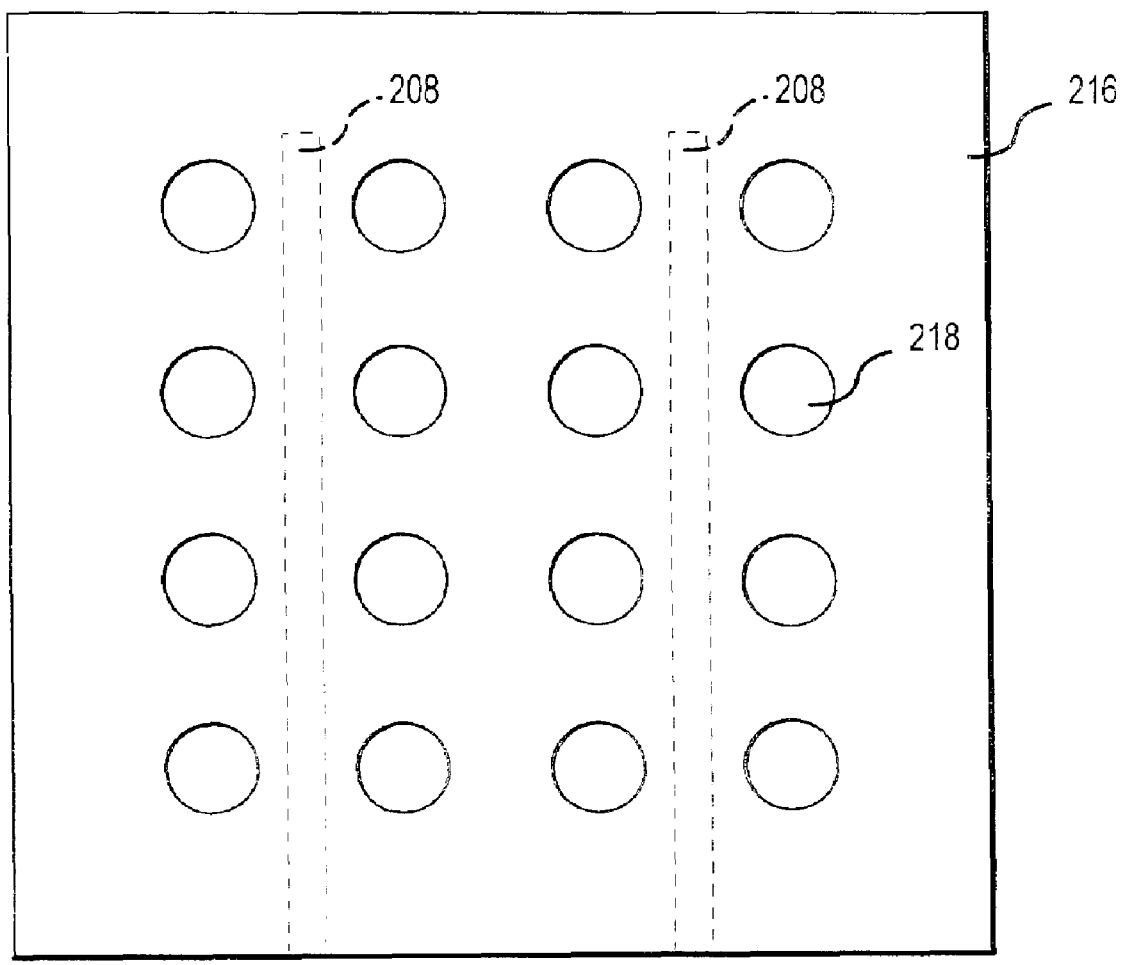
FIG. 18 is a top view of one embodiment of a gas distribution plate/gas tube assembly of the aerosol generator of the present invention.
Figure 19:
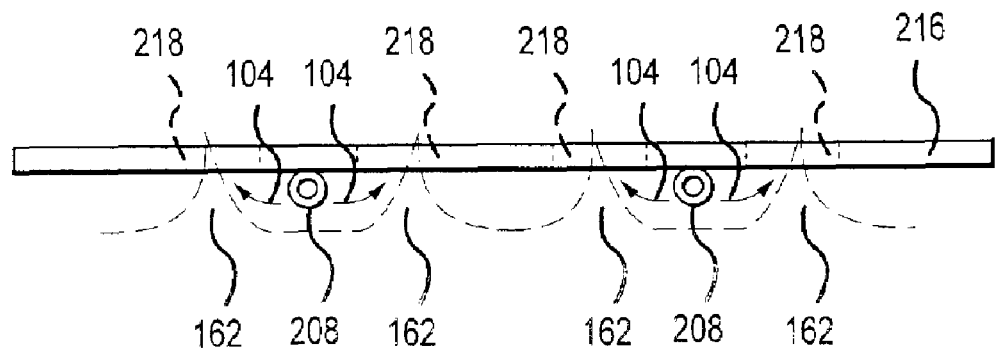
FIG. 19 is a side view of one embodiment of the gas distribution plate/gas tube assembly shown in FIG. 18.

Another configuration for distributing carrier gas in the aerosol generator 106 is shown in FIGS. 18 and 19. In this configuration, the gas tubes 208 are hung from a gas distribution plate 216 adjacent gas flow holes 218 through the gas distribution plate 216. In the aerosol generator 106, the gas distribution plate 216 would be mounted above the liquid feed, with the gas flow holes positioned to each correspond with an underlying ultrasonic transducer. Referring specifically to FIG. 19, when the ultrasonic generator 106 is in operation, atomization cones 162 develop through the gas flow holes 218, and the gas tubes 208 are located such that carrier gas 104 exiting from ports in the gas tubes 208 impinge on the atomization cones and flow upward through the gas flow holes. The gas flow holes 218, therefore, act to assist in efficiently distributing the carrier gas 104 about the atomization cones 162 for aerosol formation. It should be appreciated that the gas distribution plates 218 can be made to accommodate any number of the gas tubes 208 and gas flow holes 218. For convenience of illustration, the embodiment shown in FIGS. 18 and 19 shows a design having only two of the gas tubes 208 and only 16 of the gas flow holes 218. Also, it should be appreciated that the gas distribution plate 216 could be used alone, without the gas tubes 208. In that case, a slight positive pressure of carrier gas 104 would be maintained under the gas distribution plate 216 and the gas flow holes 218 would be sized to maintain the proper velocity of carrier gas 104 through the gas flow holes 218 for efficient aerosol generation. Because of the relative complexity of operating in that mode, however, it is not preferred.

Figure 20:
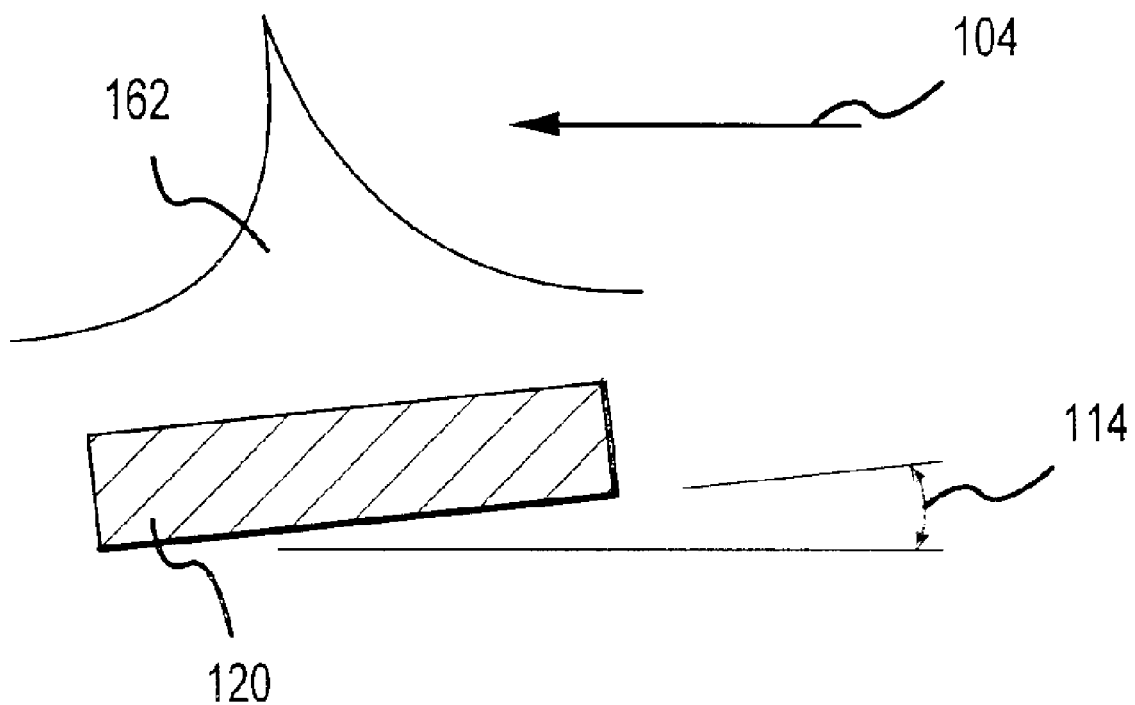
FIG. 20 shows one embodiment for orienting a transducer in the aerosol generator of the present invention.

Aerosol generation may also be enhanced through mounting of ultrasonic transducers at a slight angle and directing the carrier gas at resulting atomization cones such that the atomization cones are tilting in the same direction as the direction of flow of carrier gas. Referring to FIG. 20, an ultrasonic transducer disc 120 is shown. The ultrasonic transducer disc 120 is tilted at a tilt angle 114 (typically less than 10 degrees), so that the atomization cone 162 will also have a tilt. It is preferred that the direction of flow of the carrier gas 104 directed at the atomization cone 162 is in the same direction as the tilt of the atomization cone 162.

Figure 21:
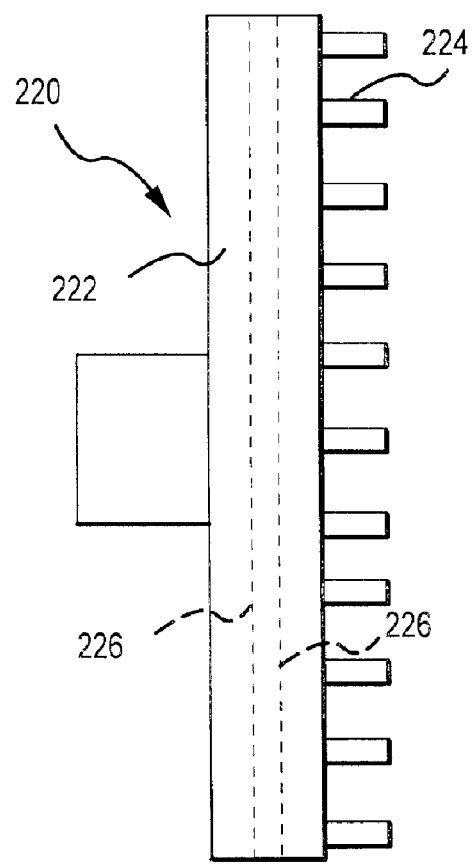
FIG. 21 is a top view of a gas manifold for distributing gas within an aerosol generator of the present invention.
Figure 22:
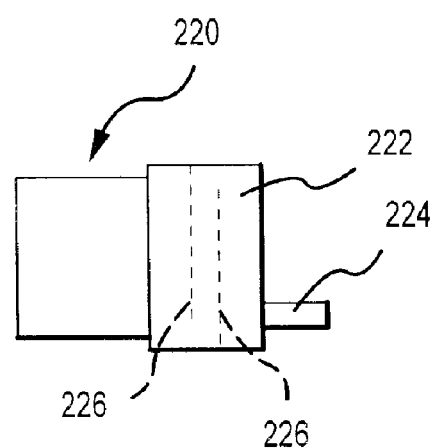
FIG. 22 is a side view of the gas manifold shown in FIG. 21.

Referring now to FIGS. 21 and 22, a gas manifold 220 is shown for distributing gas to the gas tubes 208 in a 400 transducer array design. The gas manifold 220 includes a gas distribution box 222 and piping stubs 224 for connection with gas tubes 208 (shown in FIG. 14). Inside the gas distribution box 222 are two gas distribution plates 226 that form a flow path to assist in distributing the gas equally throughout the gas distribution box 222, to promote substantially equal delivery of gas through the piping stubs 224. The gas manifold 220, as shown in FIGS. 21 and 22, is designed to feed eleven gas tubes 208. For the 400 transducer design, a total of four gas manifolds 220 are required.

Figure 23:
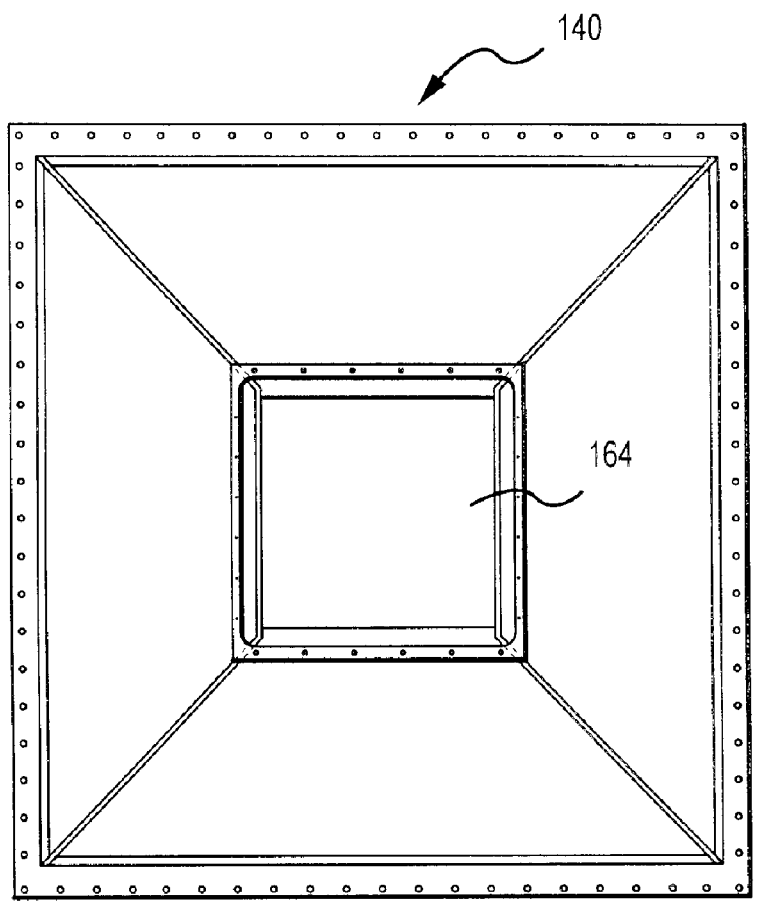
FIG. 23 is a top view of a generator lid of a hood design for use in an aerosol generator of the present invention.
Figure 24:
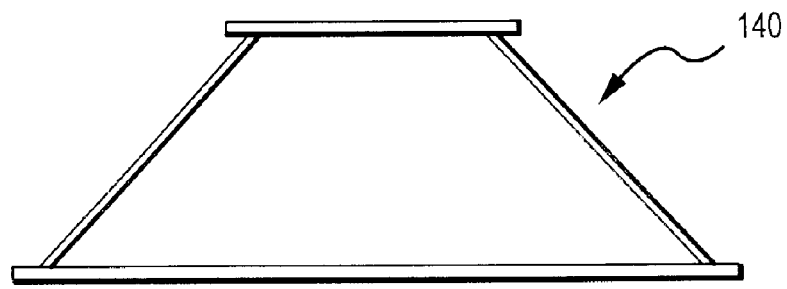
FIG. 24 is a side view of the generator lid shown in FIG. 23.
Figure 26:
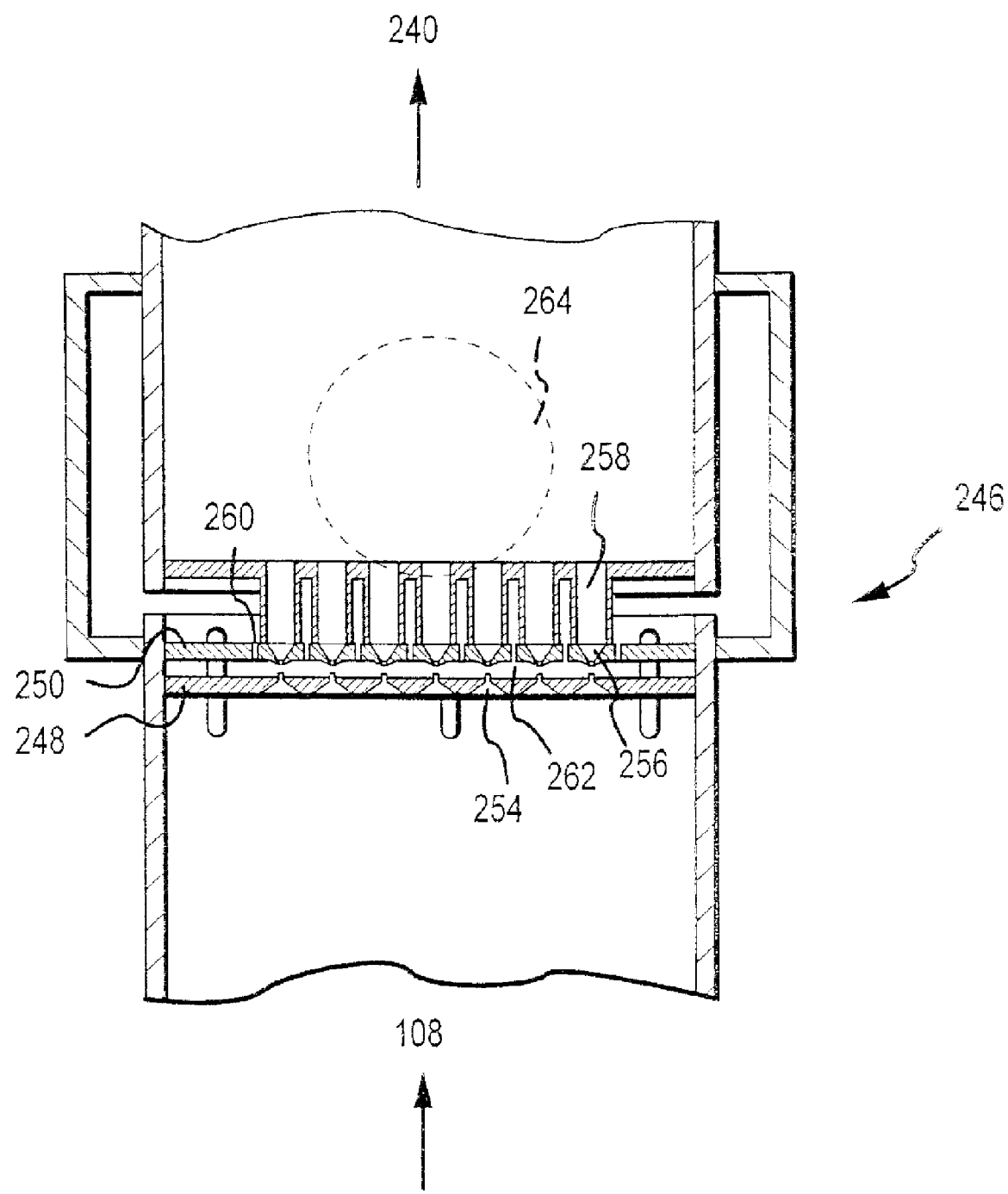
FIG. 26 is a top view in cross section of a virtual impactor that may be used for concentrating an aerosol according to the present invention.
Figure 27:
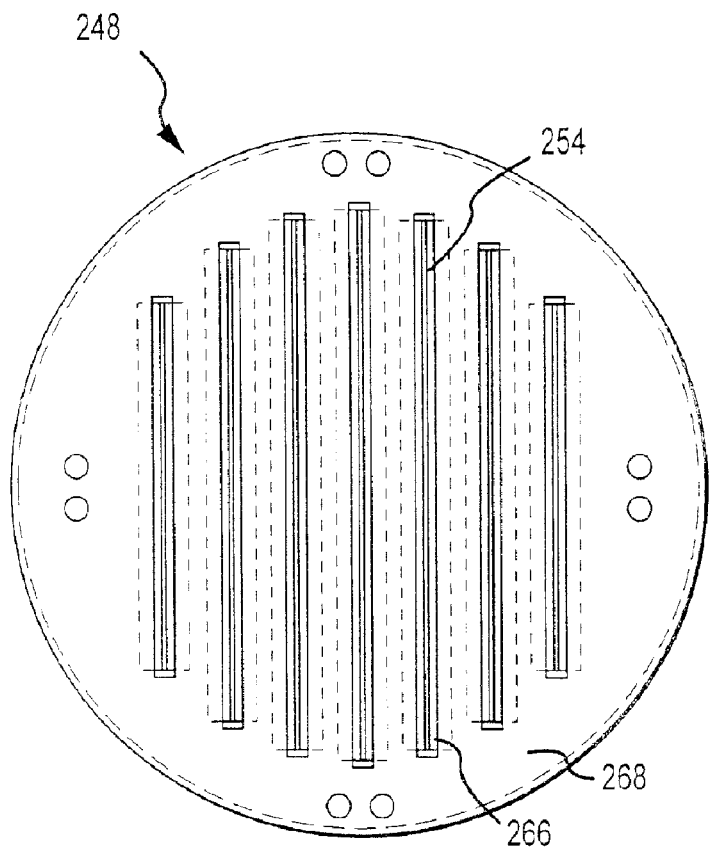
FIG. 27 is a front view of an upstream plate assembly of the virtual impactor shown in FIG. 26.
Figure 29:
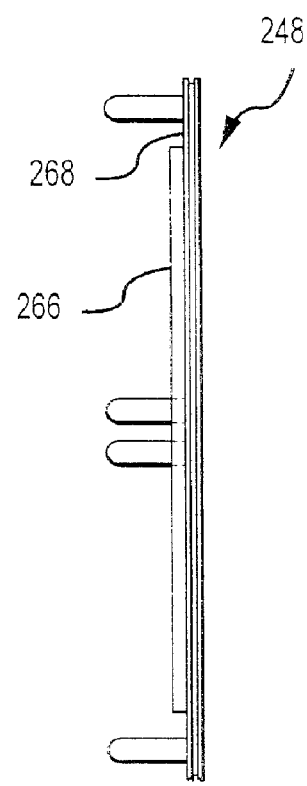
FIG. 29 is a side view of the upstream plate assembly shown in FIG. 27.
Figure 28:
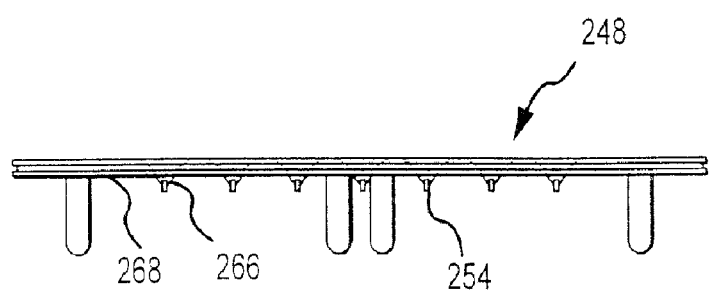
FIG. 28 is a top view of the upstream plate assembly shown in FIG. 27.
Figure 30:
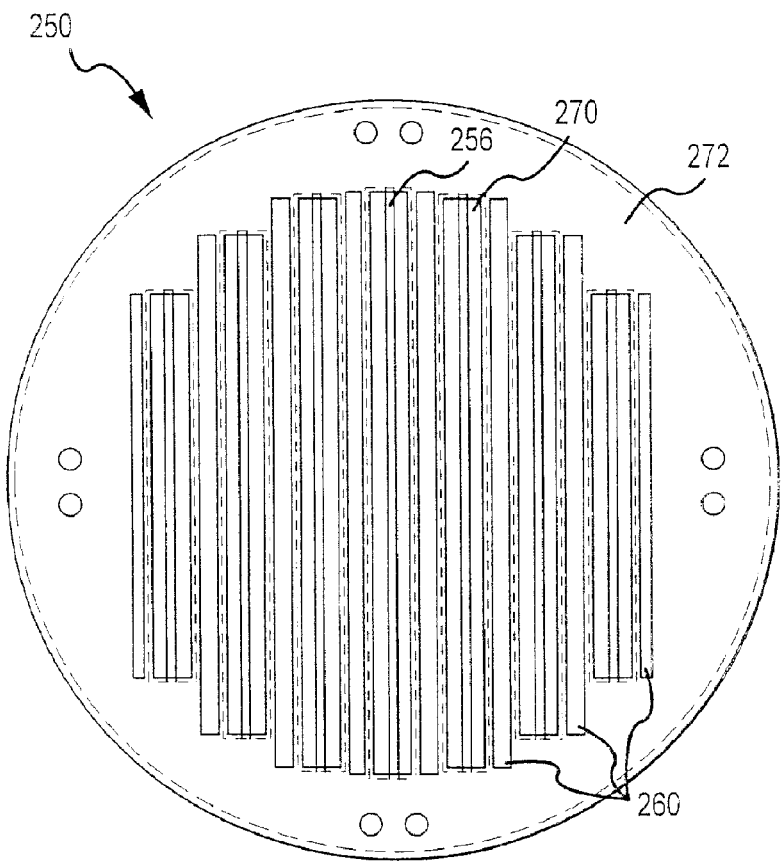
FIG. 30 is a front view of a downstream plate assembly of the virtual impactor shown in FIG. 26.
Figure 32:
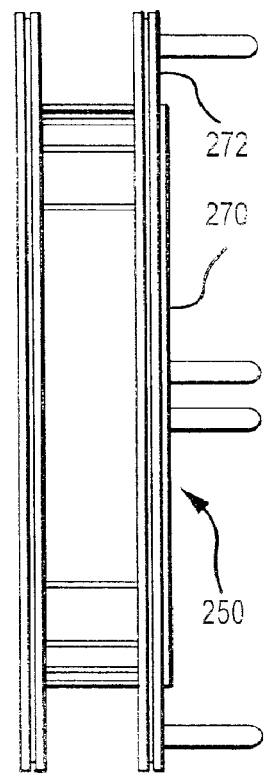
FIG. 32 is a side view of the downstream plate assembly shown in FIG. 30.
Figure 31:
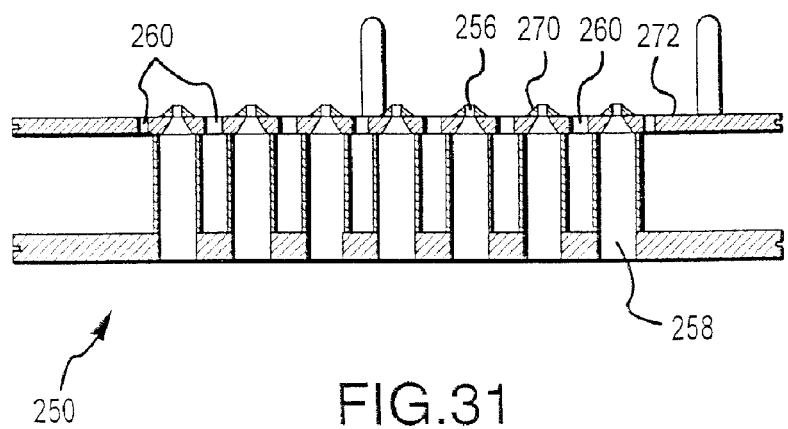
FIG. 31 is a top view of the downstream plate assembly shown in FIG. 30.

Referring now to FIGS. 23 and 24, the generator lid 140 is shown for a 400 transducer array design. The generator lid 140 mates with and covers the liquid feed box 190 (shown in FIGS. 12 and 13). The generator lid 140, as shown in FIGS. 23 and 24, has a hood design to permit easy collection of the aerosol 108 without subjecting droplets in the aerosol 108 to sharp edges on which droplets may coalesce and be lost, and possibly interfere with the proper operation of the aerosol generator 106. When the aerosol generator 106 is in operation, the aerosol 108 would be withdrawn via the aerosol exit opening 164 through the generator cover 140.

Figure 25:
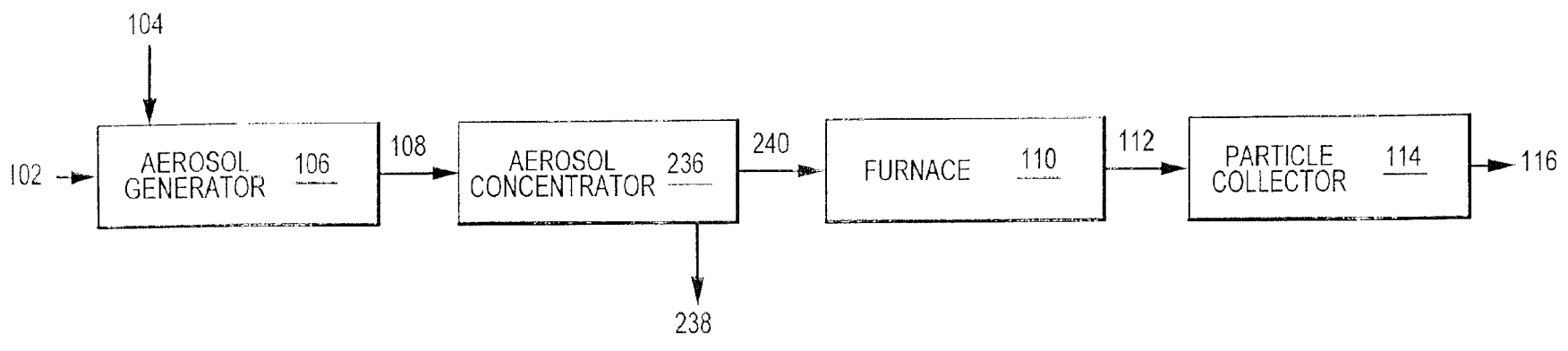

Although the aerosol generator 106 produces a high quality aerosol 108 having a high droplet loading, it is often desirable to further concentrate the aerosol 108 prior to introduction into the furnace 110. Referring now to FIG. 25, a process flow diagram is shown for one embodiment of the present invention involving such concentration of the aerosol 108. As shown in FIG. 25, the aerosol 108 from the aerosol generator 106 is sent to an aerosol concentrator 236 where excess carrier gas 238 is withdrawn from the aerosol 108 to produce a concentrated aerosol 240, which is then fed to the furnace 110.

The aerosol concentrator 236 typically includes one or more virtual impactors capable of concentrating droplets in the aerosol 108 by a factor of greater than about 2, preferably by a factor of greater than about 5, and more preferably by a factor of greater than about 10, to produce the concentrated aerosol 240. According to the present invention, the concentrated aerosol 240 should typically contain greater than about $1 \times 10^7$ droplets per cubic centimeter, and more preferably from about $5 \times 10^7$ to about $5 \times 10^8$ droplets per cubic centimeter. A concentration of about $1 \times 10^8$ droplets per cubic centimeter of the concentrated aerosol is particularly preferred, because when the concentrated aerosol 240 is loaded more heavily than that, then the frequency of collisions between droplets becomes large enough to impair the properties of the concentrated aerosol 240, resulting in potential contamination of the particulate product 116 with an undesirably large quantity of over-sized particles. For example, if the aerosol 108 has a concentration of about $1 \times 10^7$ droplets per cubic centimeter, and the aerosol concentrator 236 concentrates droplets by a factor of 10, then the concentrated aerosol 240 will have a concentration of about $1 \times 10^8$ droplets per cubic centimeter. Stated another way, for example, when the aerosol generator generates the aerosol 108 with a droplet loading of about 0.167 milliliters liquid feed 102 per liter of carrier gas 104, the concentrated aerosol 240 would be loaded with about 1.67 milliliters of liquid feed 102 per liter of carrier gas 104, assuming the aerosol 108 is concentrated by a factor of 10.

Having a high droplet loading in aerosol feed to the furnace provides the important advantage of reducing the heating demand on the furnace 110 and the size of flow conduits required through the furnace. Also, other advantages of having a dense aerosol include a reduction in the demands on cooling and particle collection components, permitting significant equipment and operational savings. Furthermore, as system components are reduced in size, powder holdup within the system is reduced, which is also desirable. Concentration of the aerosol stream prior to entry into the furnace 110, therefore, provides a substantial advantage relative to processes that utilize less concentrated aerosol streams.

The excess carrier gas 238 that is removed in the aerosol concentrator 236 typically includes extremely small droplets that are also removed from the aerosol 108. Preferably, the droplets removed with the excess carrier gas 238 have a weight average size of smaller than about 1.5 µm, and more preferably smaller than about 1 µm and the droplets retained in the concentrated aerosol 240 have an average droplet size of larger than about 2 µm. For example, a virtual impactor sized to treat an aerosol stream having a weight average droplet size of about 3 µm might be designed to remove with the excess carrier gas 238 most droplets smaller than about 1.5 µm in size. Other designs are also possible. When using the aerosol generator 106 with the present invention, however, the loss of these very small droplets in the aerosol concentrator 236 will typically constitute no more than about 10 percent by weight, and more preferably no more than about 5 percent by weight, of the droplets originally in the aerosol stream that is fed to the concentrator 236. Although the aerosol concentrator 236 is useful in some situations, it is normally not required with the process of the present invention, because the aerosol generator 106 is capable, in most circumstances, of generating an aerosol stream that is sufficiently dense. So long as the aerosol stream coming out of the aerosol generator 102 is sufficiently dense, it is preferred that the aerosol concentrator not be used. It is a significant advantage of the present invention that the aerosol generator 106 normally generates such a dense aerosol stream that the aerosol concentrator 236 is not needed. Therefore, the complexity of operation of the aerosol concentrator 236 and accompanying liquid losses may typically be avoided.

It is important that the aerosol stream (whether it has been concentrated or not) that is fed to the furnace 110 have a high droplet flow rate and high droplet loading as would be required for most industrial applications. With the present invention, the aerosol stream fed to the furnace preferably includes a droplet flow of greater than about 0.5 liters per hour, more preferably greater than about 2 liters per hour, still more preferably greater than about 5 liters per hour, even more preferably greater than about 10 liters per hour, particularly greater than about 50 liters per hour and most preferably greater than about 100 liters per hour; and with the droplet loading being typically greater than about 0.04 milliliters of droplets per liter of carrier gas, preferably greater than about 0.083 milliliters of droplets per liter of carrier gas 104, more preferably greater than about 0.167 milliliters of droplets per liter of carrier gas 104, still more preferably greater than about 0.25 milliliters of droplets per liter of carrier gas 104, particularly greater than about 0.33 milliliters of droplets per liter of carrier gas 104 and most preferably greater than about 0.83 milliliters of droplets per liter of carrier gas 104.

One embodiment of a virtual impactor that could be used as the aerosol concentrator 236 will now be described with reference to FIGS. 26-32. A virtual impactor 246 includes an upstream plate assembly 248 (details shown in FIGS. 27-29) and a downstream plate assembly 250 (details shown in FIGS. 25-32), with a concentrating chamber 262 located between the upstream plate assembly 248 and the downstream plate assembly 250.

Through the upstream plate assembly 248 are a plurality of vertically extending inlet slits 254. The downstream plate assembly 250 includes a plurality of vertically extending exit slits 256 that are in alignment with the inlet slits 254. The exit slits 256 are, however, slightly wider than the inlet slits 254. The downstream plate assembly 250 also includes flow channels 258 that extend substantially across the width of the entire downstream plate assembly 250, with each flow channel 258 being adjacent to an excess gas withdrawal port 260.

During operation, the aerosol 108 passes through the inlet slits 254 and into the concentrating chamber 262. Excess carrier gas 238 is withdrawn from the concentrating chamber 262 via the excess gas withdrawal ports 260. The withdrawn excess carrier gas 238 then exits via a gas duct port 264. That portion of the aerosol 108 that is not withdrawn through the excess gas withdrawal ports 260 passes through the exit slits 256 and the flow channels 258 to form the concentrated aerosol 240. Those droplets passing across the concentrating chamber 262 and through the exit slits 256 are those droplets of a large enough size to have sufficient momentum to resist being withdrawn with the excess carrier gas 238.

As seen best in FIGS. 27-32, the inlet slits 254 of the upstream plate assembly 248 include inlet nozzle extension portions 266 that extend outward from the plate surface 268 of the upstream plate assembly 248. The exit slits 256 of the downstream plate assembly 250 include exit nozzle extension portions 270 extending outward from a plate surface 272 of the downstream plate assembly 250. These nozzle extension portions 266 and 270 are important for operation of the virtual impactor 246, because having these nozzle extension portions 266 and 270 permits a very close spacing to be attained between the inlet slits 254 and the exit slits 256 across the concentrating chamber 262, while also providing a relatively large space in the concentrating chamber 262 to facilitate efficient removal of the excess carrier gas 238.

Also as best seen in FIGS. 27-32, the inlet slits 254 have widths that flare outward toward the side of the upstream plate assembly 248 that is first encountered by the aerosol 108 during operation. This flared configuration reduces the sharpness of surfaces encountered by the aerosol 108, reducing the loss of aerosol droplets and potential interference from liquid buildup that could occur if sharp surfaces were present. Likewise, the exit slits 256 have a width that flares outward towards the flow channels 258, thereby allowing the concentrated aerosol 240 to expand into the flow channels 258 without encountering sharp edges that could cause problems.

As noted previously, both the inlet slits 254 of the upstream plate assembly 248 and the exit slits 256 of the downstream plate assembly 250 are vertically extending. This configuration is advantageous for permitting liquid that may collect around the inlet slits 254 and the exit slits 256 to drain away. The inlet slits 254 and the exit slits 256 need not, however, have a perfectly vertical orientation. Rather, it is often desirable to slant the slits backward (sloping upward and away in the direction of flow) by about five to ten degrees relative to vertical, to enhance draining of liquid off of the upstream plate assembly 248 and the downstream plate assembly 250. This drainage function of the vertically extending configuration of the inlet slits 254 and the outlet slits 256 also inhibits liquid build-up in the vicinity of the inlet slits 248 and the exit slits 250, which liquid build-up could result in the release of undesirably large droplets into the concentrated aerosol 240.

As discussed previously, the aerosol generator 106 of the present invention produces a concentrated, high quality aerosol of micro-sized droplets having a relatively narrow size distribution. It has been found, however, that for many applications the process of the present invention is significantly enhanced by further classifying by size the droplets in the aerosol 108 prior to introduction of the droplets into the furnace 110. In this manner, the size and size distribution of particles in the particulate product 116 are further controlled.

Figure 33:
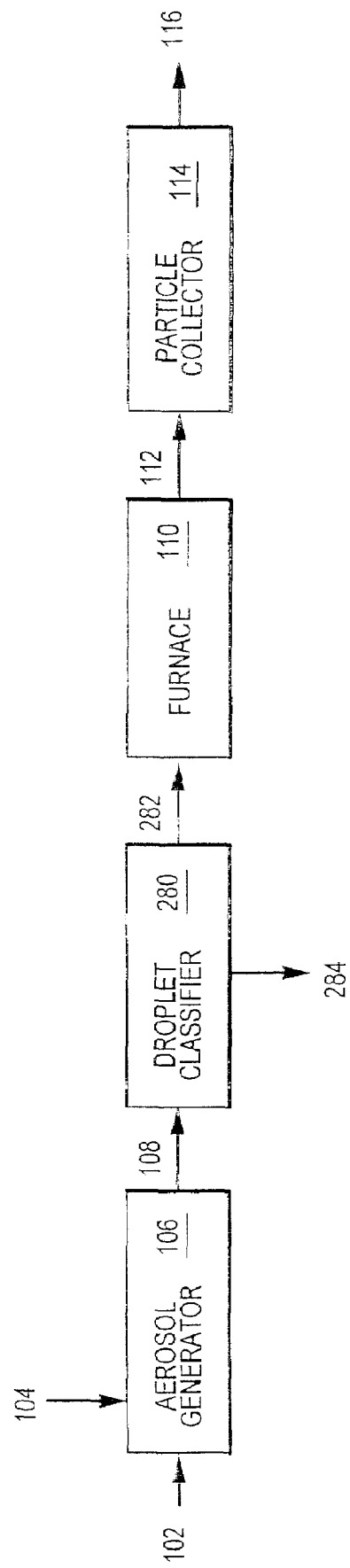
FIG. 33 is a process block diagram of one embodiment of the process of the present invention including a droplet classifier.

Referring now to FIG. 33, a process flow diagram is shown for one embodiment of the process of the present invention including such droplet classification. As shown in FIG. 33, the aerosol 108 from the aerosol generator 106 goes to a droplet classifier 280 where oversized droplets are removed from the aerosol 108 to prepare a classified aerosol 282. Liquid 284 from the oversized droplets that are being removed is drained from the droplet classifier 280. This drained liquid 284 may advantageously be recycled for use in preparing additional liquid feed 102.

Any suitable droplet classifier may be used for removing droplets above a predetermined size. For example, a cyclone could be used to remove over-size droplets. A preferred droplet classifier for many applications, however, is an impactor. One embodiment of an impactor for use with the present invention will now be described with reference to FIGS. 34-38.

Figure 34:
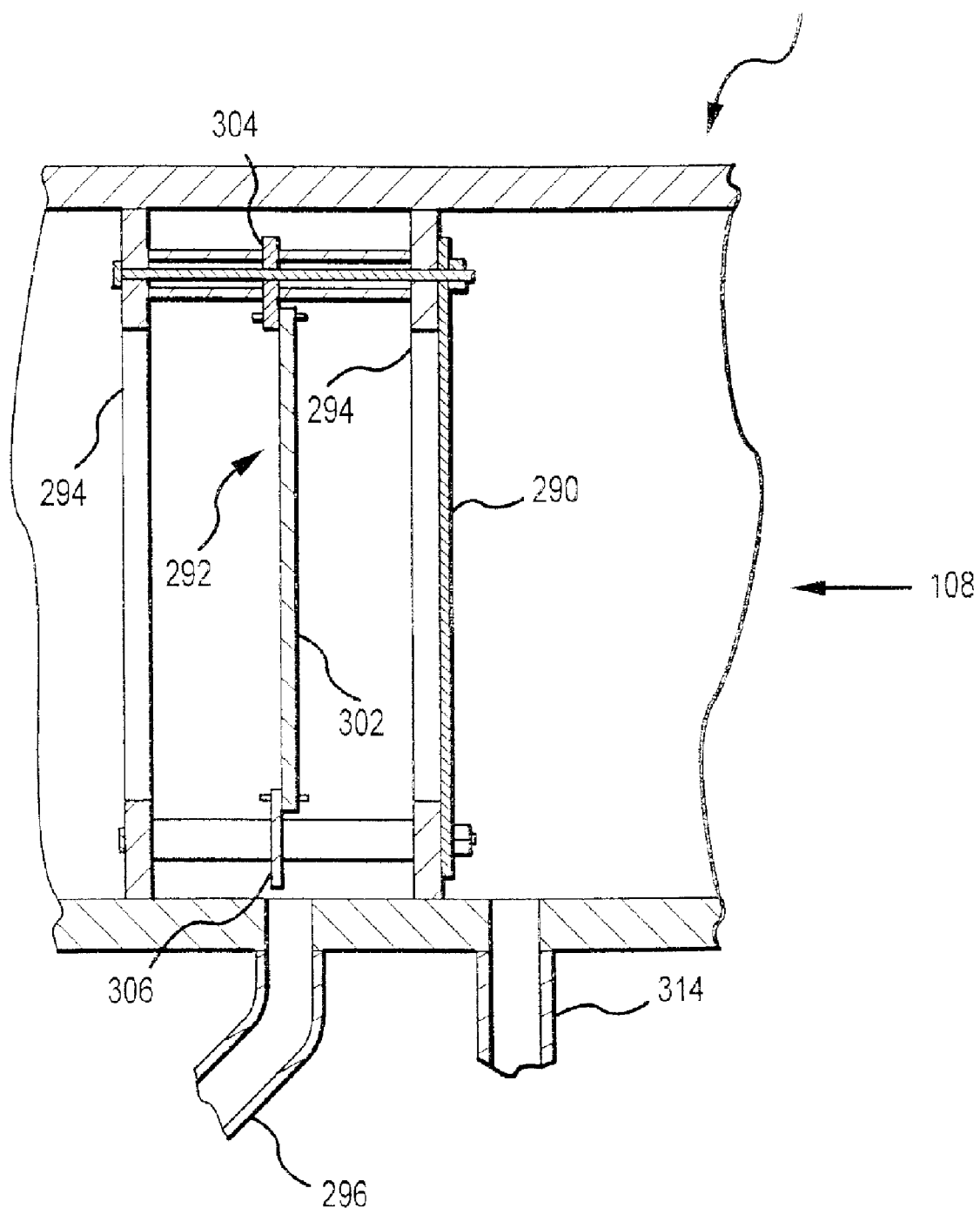
FIG. 34 is a top view in cross section of an impactor of the present invention for use in classifying an aerosol.

As seen in FIG. 34, an impactor 288 has disposed in a flow conduit 286 a flow control plate 290 and an impactor plate assembly 292. The flow control plate 290 is conveniently mounted on a mounting plate 294.

Figure 35:
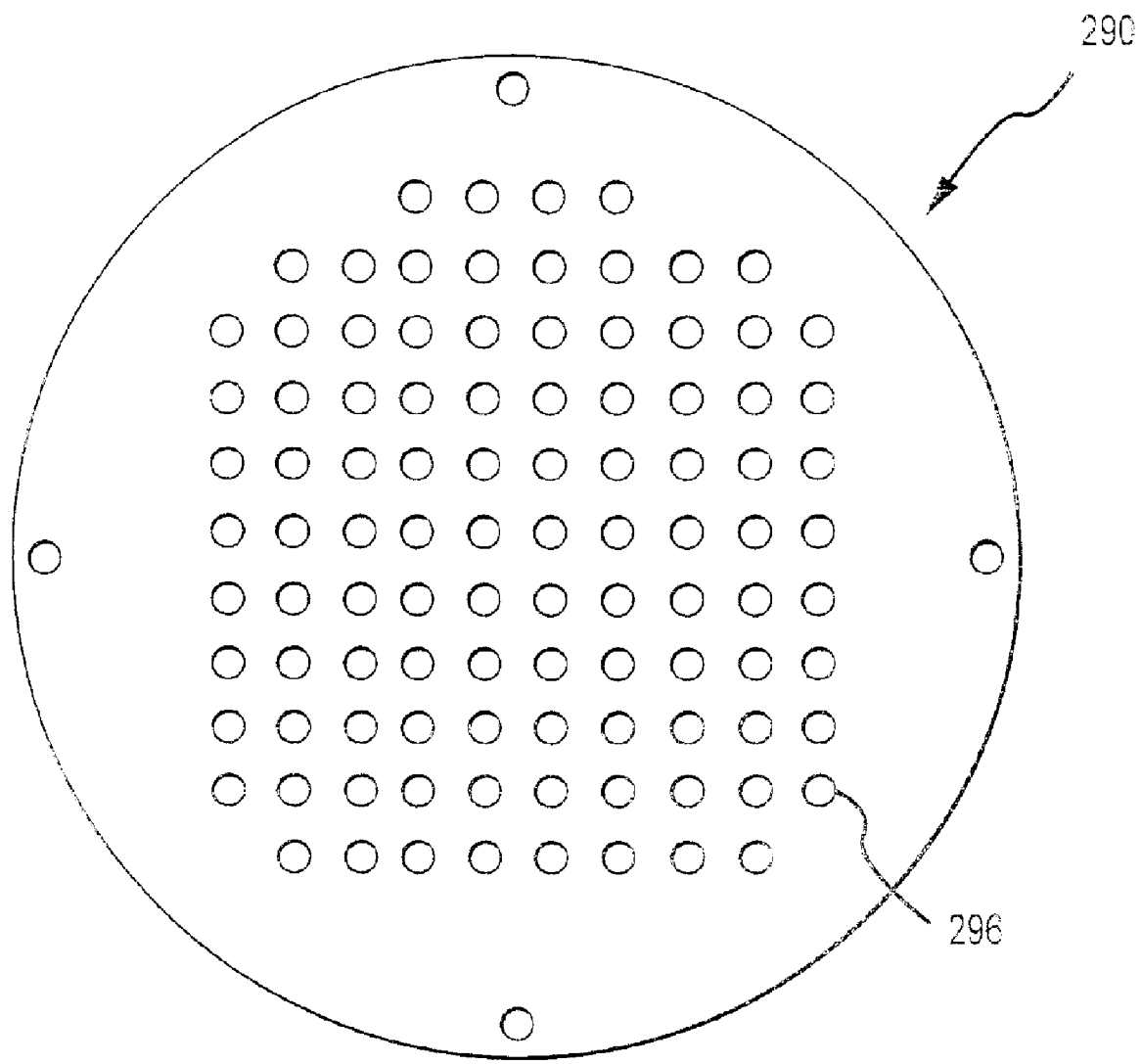
FIG. 35 is a front view of a flow control plate of the impactor shown in FIG. 34.

The flow control plate 290 is used to channel the flow of the aerosol stream toward the impactor plate assembly 292 in a manner with controlled flow characteristics that are desirable for proper impaction of oversize droplets on the impactor plate assembly 292 for removal through the drains 296 and 314. One embodiment of the flow control plate 290 is shown in FIG. 35. The flow control plate 290 has an array of circular flow ports 296 for channeling flow of the aerosol 108 towards the impactor plate assembly 292 with the desired flow characteristics.

Figure 36:
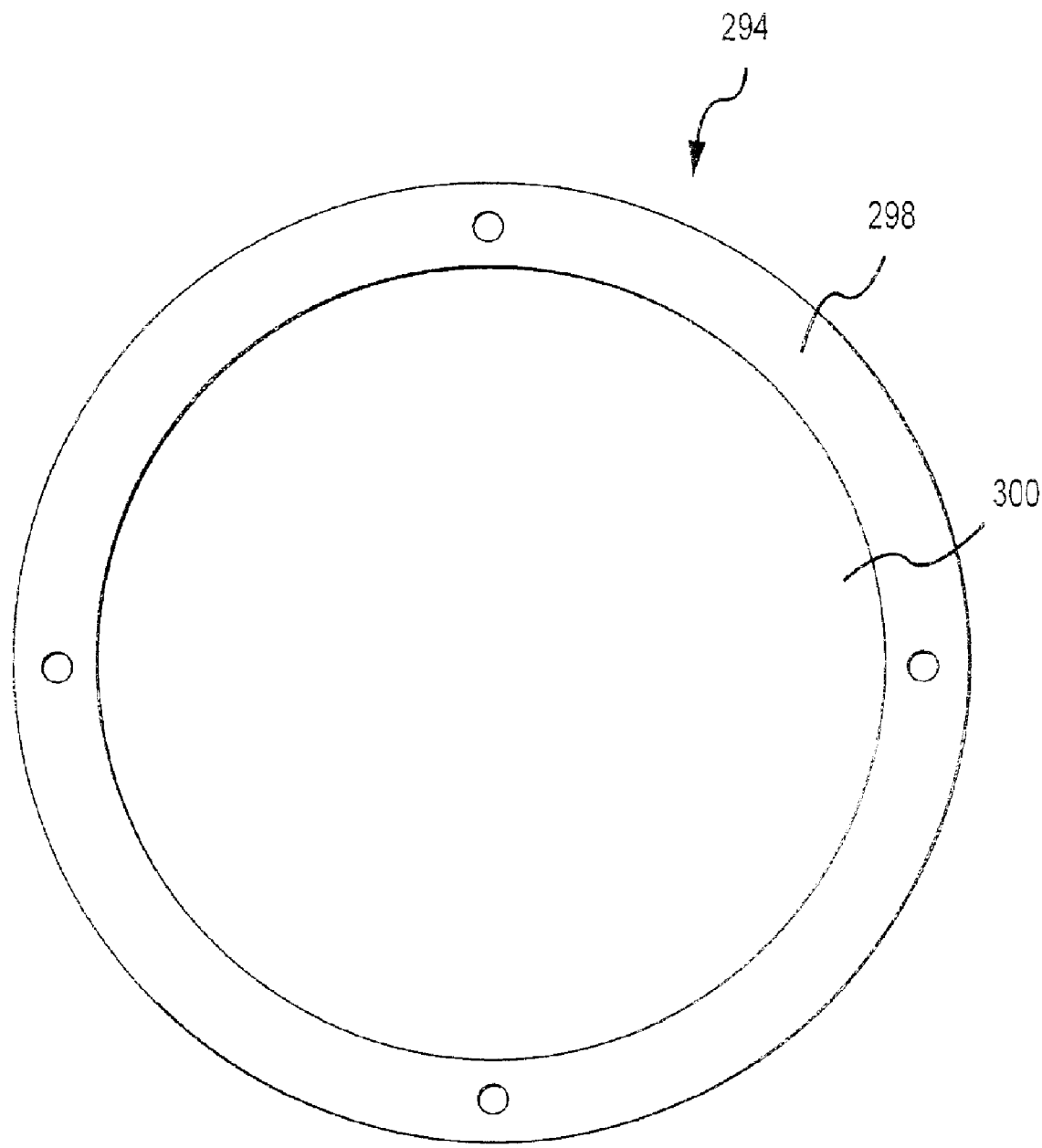
FIG. 36 is a front view of a mounting plate of the impactor shown in FIG. 34.

Details of the mounting plate 294 are shown in FIG. 36. The mounting plate 294 has a mounting flange 298 with a large diameter flow opening 300 passing therethrough to permit access of the aerosol 108 to the flow ports 296 of the flow control plate 290 (shown in FIG. 35).

Figure 37:
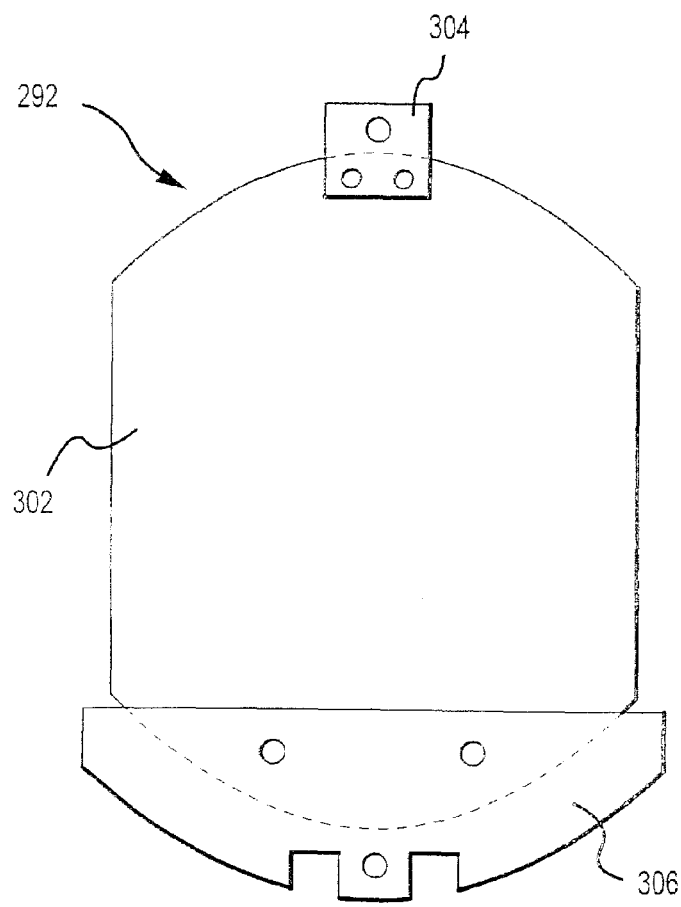
FIG. 37 is a front view of an impactor plate assembly of the impactor shown in FIG. 34.
Figure 38:
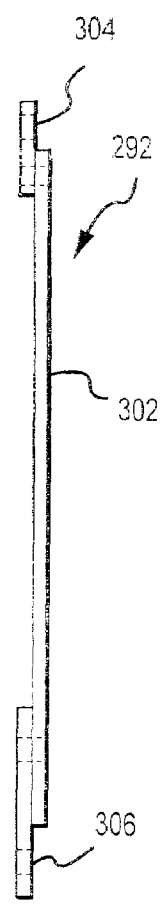
FIG. 38 is a side view of the impactor plate assembly shown in FIG. 37.

Referring now to FIGS. 37 and 38, one embodiment of an impactor plate assembly 292 is shown. The impactor plate assembly 292 includes an impactor plate 302 and mounting brackets 304 and 306 used to mount the impactor plate 302 inside of the flow conduit 286. The impactor plate 302 and the flow channel plate 290 are designed so that droplets larger than a predetermined size will have momentum that is too large for those particles to change flow direction to navigate around the impactor plate 302.

During operation of the impactor 288, the aerosol 108 from the aerosol generator 106 passes through the upstream flow control plate 290. Most of the droplets in the aerosol navigate around the impactor plate 302 and exit the impactor 288 through the downstream flow control plate 290 in the classified aerosol 282. Droplets in the aerosol 108 that are too large to navigate around the impactor plate 302 will impact on the impactor plate 302 and drain through the drain 296 to be collected with the drained liquid 284 (as shown in FIG. 34).

The configuration of the impactor plate 302 shown in FIG. 33 represents only one of many possible configurations for the impactor plate 302. For example, the impactor 288 could include an upstream flow control plate 290 having vertically extending flow slits therethrough that are offset from vertically extending flow slits through the impactor plate 302, such that droplets too large to navigate the change in flow due to the offset of the flow slits between the flow control plate 290 and the impactor plate 302 would impact on the impactor plate 302 to be drained away. Other designs are also possible.

In a preferred embodiment of the present invention, the droplet classifier 280 is typically designed to remove droplets from the aerosol 108 that are larger than about 15 μm in size, more preferably to remove droplets larger than about 10 μm in size, even more preferably to remove droplets of a size larger than about 8 μm in size and most preferably to remove droplets larger than about 5 μm in size. The droplet classification size in the droplet classifier is preferably smaller than about 15 μm, more preferably smaller than about 10 μm, even more preferably smaller than about 8 μm and most preferably smaller than about 5 μm. The classification size, also called the classification cut point, is that size at which half of the droplets of that size are removed and half of the droplets of that size are retained. Depending upon the specific application, however, the droplet classification size may be varied, such as by changing the spacing between the impactor plate 302 and the flow control plate 290 or increasing or decreasing aerosol velocity through the jets in the flow control plate 290. Because the aerosol generator 106 of the present invention initially produces a high quality aerosol 108, having a relatively narrow size distribution of droplets, typically less than about 30 weight percent of liquid feed 102 in the aerosol 108 is removed as the drain liquid 284 in the droplet classifier 288, with preferably less than about 25 weight percent being removed, even more preferably less than about 20 weight percent being removed and most preferably less than about 15 weight percent being removed. Minimizing the removal of liquid feed 102 from the aerosol 108 is particularly important for commercial applications to increase the yield of high quality particulate product 116. It should be noted, however, that because of the superior performance of the aerosol generator 106, it is frequently not required to use an impactor or other droplet classifier to obtain a desired absence of oversize droplets to the furnace. This is a major advantage, because the added complexity and liquid losses accompanying use of an impactor may often be avoided with the process of the present invention.

Figure 39:
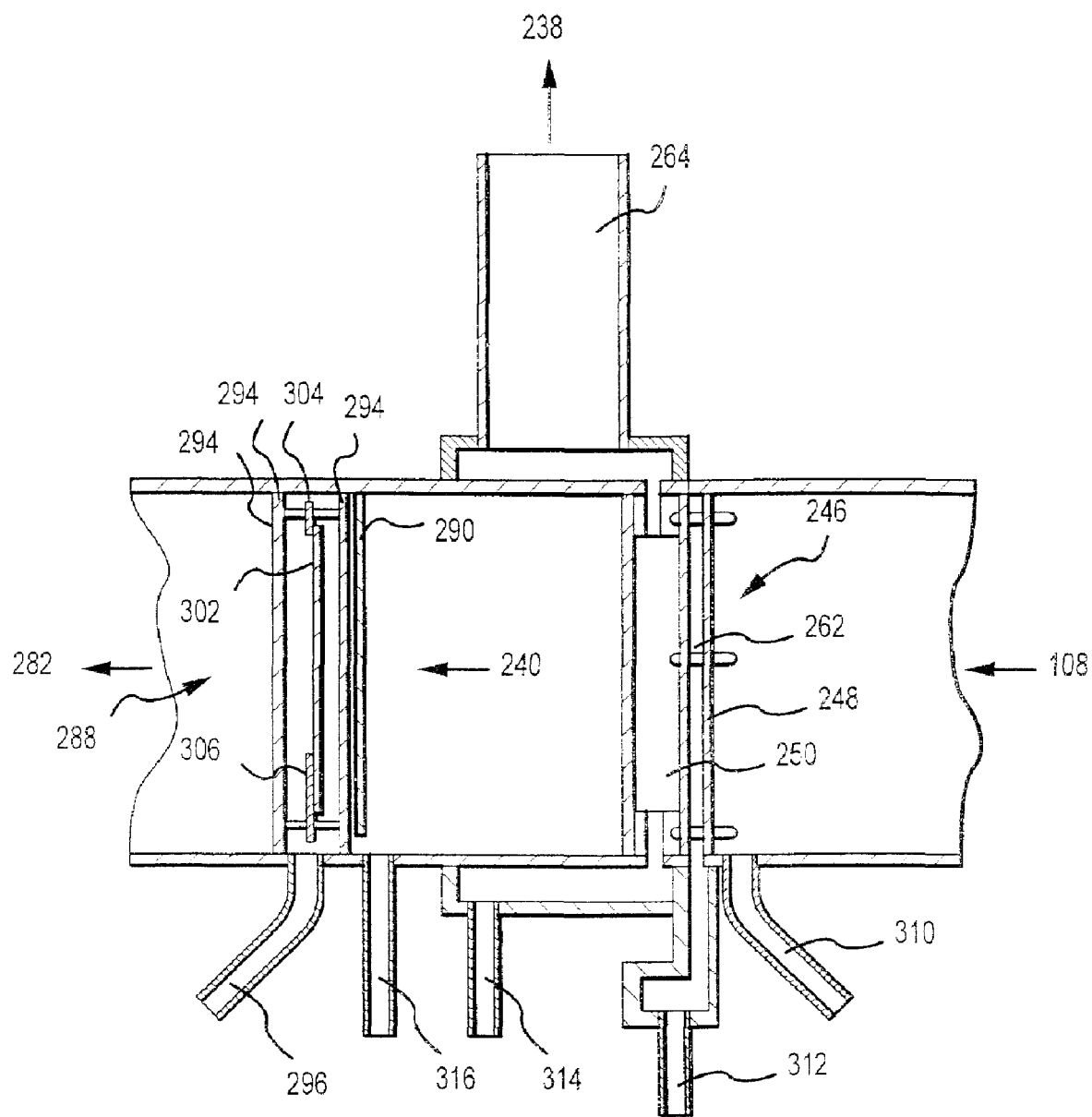
FIG. 39 shows a side view in cross section of a virtual impactor in combination with an impactor of the present invention for concentrating and classifying droplets in an aerosol.
Figure 40:
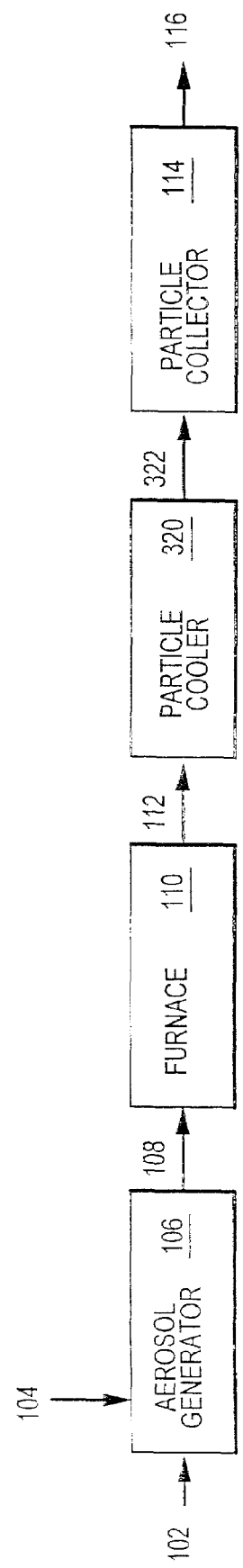
FIG. 40 is a process block diagram of one embodiment of the present invention including a particle cooler.

Sometimes it is desirable to use both the aerosol concentrator 236 and the droplet classifier 280 to produce an extremely high quality aerosol stream for introduction into the furnace for the production of particles of highly controlled size and size distribution. Referring now to FIG. 39, one embodiment of the present invention is shown incorporating both the virtual impactor 246 and the impactor 288. Basic components of the virtual impactor 246 and the impactor 288, as shown in FIG. 39, are substantially as previously described with reference to FIGS. 26-38. As seen in FIG. 39, the aerosol 108 from the aerosol generator 106 is fed to the virtual impactor 246 where the aerosol stream is concentrated to produce the concentrated aerosol 240. The concentrated aerosol 240 is then fed to the impactor 288 to remove large droplets therefrom and produce the classified aerosol 282, which may then be fed to the furnace 110. Also, it should be noted that by using both a virtual impactor and an impactor, both undesirably large and undesirably small droplets are removed, thereby producing a classified aerosol with a very narrow droplet size distribution. Also, the order of the aerosol concentrator and the aerosol classifier could be reversed, so that the aerosol concentrator 236 follows the aerosol classifier 280.

One important feature of the design shown in FIG. 39 is the incorporation of drains 310, 312, 314, 316 and 296 at strategic locations. These drains are extremely important for industrial-scale particle production because buildup of liquid in the process equipment can significantly impair the quality of the particulate product 116 that is produced. In that regard, drain 310 drains liquid away from the inlet side of the first plate assembly 248 of the virtual impactor 246. Drain 312 drains liquid away from the inside of the concentrating chamber 262 in the virtual impactor 246 and drain 314 removes liquid that deposits out of the excess carrier gas 238. Drain 316 removes liquid from the vicinity of the inlet side of the flow control plate 290 of the impactor, while the drain 296 removes liquid from the vicinity of the impactor plate 302. Without these drains 310, 312, 314, 316 and 296, the performance of the apparatus shown in FIG. 39 would be significantly impaired. All liquids drained in the drains 310, 312, 314, 316 and 296 may advantageously be recycled for use to prepare the liquid feed 102.

With some applications of the process of the present invention, it may be possible to collect the particles 112 directly from the output of the furnace 110. More often, however, it will be desirable to cool the particles 112 exiting the furnace 110 prior to collection of the particles 112 in the particle collector 114. Referring now to FIG. 40, one embodiment of the process of the present invention is shown in which the particles 112 exiting the furnace 110 are sent to a particle cooler 320 to produce a cooled particle stream 322, which is then feed to the particle collector 114. Although the particle cooler 320 may be any cooling apparatus capable of cooling the particles 112 to the desired temperature for introduction into the particle collector 114, traditional heat exchanger designs are not preferred. This is because a traditional heat exchanger design ordinarily directly subjects the aerosol stream, in which the hot particles 112 are suspended, to cool surfaces. In that situation, significant losses of the particles 112 occur due to thermophoretic deposition of the hot particles 112 on the cool surfaces of the heat exchanger. According to the present invention, a gas quench apparatus is provided for use as the particle cooler 320 that significantly reduces thermophoretic losses compared to a traditional heat exchanger.

Referring now to FIGS. 41-43, one embodiment of a gas quench cooler 330 is shown. The gas quench cooler includes a perforated conduit 332 housed inside of a cooler housing 334 with an annular space 336 located between the cooler housing 334 and the perforated conduit 332. In fluid communication with the annular space 336 is a quench gas inlet box 338, inside of which is disposed a portion of an aerosol outlet conduit 340. The perforated conduit 332 extends between the aerosol outlet conduit 340 and an aerosol inlet conduit 342. Attached to an opening into the quench gas inlet box 338 are two quench gas feed tubes 344. Referring specifically to FIG. 43, the perforated tube 332 is shown. The perforated tube 332 has a plurality of openings 345. The openings 345, when the perforated conduit 332 is assembled into the gas quench cooler 330, permit the flow of quench gas 346 from the annular space 336 into the interior space 348 of the perforated conduit 332. Although the openings 345 are shown as being round holes, any shape of opening could be used, such as slits. Also, the perforated conduit 332 could be a porous screen. Two heat radiation shields 347 prevent downstream radiant heating from the furnace. In most instances, however, it will not be necessary to include the heat radiation shields 347, because downstream radiant heating from the furnace is normally not a significant problem. Use of the heat radiation shields 347 is not preferred due to particulate losses that accompany their use.

With continued reference to FIGS. 41-43, operation of the gas quench cooler 330 will now be described. During operation, the particles 112, carried by and dispersed in a gas stream, enter the gas quench cooler 330 through the aerosol inlet conduit 342 and flow into the interior space 348 of perforated conduit 332. Quench gas 346 is introduced through the quench gas feed tubes 344 into the quench gas inlet box 338. Quench gas 346 entering the quench gas inlet box 338 encounters the outer surface of the aerosol outlet conduit 340, forcing the quench gas 346 to flow, in a spiraling, swirling manner, into the annular space 336, where the quench gas 346 flows through the openings 345 through the walls of the perforated conduit 332. Preferably, the gas 346 retains some swirling motion even after passing into the interior space 348. In this way, the particles 112 are quickly cooled with low losses of particles to the walls of the gas quench cooler 330. In this manner, the quench gas 346 enters in a radial direction into the interior space 348 of the perforated conduit 332 around the entire periphery, or circumference, of the perforated conduit 332 and over the entire length of the perforated conduit 332. The cool quench gas 346 mixes with and cools the hot particles 112, which then exit through the aerosol outlet conduit 340 as the cooled particle stream 322. The cooled particle stream 322 can then be sent to the particle collector 114 for particle collection. The temperature of the cooled particle stream 322 is controlled by introducing more or less quench gas. Also, as shown in FIG. 41, the quench gas 346 is fed into the quench cooler 330 in counter flow to flow of the particles. Alternatively, the quench cooler could be designed so that the quench gas 346 is fed into the quench cooler in concurrent flow with the flow of the particles 112. The amount of quench gas 346 fed to the gas quench cooler 330 will depend upon the specific material being made and the specific operating conditions. The quantity of quench gas 346 used, however, must be sufficient to reduce the temperature of the aerosol steam including the particles 112 to the desired temperature. Typically, the particles 112 are cooled to a temperature at least below about 200° C., and often lower. The only limitation on how much the particles 112 are cooled is that the cooled particle stream 322 must be at a temperature that is above the condensation temperature for water as another condensible vapor in the stream. The temperature of the cooled particle stream 322 is often at a temperature of from about 50° C. to about 120° C.

Because of the entry of quench gas 346 into the interior space 348 of the perforated conduit 322 in a radial direction about the entire circumference and length of the perforated conduit 322, a buffer of the cool quench gas 346 is formed about the inner wall of the perforated conduit 332, thereby significantly inhibiting the loss of hot particles 112 due to thermophoretic deposition on the cool wall of the perforated conduit 332. In operation, the quench gas 346 exiting the openings 345 and entering into the interior space 348 should have a radial velocity (velocity inward toward the center of the circular cross-section of the perforated conduit 332) of larger than the thermophoretic velocity of the particles 112 inside the perforated conduit 332 in a direction radially outward toward the perforated wall of the perforated conduit 332.

As seen in FIGS. 41-43, the gas quench cooler 330 includes a flow path for the particles 112 through the gas quench cooler of a substantially constant cross-sectional shape and area. Preferably, the flow path through the gas quench cooler 330 will have the same cross-sectional shape and area as the flow path through the furnace 110 and through the conduit delivering the aerosol 108 from the aerosol generator 106 to the furnace 110. In one embodiment, however, it may be necessary to reduce the cross-sectional area available for flow prior to the particle collector 114. This is the case, for example, when the particle collector includes a cyclone for separating particles in the cooled particle stream 322 from gas in the cooled particle stream 322. This is because of the high inlet velocity requirements into cyclone separators.

Figure 44:
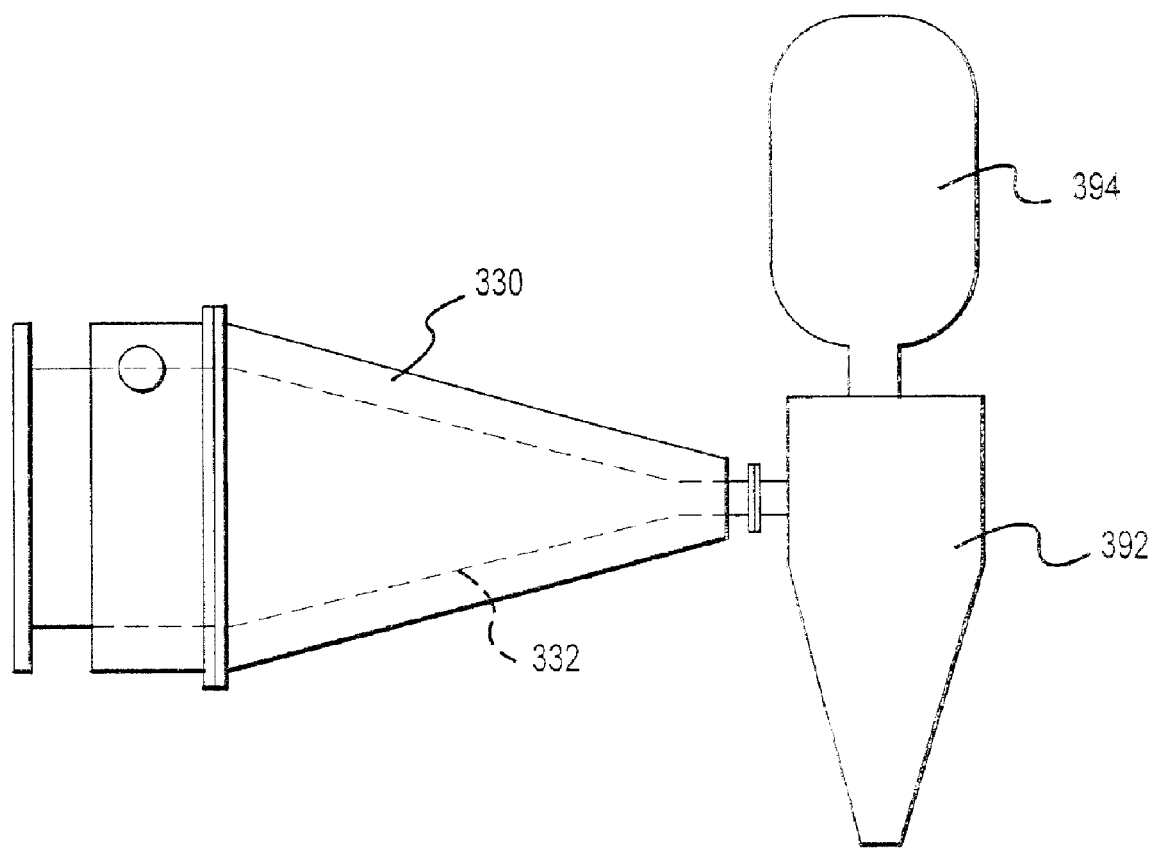
FIG. 44 is a side view showing one embodiment of a gas quench cooler of the present invention connected with a cyclone.

Referring now to FIG. 44, one embodiment of the gas quench cooler 330 is shown in combination with a cyclone separator 392. The perforated conduit 332 has a continuously decreasing cross-sectional area for flow to increase the velocity of flow to the proper value for the feed to cyclone separator 392. Attached to the cyclone separator 392 is a bag filter 394 for final clean-up of overflow from the cyclone separator 392. Separated particles exit with underflow from the cyclone separator 392 and may be collected in any convenient container. The use of cyclone separation is particularly preferred for powder having a weight average size of larger than about 1 µm, although a series of cyclones may sometimes be needed to get the desired degree of separation. Cyclone separation is particularly preferred for powders having a weight average size of larger than about 1.5 µm. Also, cyclone separation is best suited for high density materials. Preferably, when particles are separated using a cyclone, the particles are of a composition with specific gravity of greater than about 5.

Figure 45:
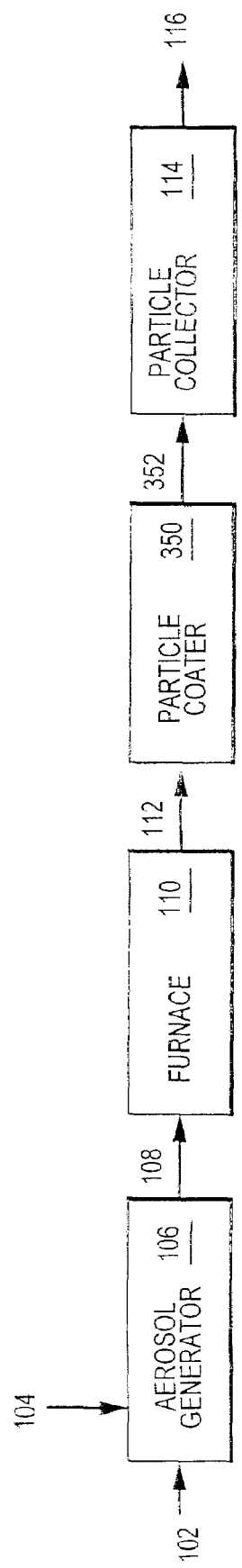
FIG. 45 is a process block diagram of one embodiment of the present invention including a particle coater.

In an additional embodiment, the process of the present invention can also incorporate compositional modification of the particles 112 exiting the furnace. Most commonly, the compositional modification will involve forming on the particles 112 a material phase that is different than that of the particles 112, such as by coating the particles 112 with a coating material. One embodiment of the process of the present invention incorporating particle coating is shown in FIG. 45. As shown in FIG. 45, the particles 112 exiting from the furnace 110 go to a particle coater 350 where a coating is placed over the outer surface of the particles 112 to form coated particles 352, which are then sent to the particle collector 114 for preparation of the particulate product 116. Coating methodologies employed in the particle coater 350 are discussed in more detail below.

With continued reference primarily to FIG. 45, in a preferred embodiment, when the particles 112 are coated according to the process of the present invention, the particles 112 are also manufactured via the aerosol process of the present invention, as previously described. The process of the present invention can, however, be used to coat particles that have been premanufactured by a different process, such as by a liquid precipitation route. When coating particles that have been premanufactured by a different route, such as by liquid precipitation, it is preferred that the particles remain in a dispersed state from the time of manufacture to the time that the particles are introduced in slurry form into the aerosol generator 106 for preparation of the aerosol 108 to form the dry particles 112 in the furnace 110, which particles 112 can then be coated in the particle coater 350. Maintaining particles in a dispersed state from manufacture through coating avoids problems associated with agglomeration and redispersion of particles if particles must be redispersed in the liquid feed 102 for feed to the aerosol generator 106. For example, for particles originally precipitated from a liquid medium, the liquid medium containing the suspended precipitated particles could be used to form the liquid feed 102 to the aerosol generator 106. It should be noted that the particle coater 350 could be an integral extension of the furnace 110 or could be a separate piece of equipment.

Figure 46:
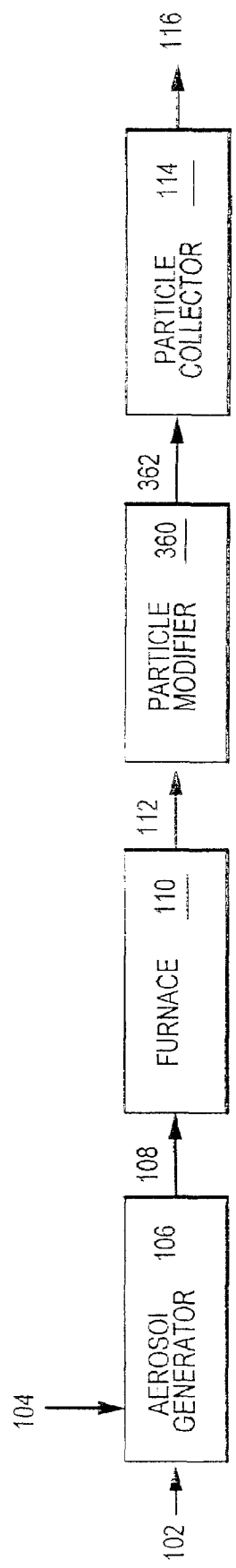
FIG. 46 is a block diagram of one embodiment of the present invention including a particle modifier.
Figure 47A:
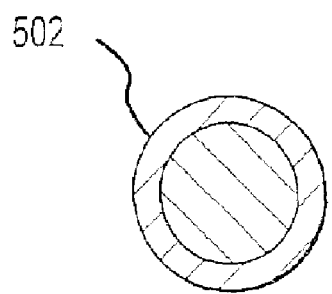
FIG. 47 shows cross sections of various particle morphologies of some composite particles manufacturable according to the present invention.
Figure 47B:
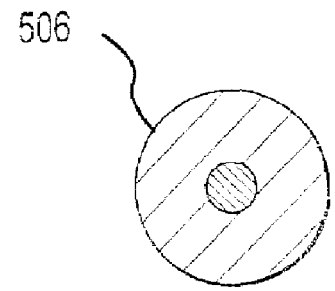
Figure 47C:
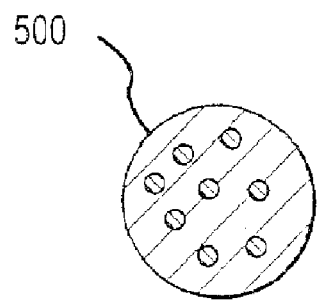
Figure 47D:
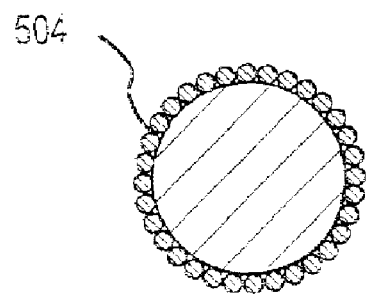
Figure 47E:
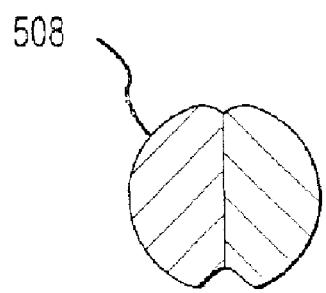
Figure 47F:
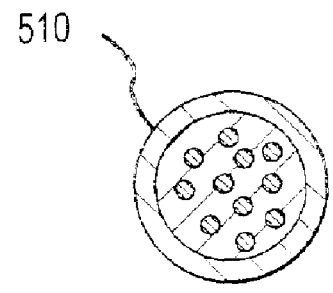

In a further embodiment of the present invention, following preparation of the particles 112 in the furnace 110, the particles 112 may then be structurally modified to impart desired physical properties prior to particle collection. Referring now to FIG. 46, one embodiment of the process of the present invention is shown including such structural particle modification. The particles 112 exiting the furnace 110 go to a particle modifier 360 where the particles are structurally modified to form modified particles 362, which are then sent to the particle collector 114 for preparation of the particulate product 116. The particle modifier 360 is typically a furnace, such as an annealing furnace, which may be integral with the furnace 110 or may be a separate heating device. Regardless, it is important that the particle modifier 360 have temperature control that is independent of the furnace 110, so that the proper conditions for particle modification may be provided separate from conditions required of the furnace 110 to prepare the particles 112. The particle modifier 360, therefore, typically provides a temperature controlled environment and necessary residence time to effect the desired structural modification of the particles 112.

The structural modification that occurs in the particle modifier 360 may be any modification to the crystalline structure or morphology of the particles 112. For example, the particles 112 may be annealed in the particle modifier 360 to densify the particles 112 or to recrystallize the particles 112 into a polycrystalline or single crystalline form. Also, especially in the case of composite particles 112, the particles may be annealed for a sufficient time to permit redistribution within the particles 112 of different material phases. Particularly preferred parameters for such processes are discussed in more detail below.

The initial morphology of composite particles made in the furnace 110, according to the present invention, could take a variety of forms, depending upon the specified materials involved and the specific processing conditions. Examples of some possible composite particle morphologies, manufacturable according to the present invention are shown in FIG. 47. These morphologies could be of the particles as initially produced in the furnace 110 or that result from structural modification in the particle modifier 360. Furthermore, the composite particles could include a mixture of the morphological attributes shown in FIG. 47.

Figure 48:
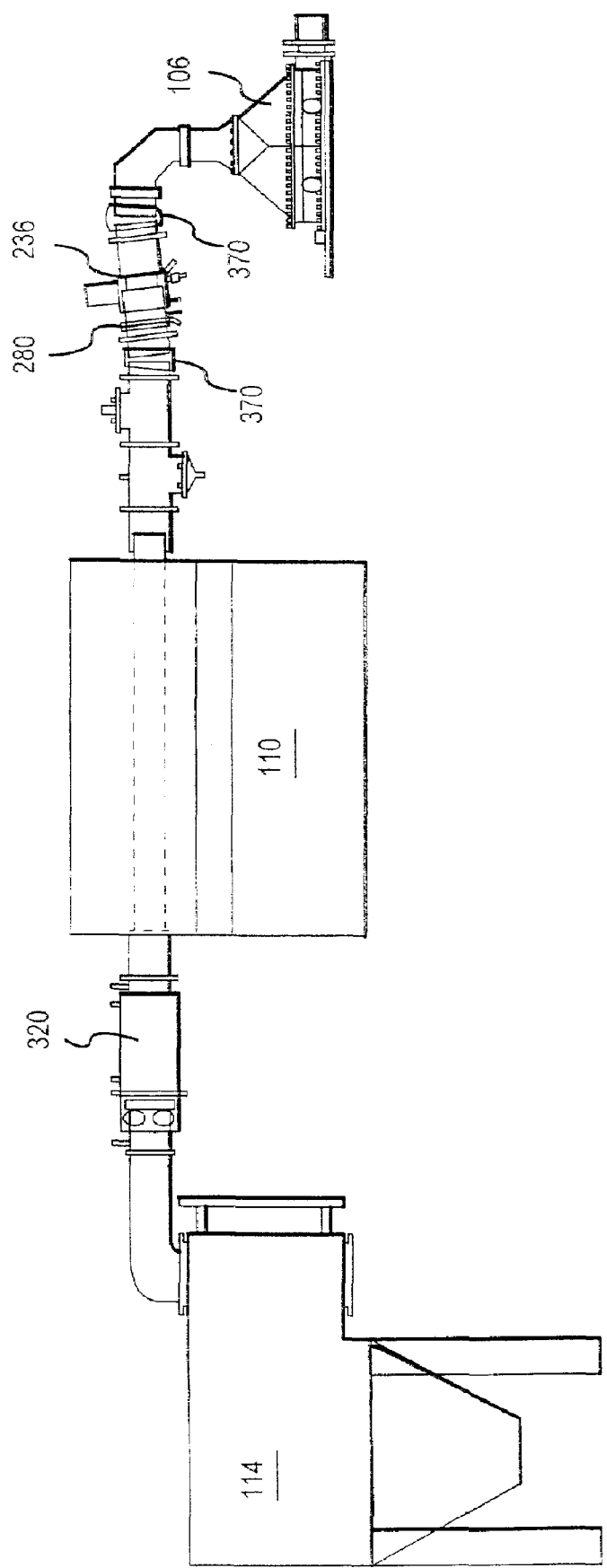
FIG. 48 shows a side view of one embodiment of apparatus of the present invention including an aerosol generator, an aerosol concentrator, a droplet classifier, a furnace, a particle cooler, and a particle collector.

Referring now to FIG. 48, an embodiment of the apparatus of the present invention is shown that includes the aerosol generator 106 (in the form of the 400 transducer array design), the aerosol concentrator 236 (in the form of a virtual impactor), the droplet classifier 280 (in the form of an impactor), the furnace 110, the particle cooler 320 (in the form of a gas quench cooler) and the particle collector 114 (in the form of a bag filter). All process equipment components are connected via appropriate flow conduits that are substantially free of sharp edges that could detrimentally cause liquid accumulations in the apparatus. Also, it should be noted that flex connectors 370 are used upstream and downstream of the aerosol concentrator 236 and the droplet classifier 280. By using the flex connectors 370, it is possible to vary the angle of slant of vertically extending slits in the aerosol concentrator 236 and/or the droplet classifier 280. In this way, a desired slant for the vertically extending slits may be set to optimize the draining characteristics off the vertically extending slits.

Aerosol generation with the process of the present invention has thus far been described with respect to the ultrasonic aerosol generator. Use of the ultrasonic generator is preferred for the process of the present invention because of the extremely high quality and dense aerosol generated. In some instances, however, the aerosol generation for the process of the present invention may have a different design depending upon the specific application. For example, when larger particles are desired, such as those having a weight average size of larger than about 3 μm, a spray nozzle atomizer may be preferred. For smaller-particle applications, however, and particularly for those applications to produce particles smaller than about 3 μm, and preferably smaller than about 2 μm in size, as is generally desired with the particles of the present invention, the ultrasonic generator, as described herein, is particularly preferred. In that regard, the ultrasonic generator of the present invention is particularly preferred for when making particles with a weight average size of from about 0.2 μm to about 3 μm.

Although ultrasonic aerosol generators have been used for medical applications and home humidifiers, use of ultrasonic generators for spray pyrolysis particle manufacture has largely been confined to small-scale, experimental situations. The ultrasonic aerosol generator of the present invention described with reference to FIGS. 5-24, however, is well suited for commercial production of high quality powders with a small average size and a narrow size distribution. In that regard, the aerosol generator produces a high quality aerosol, with heavy droplet loading and at a high rate of production. Such a combination of small droplet size, narrow size distribution, heavy droplet loading, and high production rate provide significant advantages over existing aerosol generators that usually suffer from at least one of inadequately narrow size distribution, undesirably low droplet loading, or unacceptably low production rate.

Through the careful and controlled design of the ultrasonic generator of the present invention, an aerosol may be produced typically having greater than about 70 weight percent (and preferably greater than about 80 weight percent) of droplets in the size range of from about 1 μm to about 10 μm, preferably in a size range of from about 1 μm to about 5 μm and more preferably from about 2 μm to about 4 μm. Also, the ultrasonic generator of the present invention is capable of delivering high output rates of liquid feed in the aerosol. The rate of liquid feed, at the high liquid loadings previously described, is preferably greater than about 25 milliliters per hour per transducer, more preferably greater than about 37.5 milliliters per hour per transducer, even more preferably greater than about 50 milliliters per hour per transducer and most preferably greater than about 100 millimeters per hour per transducer. This high level of performance is desirable for commercial operations and is accomplished with the present invention with a relatively simple design including a single precursor bath over an array of ultrasonic transducers. The ultrasonic generator is made for high aerosol production rates at a high droplet loading, and with a narrow size distribution of droplets. The generator preferably produces an aerosol at a rate of greater than about 0.5 liter per hour of droplets, more preferably greater than about 2 liters per hour of droplets, still more preferably greater than about 5 liters per hour of droplets, even more preferably greater than about 10 liters per hour of droplets and most preferably greater than about 40 liters per hour of droplets. For example, when the aerosol generator has a 400 transducer design, as described with reference to FIGS. 7-24, the aerosol generator is capable of producing a high quality aerosol having high droplet loading as previously described, at a total production rate of preferably greater than about 10 liters per hour of liquid feed, more preferably greater than about 15 liters per hour of liquid feed, even more preferably greater than about 20 liters per hour of liquid feed and most preferably greater than about 40 liters per hour of liquid feed.

Under most operating conditions, when using such an aerosol generator, total particulate product produced is preferably greater than about 0.5 gram per hour per transducer, more preferably greater than about 0.75 gram per hour per transducer, even more preferably greater than about 1.0 gram per hour per transducer and most preferably greater than about 2.0 grams per hour per transducer.

One significant aspect of the process of the present invention for manufacturing particulate materials is the unique flow characteristics encountered in the furnace relative to laboratory scale systems. The maximum Reynolds number attained for flow in the furnace 110 with the present invention is very high, typically in excess of 500, preferably in excess of 1,000 and more preferably in excess of 2,000. In most instances, however, the maximum Reynolds number for flow in the furnace will not exceed 10,000, and preferably will not exceed 5,000. This is significantly different from lab-scale systems where the Reynolds number for flow in a reactor is typically lower than 50 and rarely exceeds 100.

The Reynolds number is a dimensionless quantity characterizing flow of a fluid which, for flow through a circular cross sectional conduit is defined as:

$$Re=(\rho v d)/\mu$$

where: ρ=fluid density;

v=fluid mean velocity;

d=conduit inside diameter; and

μ=fluid viscosity.

It should be noted that the values for density, velocity and viscosity will vary along the length of the furnace 110. The maximum Reynolds number in the furnace 110 is typically attained when the average stream temperature is at a maximum, because the gas velocity is at a very high value due to gas expansion when heated.

One problem with operating under flow conditions at a high Reynolds number is that undesirable volatilization of components is much more likely to occur than in systems having flow characteristics as found in laboratory-scale systems. The volatilization problem occurs with the present invention, because the furnace is typically operated over a substantial section of the heating zone in a constant wall heat flux mode, due to limitations in heat transfer capability. This is significantly different than operation of a furnace at a laboratory scale, which typically involves operation of most of the heating zone of the furnace in a uniform wall temperature mode, because the heating load is sufficiently small that the system is not heat transfer limited.

With the present invention, it is typically preferred to heat the aerosol stream in the heating zone of the furnace as quickly as possible to the desired temperature range for particle manufacture. Because of flow characteristics in the furnace and heat transfer limitations, during rapid heating of the aerosol the wall temperature of the furnace can significantly exceed the maximum average target temperature for the stream. This is a problem because, even though the average stream temperature may be within the range desired, the wall temperature may become so hot that components in the vicinity of the wall are subjected to temperatures high enough to undesirably volatilize the components. This volatilization near the wall of the furnace can cause formation of significant quantities of ultrafine particles that are outside of the size range desired.

Therefore, with the present invention, it is preferred that when the flow characteristics in the furnace are such that the Reynolds number through any part of the furnace exceeds 500, more preferably exceeds 1,000, and most preferably exceeds 2,000, the maximum wall temperature in the furnace should be kept at a temperature that is below the temperature at which a desired component of the final particles would exert a vapor pressure not exceeding about 200 millitorr, more preferably not exceeding about 100 millitorr, and most preferably not exceeding about 50 millitorr. Furthermore, the maximum wall temperature in the furnace should also be kept below a temperature at which an intermediate component, from which a final component is to be at least partially derived, should also have a vapor pressure not exceeding the magnitudes noted for components of the final product.

In addition to maintaining the furnace wall temperature below a level that could create volatilization problems, it is also important that this not be accomplished at the expense of the desired average stream temperature. The maximum average stream temperature must be maintained at a high enough level so that the particles will have a desired high density. The maximum average stream temperature should, however, generally be a temperature at which a component in the final particles, or an intermediate component from which a component in the final particles is at least partially derived, would exert a vapor pressure not exceeding about 100 millitorr, preferably not exceeding about 50 millitorr, and most preferably not exceeding about 25 millitorr.

So long as the maximum wall temperature and the average stream temperature are kept below the point at which detrimental volatilization occurs, it is generally desirable to heat the stream as fast as possible and to remove resulting particles from the furnace immediately after the maximum stream temperature is reached in the furnace. With the present invention, the average residence time in the heating zone of the furnace may typically be maintained at shorter than about 4 seconds, preferably shorter than about 2 seconds, more preferably shorter than about 1 second, still more preferably shorter than about 0.5 second, and most preferably shorter than about 0.2 second.

Another significant issue with respect to operating the process of the present invention, which includes high aerosol flow rates, is loss within the system of materials intended for incorporation into the final particulate product. Material losses in the system can be quite high if the system is not properly operated. If system losses are too high, the process would not be practical for use in the manufacture of particulate products of many materials. This has typically not been a major consideration with laboratory-scale systems.

One significant potential for loss with the process of the present invention is thermophoretic losses that occur when a hot aerosol stream is in the presence of a cooler surface. In that regard, the use of the quench cooler, as previously described, with the process of the present invention provides an efficient way to cool the particles without unreasonably high thermophoretic losses. There is also, however, significant potential for losses occurring near the end of the furnace and between the furnace and the cooling unit.

It has been found that thermophoretic losses in the back end of the furnace can be significantly controlled if the heating zone of the furnace is operated such that the maximum stream temperature is not attained until near the end of the heating zone in the furnace, and at least not until the last third of the heating zone. When the heating zone includes a plurality of heating sections, the maximum average stream temperature should ordinarily not occur until at least the last heating section. Furthermore, the heating zone should typically extend to as close to the exit of the furnace as possible. This is counter to conventional thought, which is to typically maintain the exit portion of the furnace at a low temperature to avoid having to seal the furnace outlet at a high temperature. Such cooling of the exit portion of the furnace, however, significantly promotes thermophoretic losses. Furthermore, the potential for operating problems that could result in thermophoretic losses at the back end of the furnace are reduced with the very short residence times in the furnace for the present invention, as discussed previously.

Typically, it would be desirable to instantaneously cool the aerosol upon exiting the furnace. This is not possible. It is possible, however, to make the residence time between the furnace outlet and the cooling unit as short as possible. Furthermore, it is desirable to insulate the aerosol conduit occurring between the furnace exit and the cooling unit entrance. Even more preferred is to insulate that conduit and, even more preferably, to also heat that conduit so that the wall temperature of that conduit is at least as high as the average stream temperature of the aerosol stream. Furthermore, it is desirable that the cooling unit operate in a manner such that the aerosol is quickly cooled in a manner to prevent thermophoretic losses during cooling. The quench cooler, described previously, is very effective for cooling with low losses. Furthermore, to keep the potential for thermophoretic losses very low, it is preferred that the residence time of the aerosol stream between attaining the maximum stream temperature in the furnace and a point at which the aerosol has been cooled to an average stream temperature below about 200° C. is shorter than about 2 seconds, more preferably shorter than about 1 second, and even more preferably shorter than about 0.5 second and most preferably shorter than about 0.1 second. In most instances, the maximum average stream temperature attained in the furnace will be greater than about 800° C. Furthermore, the total residence time from the beginning of the heating zone in the furnace to a point at which the average stream temperature is at a temperature below about 200° C. should typically be shorter than about 5 seconds, preferably shorter than about 3 seconds, more preferably shorter than about 2 seconds, and most preferably shorter than about 1 second.

Another part of the process with significant potential for thermophoretic losses is after particle cooling until the particles are finally collected. Proper particle collection is very important to reducing losses within the system. The potential for thermophoretic losses is significant following particle cooling because the aerosol stream is still at an elevated temperature to prevent detrimental condensation of water in the aerosol stream. Therefore, cooler surfaces of particle collection equipment can result in significant thermophoretic losses.

To reduce the potential for thermophoretic losses before the particles are finally collected, it is important that the transition between the cooling unit and particle collection be as short as possible. Preferably, the output from the quench cooler is immediately sent to a particle separator, such as a filter unit or a cyclone. In that regard, the total residence time of the aerosol between attaining the maximum average stream temperature in the furnace and the final collection of the particles is preferably shorter than about 2 seconds, more preferably shorter than about 1 second, still more preferably shorter than about 0.5 second and most preferably shorter than about 0.1 second. Furthermore, the residence time between the beginning of the heating zone in the furnace and final collection of the particles is preferably shorter than about 6 seconds, more preferably shorter than about 3 seconds, even more preferably shorter than about 2 seconds, and most preferably shorter than about 1 second. Furthermore, the potential for thermophoretic losses may further be reduced by insulating the conduit section between the cooling unit and the particle collector and, even more preferably, by also insulating around the filter, when a filter is used for particle collection. The potential for losses may be reduced even further by heating of the conduit section between the cooling unit and the particle collection equipment, so that the internal equipment surfaces are at least slightly warmer than the aerosol stream average stream temperature. Furthermore, when a filter is used for particle collection, the filter could be heated. For example, insulation could be wrapped around a filter unit, with electric heating inside of the insulating layer to maintain the walls of the filter unit at a desired elevated temperature higher than the temperature of filter elements in the filter unit, thereby reducing thermophoretic particle losses to walls of the filter unit.

Even with careful operation to reduce thermophoretic losses, some losses will still occur. For example, some particles will inevitably be lost to walls of particle collection equipment, such as the walls of a cyclone or filter housing. One way to reduce these losses, and correspondingly increase product yield, is to periodically wash the interior of the particle collection equipment to remove particles adhering to the sides. In most cases, the wash fluid will be water, unless water would have a detrimental effect on one of the components of the particles. For example, the particle collection equipment could include parallel collection paths. One path could be used for active particle collection while the other is being washed. The wash could include an automatic or manual flush without disconnecting the equipment. Alternatively, the equipment to be washed could be disconnected to permit access to the interior of the equipment for a thorough wash. As an alternative to having parallel collection paths, the process could simply be shut down occasionally to permit disconnection of the equipment for washing. The removed equipment could be replaced with a clean piece of equipment and the process could then be resumed while the disconnected equipment is being washed.

For example, a cyclone or filter unit could periodically be disconnected and particles adhering to interior walls could be removed by a water wash. The particles could then be dried in a low temperature dryer, typically at a temperature of lower than about 50° C.

In one embodiment, wash fluid used to wash particles from the interior walls of particle collection equipment includes a surfactant. Some of the surfactant will adhere to the surface of the particles. This could be advantageous to reduce agglomeration tendency of the particles and to enhance dispersibility of the particles in a thick film paste formulation. The surfactant could be selected for compatibility with the specific paste formulation anticipated.

Another area for potential losses in the system, and for the occurrence of potential operating problems, is between the outlet of the aerosol generator and the inlet of the furnace. Losses here are not due to thermophoresis, but rather to liquid coming out of the aerosol and impinging and collecting on conduit and equipment surfaces. Although this loss is undesirable from a material yield standpoint, the loss may be even more detrimental to other aspects of the process. For example, water collecting on surfaces may release large droplets that can lead to large particles that detrimentally contaminate the particulate product. Furthermore, if accumulated liquid reaches the furnace, the liquid can cause excessive temperature gradients within the furnace tube, which can cause furnace tube failure, especially for ceramic tubes.

One way to reduce the potential for undesirable liquid buildup in the system is to provide adequate drains, as previously described. In that regard, it is preferred that a drain be placed as close as possible to the furnace inlet to prevent liquid accumulations from reaching the furnace. The drain should be placed, however, far enough in advance of the furnace inlet such that the stream temperature is lower than about 80° C. at the drain location.

Another way to reduce the potential for undesirable liquid buildup is for the conduit between the aerosol generator outlet and the furnace inlet be of a substantially constant cross sectional area and configuration. Preferably, the conduit beginning with the aerosol generator outlet, passing through the furnace and continuing to at least the cooling unit inlet is of a substantially constant cross sectional area and geometry.

Another way to reduce the potential for undesirable buildup is to heat at least a portion, and preferably the entire length, of the conduit between the aerosol generator and the inlet to the furnace. For example, the conduit could be wrapped with a heating tape to maintain the inside walls of the conduit at a temperature higher than the temperature of the aerosol. The aerosol would then tend to concentrate toward the center of the conduit due to thermophoresis. Fewer aerosol droplets would, therefore, be likely to impinge on conduit walls or other surfaces making the transition to the furnace.

Another way to reduce the potential for undesirable liquid buildup is to introduce a dry gas into the aerosol between the aerosol generator and the furnace. Referring now to FIG. 49, one embodiment of the process is shown for adding a dry gas 118 to the aerosol 108 before the furnace 110. Addition of the dry gas 118 causes vaporization of at least a part of the moisture in the aerosol 108, and preferably substantially all of the moisture in the aerosol 108, to form a dried aerosol 119, which is then introduced into the furnace 110.

Figure 41:
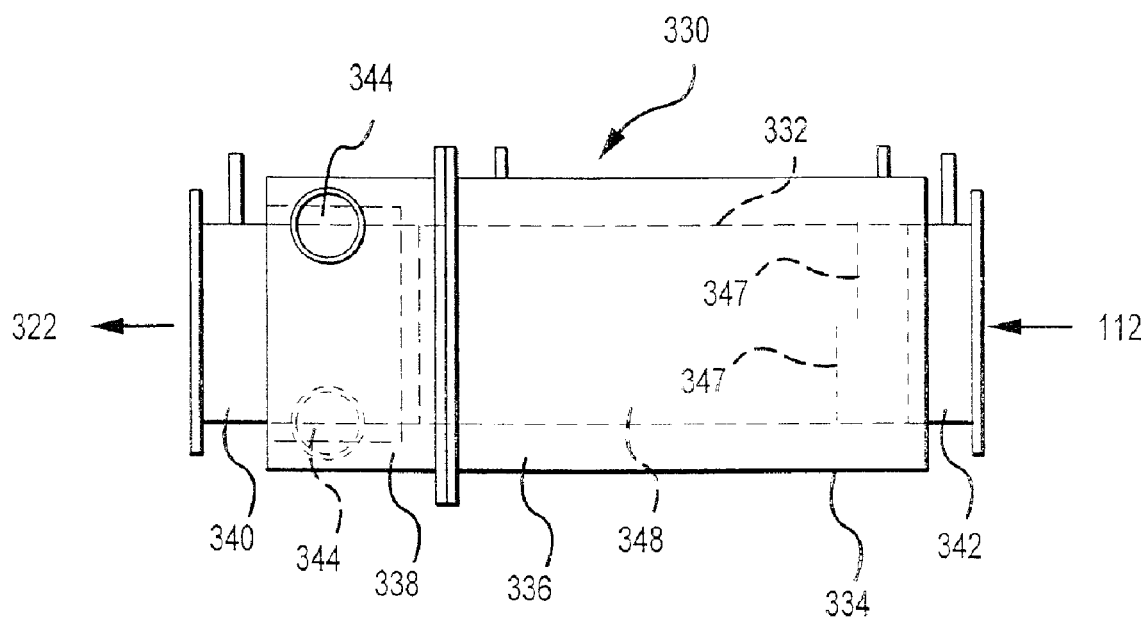
FIG. 41 is a top view of a gas quench cooler of the present invention.
Figures 42, 43:
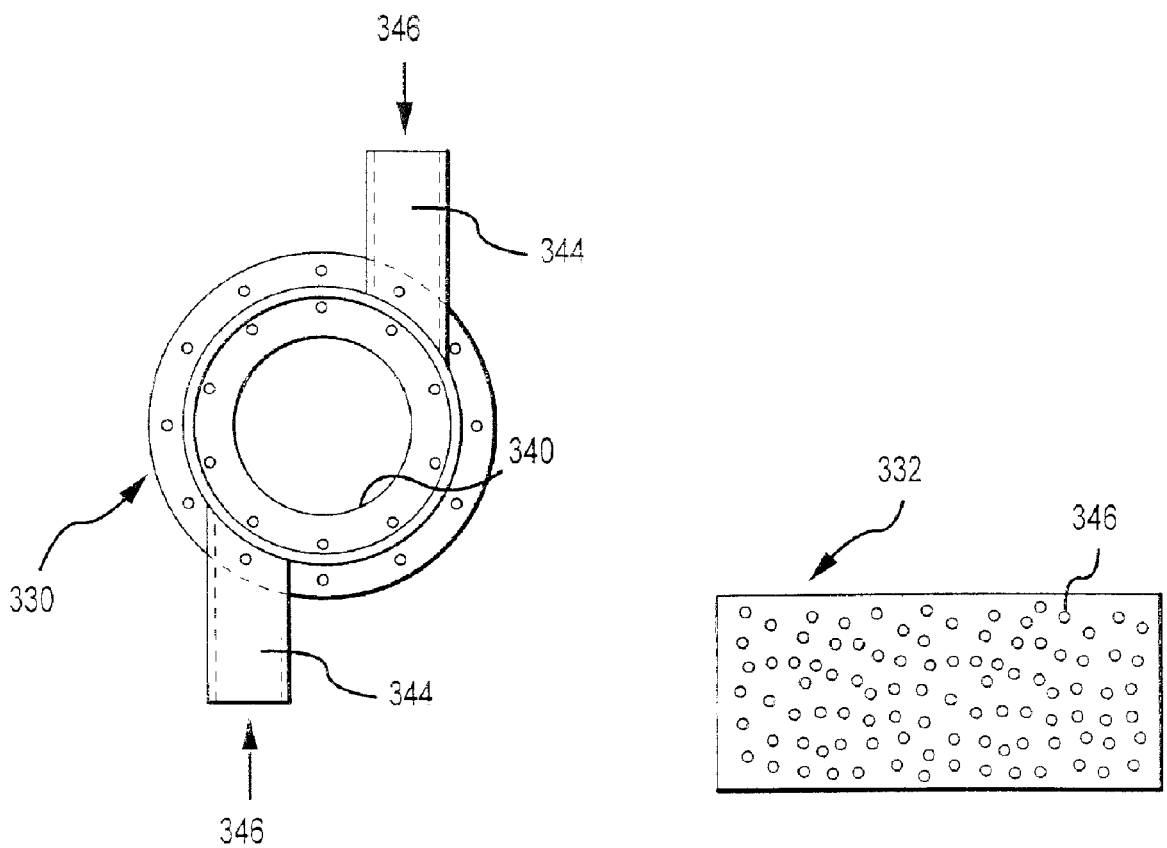
FIG. 42 is an end view of the gas quench cooler shown in FIG. 41.
FIG. 43 is a side view of a perforated conduit of the quench cooler shown in FIG. 41.

The dry gas 118 will most often be dry air, although in some instances it may be desirable to use dry nitrogen gas or some other dry gas. If sufficient a sufficient quantity of the dry gas 118 is used, the droplets of the aerosol 108 are substantially completely dried to beneficially form dried precursor particles in aerosol form for introduction into the furnace 110, where the precursor particles are then pyrolyzed to make a desired particulate product. Also, the use of the dry gas 118 typically will reduce the potential for contact between droplets of the aerosol and the conduit wall, especially in the critical area in the vicinity of the inlet to the furnace 110. In that regard, a preferred method for introducing the dry gas 118 into the aerosol 108 is from a radial direction into the aerosol 108. For example, equipment of substantially the same design as the quench cooler, described previously with reference to FIGS. 41-43, could be used, with the aerosol 108 flowing through the interior flow path of the apparatus and the dry gas 118 being introduced through perforated wall of the perforated conduit. An alternative to using the dry gas 118 to dry the aerosol 108 would be to use a low temperature thermal preheater/dryer prior to the furnace 110 to dry the aerosol 108 prior to introduction into the furnace 110. This alternative is not, however, preferred.

Still another way to reduce the potential for losses due to liquid accumulation is to operate the process with equipment configurations such that the aerosol stream flows in a vertical direction from the aerosol generator to and through the furnace. For smaller-size particles, those smaller than about 1.5 μm, this vertical flow should, preferably, be vertically upward. For larger-size particles, such as those larger than about 1.5 μm, the vertical flow is preferably vertically downward.

Furthermore, with the process of the present invention, the potential for system losses is significantly reduced because the total system retention time from the outlet of the generator until collection of the particles is typically shorter than about 10 seconds, preferably shorter than about 7 seconds, more preferably shorter than about 5 seconds and most preferably shorter than about 3 seconds.

For the production of nickel particles according to the present invention, the liquid feed 102 includes at least one nickel precursor for preparation of the nickel particles 112. The nickel precursor may be a substance in either a liquid or solid phase of the liquid feed 102. Typically, the nickel precursor will be a nickel-containing compound, such as a salt, dissolved in a liquid solvent of the liquid feed 102. The nickel precursor may undergo one or more chemical reactions in the furnace 110 to assist in production of the nickel particles 112. Alternatively, the nickel precursor may contribute to formation of the nickel particles 112 without undergoing chemical reaction. This could be the case, for example, when the liquid feed 102 includes suspended particles as a precursor material.

The liquid feed 102 thus includes the chemical components that will form the nickel particles 112. For example, the liquid feed 102 can comprise a solution containing nitrates, chlorides, sulfates, hydroxides, or oxalates of nickel. A preferred precursor to nickel according to the present invention is nickel nitrate, $Ni(NO_3)_2$. Nickel nitrate is highly soluble in water and the solutions maintain a low viscosity, even at high concentrations. The solution preferably has a nickel precursor concentration that is unsaturated to avoid precipitate formation in the liquid. The solution preferably includes a soluble precursor to yield a concentration of from about 1 to about 50 weight percent nickel, more preferably from about 2.5 to about 15 weight percent nickel, such as from about 2.5 to 7.5 weight percent nickel, particularly for the formation of particles having an average size of from about 0.3 μm to 0.8 μm. The final particle size of the nickel particles 112 is influenced by the precursor concentration. Generally, lower precursor concentrations in the liquid feed will produce particles having a smaller average particle size.

Preferably, the solvent is aqueous-based for ease of operation, although other solvents, such as toluene, may be desirable. The use of organic solvents can lead to carbon in the metal particles. The pH of the aqueous-based solutions can be adjusted to alter the solubility characteristics of the precursor in the solution.

The precursor solution can also include other additives. For example, a reducing agent to facilitate the reaction of the precursor to a metal particle can advantageously be included in the precursor solution. The use of a reducing agent in the solution may eliminate or reduce the need for a reducing gas, such as hydrogen, in the carrier gas. A preferred reducing agent according to the present invention is hydrazine ($H_2NNH_2$), which can be included in the precursor solution in an amount of, for example, from about 1 to about 15 weight percent. Other reducing agents, such as borohydrides ($MBR_{4-x}Hx$, where x=1 to 4, R is an alkyl or aryl, such as methyl or ethyl, and M is Li, Na, K, or $NH_4$) may also be useful.

In addition to the foregoing, the liquid feed 102 may also include other additives that contribute to the formation of the particles. For example, a fluxing agent can be added to this solution to increase the crystallinity and/or density of the particles. For example, the addition of urea to metal salt solutions, such as nickel nitrate, can increase the density of particles produced from the solution. In one embodiment, up to about 1 mole equivalent urea is added to the precursor solution. Further, if the particles are to be coated nickel particles, as is discussed in more detail below, soluble precursors to both the nickel particle and the coating can be used in the precursor solution wherein the coating precursor is an involatile or volatile species.

Thus, the liquid feed 102 may include multiple precursor materials, which may be present together in a single phase or separately in multiple phases. The liquid feed 102 may include multiple precursors in solution in a single liquid vehicle. For example, the liquid feed can comprise a solution of two different metal precursors adapted to form a particle 112 that is a metal alloy or intermetallic compound. Alternatively, one precursor material could be in a solid particulate phase and a second precursor material could be in a liquid phase. Also, one precursor material could be in one liquid phase and a second precursor material could be in a second liquid phase, such as when the liquid feed 102 comprises an emulsion. When the liquid feed 102 includes multiple precursors, more than one of the precursors may contain nickel, or one or more of the precursors may contain a component other than nickel that is contributed to the particles 112. Different components contributed by different precursors may be present in the particles together in a single material phase, or the different components may be present in different material phases when the nickel particles 112 are composites of multiple phases.

To form metal composite particles, the liquid feed can include colloids, for example boehmite particles or silica particles. Particles as large as about 0.3 μm can be suspended in the aerosol droplets using an ultrasonic nebulizer. The suspended colloids can also coat the outer surface of the metal particles (forming a particulate coating), depending on the process conditions and the selected materials. The particles can also be formed such that a metal phase uniformly coats a core of a non-metallic phase.

A carrier gas 104 under controlled pressure is introduced to the aerosol generator to move the droplets away from the generator. The carrier gas 104 may comprise any gaseous medium in which droplets produced from the liquid feed 102 may be dispersed in aerosol form. Also, the carrier gas 104 may be inert, in that the carrier gas 104 does not participate in the formation of the nickel particles 112. Alternatively, the carrier gas 104 may have one or more active component(s), such as hydrogen gas, that contribute to formation of the nickel particles 112. In that regard, the carrier gas may include one or more reactive components that react in the furnace 110 to contribute to formation of the nickel particles 112. Examples of preferred carrier gases include reactive carrier gases such as air or oxygen and inert carrier gases such as argon or nitrogen. Reducing gas compositions, such as those including hydrogen ($H_2$), can also be used to produce nickel metal particles.

According to the present invention for the production of nickel particles, particularly nickel metal particles, it is preferred to use a carrier gas including hydrogen as the forming gas. Preferably, the hydrogen content of the carrier gas is at least about 2 volume percent, more preferably is at least about 2.5 volume percent and even more preferably at least about 3 volume percent. The hydrogen gas can be mixed with, for example, nitrogen gas. Reduced levels of hydrogen gas can be used if the precursor solution includes a reducing agent, as is discussed above.

To form substantially uniform coatings on the surface of the nickel metal particles such as those discussed above, a reactive gas composition can be contacted with the nickel metal particle at an elevated temperature after the particle has been formed. For example, the reactive gas can be introduced into the heated reaction chamber at the distal end so that the desired compound deposits on the surface of the particle.

More specifically, the droplets can enter the heated reaction zone at a first end such that the precursor droplets move through the heated zone and form the nickel particles. At the opposite end of the heated reaction zone, a reactive gas composition can be introduced such that the reactive gas composition contacts the nickel particles at an elevated temperature. Alternatively, the reactive gas composition can be contacted with the heated particles in a separate heating zone located downstream from the heated reaction zone.

For example, precursors to metal oxide coatings can be selected from volatile metal acetates, chlorides, alkoxides or halides. Such precursors are known to react at high temperatures to form the corresponding metal oxides and eliminate supporting ligands or ions. For example, $SiCl_4$ can be used as a precursor to $SiO_2$ coatings when water vapor is present:

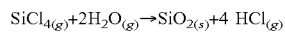
$$SiCl_{4(g)} + 2H_2O_{(g)} \rightarrow SiO_{2(s)} + 4\ HCl_{(g)}$$

$SiCl_4$ also is highly volatile and is a liquid at room temperature, which makes transport into the reactor more controllable.

Metal alkoxides can be used to produce metal oxide films by hydrolysis. The water molecules react with the alkoxide M-O bond resulting in clean elimination of the corresponding alcohol with the formation of M-O-M bonds:

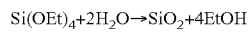
$$Si(OEt)_4 + 2H_2O \rightarrow SiO_2 + 4EtOH$$

Most metal alkoxides have a reasonably high vapor pressure and are therefore well suited as coating precursors.

Metal acetates are also useful as coating precursors since they readily decompose upon thermal activation by acetic anhydride elimination:

$$Mg(O_2CCH_3)_2 \rightarrow MgO + CH_3C(O)OC(O)CH_3$$

Metal acetates are advantageous as coating precursors since they are water stable and are reasonably inexpensive.

Coatings can be generated on the particle surface by a number of different mechanisms. One or more precursors can vaporize and fuse to the hot particle surface and thermally react resulting in the formation of a thin-film coating by chemical vapor deposition (CVD). Preferred coatings deposited by CVD include metal oxides and elemental metals. Further, the coating can be formed by physical vapor deposition (PVD) wherein a coating material physically deposits on the surface of the particles. Preferred coatings deposited by PVD include organic materials and elemental metals. Alternatively, the gaseous precursor can react in the gas phase forming small particles, for example less than about 5 nanometers in size, which then diffuse to the larger particle surface and sinter onto the surface, thus forming a coating. This method is referred to as gas-to-particle conversion (GPC). Whether such coating reactions occur by CVD, PVD or GPC is dependent on the reactor conditions, such as temperature, precursor partial pressure, water partial pressure and the concentration of particles in the gas stream. Another possible surface coating method is surface conversion of the surface of the particles by reaction with a vapor phase reactant to convert the surface of the particles to a different material than that originally contained in the particles.

In addition, a volatile coating material such as PbO, $MoO_3$ or $V_2O_5$ can be introduced into the reactor such that the coating deposits on the particles by condensation. Highly volatile metals, such as silver, can also be deposited by condensation. Further, the particles can be coated using other techniques. For example, a soluble precursor to both the nickel powder and the coating can be used in the precursor solution wherein the coating precursor is involatile, (e.g. $Al(NO_3)_3$ or volatile (e.g. $Sn(OAc)_4$ where Ac is acetate). In another embodiment, a colloidal precursor and a soluble nickel precursor can be used to form a particulate colloidal coating on the nickel particle. It will be appreciated that multiple coatings can be deposited on the surface of the metal particles if such multiple coatings are desirable.

The coatings are preferably as thin as possible while maintaining conformity about particle such that the metal is not substantially exposed. For example, the coatings can have an average thickness of not greater than about 200 nanometers, preferably not greater than about 100 nanometers, and more preferably not greater than about 50 nanometers. For most applications, the coating should have an average thickness of at least about 5 nanometers.

The present invention is directed to nickel powder batches including nickel particles wherein the nickel particles constituting the powder batch preferably have a spherical morphology, a small average particle size and a narrow particle size distribution. The powders of the present invention offer numerous advantages over conventional nickel powders and are particularly useful in a number of applications including the fabrication of microelectronic devices, where the powders are dispersed in thick film pastes used to form electrically conductive layers or paths in devices such as multilayer capacitors and multi-chip modules. Similar pastes are also useful in other applications, such as for the formation of electrodes in flat panel display devices.

The nickel powder batches according to the present invention include a commercially useful quantity of nickel particles. The nickel particles include nickel in the form of a metal or a nickel compound such as nickel boride or nickel oxide. According to one embodiment, the nickel particles include a metal phase having at least about 50 weight percent nickel metal, and depending upon the application, the particles preferably include at least about 80 weight percent nickel metal and even more preferably at least about 90 weight percent nickel metal.

For many applications, the nickel particles can be metal alloy particles, such as nickel metal alloy particles wherein nickel metal is alloyed with one or more alloying elements including, but not limited to, palladium (Pd), silver (Ag), gold (Au), copper (Cu), tungsten (W), molybdenum (Mo), platinum (Pt), iron (Fe), tin (Sn) and cobalt (Co). In one preferred embodiment, the alloying element is palladium. As used herein, the term metal alloy particles include intermetallic compounds that form between nickel and other metals, such as those that commonly form between nickel and aluminum.

The metal alloy particles according to this embodiment of the invention are preferably homogenous, well-mixed on the atomic level, and have substantially no phase segregation of the nickel metal and the other metal element. However, it may be desirable for some applications that the particles consist of distinct metal phases that are segregated (see FIG. 47e). Depending upon the intended application, the other metal element can preferably be included in an amount of from about 0.1 to about 40 weight percent, such as from about 1 to about 15 weight percent, based on the total amount of metal.

Such additional metal elements can modify the properties of the metal particles in several ways, as compared to pure nickel metal particles. These modifications can include an increased or decreased sintering temperature, which is the temperature at which individual particles begin to coalesce due to softening and diffusion. The melting temperature can also be increased or decreased. The vaporization of metal at the synthesis temperature can be inhibited, which reduces the formation of ultrafine particles from the vapors. Ultrafine particles can be detrimental to the dispersion properties of the powder. Further, the alloying element can improve the rheological properties of the particles for better dispersion of the particles in organic and water-based pastes. The oxidation resistance can be improved such as by increasing the temperature at which oxidation begins or by reducing the total amount of metal that will oxidize at a given temperature and partial pressure of oxygen. Adhesion of the metal with ceramics can also be improved by alloying the particles. The alloyed particles can also be useful as a catalyst material.

The metal alloy particles can be formed in accordance with the methodology described above. Typically, the particle will be formed from a liquid solution that includes both a nickel metal precursor and a precursor for the additional element. The concentration level can easily be adjusted by adjusting the relative ratios of nickel metal precursor and other metal precursor(s) in the liquid solution. For example, nickel/palladium alloy particles can be formed from a solution of nickel nitrate and palladium nitrate.

The nickel powder batches produced according to the present invention include particles having a small average particle size. Although the preferred average size of the particles will vary according to the particular application of the powder, the weight average particle size of the particles is preferably at least about 0.1 µm and is preferably not greater than about 5 µm. For most applications, the weight average particle size is more preferably not greater than about 3 µm and even more preferably is not greater than about 2 µm, such as from about 0.3 µm to about 1.5 µm.

A particularly preferred weight average particle size for the nickel powder batches according to the present invention is from about 0.3 µm to about 0.8 µm. Nickel powders having such an average particle size are particularly useful in microelectronic applications wherein conductive metal powders are dispersed in a thick film paste which is applied to a substrate and heated to form a nickel metal film or line. Utilizing nickel metal powder having such a small average particle size enables the formation of conductive traces having a narrower width and films having a decreased thickness. Such powder batches are particularly useful for the internal electrodes of multilayer ceramic capacitors, which require a thin and uniform, defect-free conductive film.

According to a preferred embodiment of the present invention, the powder batch of nickel particles has a narrow particle size distribution, such that the majority of particles are about the same size. Preferably, at least about 90 weight percent and more preferably at least about 95 weight percent of the particles have a size that is not larger than twice the weight average particle size. For example, when the average particle size is about 1 µm, it is preferred that at least about 90 weight percent of the particles are not larger than 2 µm and it is more preferred that at least about 95 weight percent of the particles are not larger than 2 µm. Further, it is preferred that at least about 90 weight percent and more preferably at least about 95 weight percent of the particles have a size that is not larger than about 1.5 times the weight average particle size. For example, when the average particle size is about 1 µm, it is preferred that at least about 90 weight percent of the particles are not larger than 1.5 µm and it is more preferred that at least about 95 weight percent of the particles are not larger than 1.5 µm.

It is also possible according to the present invention to provide a nickel powder batch having a bimodal particle size distribution. That is, the powder batch can include nickel particles having two distinct and different average particle sizes, each with a narrow size distribution as discussed above. Such bimodal distributions can enhance the packing efficiency of the powder in a variety of applications.

The nickel particles of the present invention can be substantially single crystal particles or may be comprised of a number of crystallites. Nickel metal particles having a high crystallinity, i.e. large average crystallite size, enhance the electrical properties of devices formed from the powder. Highly crystalline particles will also increase the oxidation resistance of the powder by reducing the ratio of crystallite surface area to total particle volume.

According to one embodiment of the present invention, it is preferred that the average crystallite size is close to the average particle size such that the particles are mostly single crystals or are composed of only a few large crystals. Accordingly, the average crystallite size is preferably at least about 40 nanometers, more preferably is at least about 60 nanometers, even more preferably is at least about 80 nanometers, and most preferably is at least about 100 nanometers. In one embodiment, the average crystallite size is at least about 200 nanometers. As the average crystallite size relates to the average particle size disclosed above, the average crystallite size is preferably at least about 20 percent of the average particle size, more preferably is at least about 30 percent of the average particle size and even more preferably is at least about 40 percent of the average particle size. Nickel metal particles having such high crystallinity advantageously have enhanced electrical properties, including higher conductivity, and also improved oxidation resistance as compared to nickel metal powders having lower crystallinity, i.e., a smaller average crystallite size. As the average crystallite size approaches the average particle size, the nickel particles remain substantially spherical, but can appear faceted on the outer surface of the particle.

The nickel particles produced according to the present invention also have a high degree of purity and it is preferred that the particles include not greater than about 0.1 atomic percent impurities and more preferably not greater than about 0.01 atomic percent impurities. Since no milling of the particles is required to achieve the small average particle sizes disclosed herein, there are substantially no undesired impurities such as alumina, zirconia or high carbon steel in the powder batch.

The nickel particles according to the present invention are also preferably dense (e.g. not hollow or porous), as measured by helium pycnometry. Preferably, the nickel particles according to the present invention have a particle density of at least about 80% of the theoretical density (at least about 7.1 g/cm$^3$ for pure nickel), more preferably at least about 90% of the theoretical density (at least about 8.0 g/cm$^3$ for pure nickel) and even more preferably at least about 95% of the theoretical density (at least about 8.4 g/cm³ for pure nickel). In one embodiment, the particle density is at least about 99% of the theoretical density. The theoretical density can be easily calculated for multi-phase compositions, including alloys and composites, based upon the relative percentages of each component. High density particles provide many advantages over porous particles, including reduced shrinkage during sintering.

The nickel particles according to a preferred embodiment of the present invention are also substantially spherical in shape. That is, the particles are not jagged or irregular in shape. Spherical particles are particularly advantageous because they disperse more readily in a paste or slurry and impart advantageous flow characteristics to paste compositions. Although the particles are substantially spherical, they can become faceted as the crystallite size increases and approaches the average particle size.

The nickel powder according to the present invention also has a low surface area. As is discussed above, the particles are substantially spherical, which reduces the total surface area for a given mass of powder. Further, the elimination of larger particles from the powder batch eliminates the porosity that is associated with open pores on the surface of such larger particles. Due to the substantial elimination of the larger particles with open porosity and the spherical shape of the particles, the powder advantageously has a lower surface area. Surface area is typically measured using the BET nitrogen adsorption method which is indicative of the gas-accessible surface area of the powder, including the surface area of accessible surface pores. For a given particle size distribution, a lower value of a surface area per unit mass of powder generally indicates solid and non-porous particles. According to one embodiment of the present invention, the nickel powder preferably has a specific surface area of not greater than about 3 m²/g, more preferably not greater than about 2 m²/g. Decreased surface area reduces the susceptibility of the powders to adverse surface reactions, such as oxidation of the metal. This characteristic can advantageously extend the shelf-life of such powders.

The surfaces of the nickel particles according to the present invention are typically smooth and clean and preferably have a minimal deposition of ultrafine particles (e.g., less than about 40 nanometers) on the particle surface. It is believed that such ultrafine particles can inhibit the ability of the particles to adequately disperse in a thick film paste composition. Further, the surface of the nickel particles is substantially free of surfactants or other organic contaminants. Metal particles made by liquid precipitation routes are often contaminated with residual surfactants from the manufacturing process. Such surfactants can hinder the dispersibility of the metal powders in a paste.

The powder batches of nickel metal particles according to the present invention are preferably also substantially unagglomerated, that is, they include substantially no hard agglomerates of particles. Hard agglomerates are physically coalesced lumps of two or more particles that behave as one larger, irregularly shaped particle. Agglomerates are disadvantageous in most applications. For example, when agglomerated metal powders are used in a thick film paste, the sintered film that is formed can contain lumps that lead to a defective product. Accordingly, it is preferred that no more than about 0.5 weight percent of the nickel particles in the powder batch of the present invention are in the form of hard agglomerates and more preferably no more than about 0.1 weight percent of the particles are in the form of hard agglomerates.

According to one embodiment of the present invention, the nickel particles are metal composite particles, wherein the individual particles include a metal phase and at least one non-metallic phase associated with the metal phase, such as one that is dispersed throughout the metal phase. For example, the metal composite particles can include a metal oxide dispersed throughout a nickel metal phase. Preferred simple metal oxides can include, but are not limited to, NiO, $SiO_2$, $Cu_2O$, CuO, $B_2O_3$, $TiO_2$, $ZrO_2$, $Bi_2O_3$, CaO, $V_2O_5$, and $Al_2O_3$. Also, the metal composite particles can include a metal phase and a non-metallic phase comprising carbon. Such a composite can be formed by dispersing a particulate carbon precursor in a nickel precursor and forming the particles as described hereinabove.

Metal oxides can advantageously modify the sintering characteristics or other properties of the nickel metal particles, such as by increasing the sintering temperature of the powder, modifying the thermal expansion characteristics of the powder or improving the adhesion of the metal to a substrate. Further, oxides can be used as an inexpensive filler material, reducing the volume of the nickel metal that is used without substantially reducing conductivity. Metal oxides can also increase the oxidation resistance of the metal particles.

Depending upon the application of the nickel metal powder batch, the composite particles preferably include at least about 0.1 weight percent of the non-metallic phase and more preferably from about 0.2 to about 50 weight percent of the non-metallic phase, and even more preferably from about 0.2 to about 35 weight percent of the non-metallic phase. For some applications, such as in MLCC capacitors, it is preferred to incorporate from about 0.2 to about 5 weight percent of the non-metallic phase, such as from about 0.5 to about 2 weight percent. More than one non-metallic second phase can also be included in the particles. The morphology and distribution of the metal and non-metallic phases can vary, but it is preferred that the non-metallic phase is homogeneously dispersed throughout the metal phase.

For some applications, such as MLCC's discussed in more detail hereinbelow, it is advantageous to provide metal composite particles including a metal phase and a non-metallic phase of a ceramic dielectric compound, preferably from about 0.5 to about 2 weight percent of a dielectric compound. Such a composite particle is particularly useful for the internal electrodes of an MLCC. Such metal composite powders advantageously provide improved adhesion between the ceramic dielectric layers and the metal layers as well as improved thermal expansion characteristics during sintering of the MLCC. That is, the thermal expansion characteristics of the powder will closely match that of the dielectric. This property will advantageously result in fewer rejections of the devices due to delamination, cracks or camber.

Preferred dielectric compounds for incorporation into the nickel metal particles include titanates, zirconates, silicates, aluminates, niobates and tantalates. Particularly preferred dielectric compounds are titanates such as barium titanate, neodymium titanate, magnesium titanate, calcium titanate, lead titanate and strontium titanate. Also particularly preferred are zirconates such as magnesium zirconate or calcium zirconate and niobate compounds, commonly referred to as relaxor dielectrics. Those skilled in the art will recognize that many dielectric compounds are a combination of the foregoing and/or are non-integral stoichiometry compounds, such as $BaTi_{0.903}Zr_{0.097}O_3$.

When the particles are to be used to form a conductive film on a ceramic, it is often preferred to include a ceramic compound dispersed in the metal composite particles that is the same or has similar thermal expansion characteristics as the ceramic used to form the ceramic substrate. For example, a particularly preferred embodiment for the fabrication of MLCC's utilizes barium titanate as the ceramic dielectric layer and metal composite particles including a metal and barium titanate.

According to another embodiment of the present invention, the nickel particles are coated particles that include a particulate coating (FIG. 47d) or non-particulate (film) coating (FIG. 47a) that substantially encapsulates an outer surface of the particles. The coating can be a metal or can be a non-metallic compound, such as a boride. Preferably, the coating is very thin and uniform and has an average thickness of not greater than about 200 nanometers, more preferably not greater than about 100 nanometers, and even more preferably not greater than about 50 nanometers. While the coating is thin, the coating should substantially encapsulate the entire particle such that substantially none of the original particle surface is exposed. Accordingly, the coating preferably has an average thickness of at least about 5 nanometers.

As is discussed above, the coating can be a metal, a metal oxide or other inorganic compound, or can be an organic compound. For example, nickel particles can be coated with a metal, such as a more costly noble metal, to obtain the surface properties of the noble metal at a reduced cost. Thus, the nickel particles can be coated with platinum or gold to obtain an oxidation resistant powder at a reduced cost. According to one preferred embodiment, the nickel particles are coated with silver or a silver alloy. According to another embodiment, the nickel particles are coated with a copper-based metal such as copper or a copper alloy. Such copper-coated particles are particularly useful when the nickel metal particles are used with a neodymium-based ceramic, such as neodymium titanate, in an MLCC. The copper metal advantageously inhibits leaching of the neodymium into the nickel metal.

Alternatively, a metal oxide coating can be selected, such as a metal oxide selected from the group consisting of $ZrO_2$, NiO, $SiO_2$, $B_2O_5$, $TiO_2$, $Cu_2O$, CuO, $Bi_2O_3$, $V_2O_5$ and $Al_2O_3$. Among these, $SiO_2$ and $Al_2O_3$ are often preferred. Metal oxide coatings can advantageously inhibit the sintering of nickel metal particles and can also improve the dispersibility of the particles in a paste. The coatings can also increase the oxidation resistance of metal particles and increase the corrosion resistance in a variety of conditions. The nickel particles can include more than one coating, if multiple coatings are desirable. In addition to the foregoing, the coating can comprise a ceramic dielectric compound, such as those described above with reference to metal composite particles.

The nickel particles of the present invention can also be coated with an organic compound, for example to provide improved dispersion which will result in smoother prints having lower lump counts when applied as a paste. The organic coating can advantageously be placed onto a previously formed metal oxide coating encapsulating the metal particle, as is discussed above. The organic compound for coating the particles can be selected from a variety of organic compounds such as PMMA (polymethylmethacrylate), polystyrene or the like. The organic coating can also comprise a surfactant for improving the dispersibility of the powders in a flowable medium, such as a paste. The organic coating preferably has an average thickness of not greater than about 100 nanometers, more preferably not greater than about 50 nanometers and is substantially dense and continuous about the particle. The organic coatings can advantageously reduce corrosion of the particles and also can improve the dispersion characteristics of the particles in a paste or slurry.

The coating can also be comprised of one or more monolayer coatings, such as from about 1 to 3 monolayer coating. A monolayer coating is formed by the reaction of an organic or an inorganic molecule with the surface of the particles to form a coating layer that is essentially one molecular layer thick. In particular, the formation of a monolayer coating by reaction of the surface of the particle with a functionalized organo silane such as halo- or amino-silanes, for example hexamethyldisilazane or trimethylsilylchloride, can be used to modify the hydrophobicity and hydrophilicity of the powders. Such coatings allow for greater control over the dispersion characteristics of the powder in a variety of thick film paste compositions.

The monolayer coatings may also be applied to nickel particles that have already been coated with an organic or inorganic coating thus providing better control over the corrosion characteristics (through the use of thicker coating) as well as dispersibility (through the monolayer coating) of the particles.

The nickel powder batches according to the present invention, including powder batches comprising composite particles and coated particles, are useful in a number of applications and can be used to fabricate a number of novel devices and intermediate products. Such devices and intermediate products are included within the scope of the present invention.

One preferred class of intermediate products according to the present invention are thick film paste compositions, also referred to as thick film inks. These pastes are particularly useful in the microelectronics industry for the application of conductors, resistors and dielectrics onto a substrate and in the flat panel display industry for applying conductors, dielectrics and phosphors onto a panel.

In the thick film process, a viscous paste that includes a functional particulate phase (metals, dielectrics, metal oxides, etc.) is screen printed onto a substrate. A porous screen fabricated from stainless steel, polyester, nylon or similar inert material is stretched and attached to a rigid frame. A predetermined pattern is formed on the screen corresponding to the pattern to be printed. For example, a UV sensitive emulsion can be applied to the screen and exposed through a positive or negative image of the design pattern. The screen is then developed to remove portions of the emulsion in the pattern regions.

The screen is then affixed to a printing device and the thick film paste is deposited on top of the screen. The substrate to be printed is then positioned beneath the screen and the paste is forced through the screen and onto the substrate by a squeegee that traverses the screen. Thus, a pattern of traces and/or pads of the paste material is transferred to the substrate. The substrate with the paste applied in a predetermined pattern is then subjected to a drying and sintering treatment to solidify and adhere the functional phase to the substrate.

Thick film pastes have a complex chemistry and generally include a functional phase, a binder phase and an organic vehicle phase. The functional phase includes the nickel powders of the present invention which can provide conductivity for electrical transmission and are useful in components such as capacitors. The particle size, size distribution, surface chemistry and particle shape of the nickel particles all influence the rheology of the paste, as well as the characteristics of the sintered film.

The binder phase is typically a mixture of inorganic binders such as metal oxide or glass frit powders. For example, PbO based glasses are commonly used as binders. The function of the binder phase is to control the sintering of the film and assist the adhesion of the functional phase to the substrate and/or assist in the sintering of the functional phase. Reactive compounds can also be included in the paste to promote adherence of the functional phase to the substrate. For example, 0.1 to 1 percent CuO or CdO can be included in a metal paste applied to an alumina substrate. The CuO or CdO reacts to form an aluminate which provides improved adhesion of the metal film.

Thick film pastes also include an organic vehicle phase that is a mixture of solvents, polymers, resins or other organics whose primary function is to provide the appropriate rheology (flow properties) to the paste. The liquid solvent assists in mixing of the components into a homogenous paste and substantially evaporates upon application of the paste to the substrate. Usually the solvent is a volatile liquid such as methanol, ethanol, terpineol, butyl carbitol, butyl carbitol acetate, aliphatic alcohols, esters, acetone and the like. The other organic vehicle components can include thickeners (sometimes referred to as organic binders), stabilizing agents, surfactants, wetting agents and the like. Thickeners provide sufficient viscosity to the paste and also acts as a binding agent in the unfired state. Examples of thickeners include ethyl cellulose, polyvinyl acetate, resins such as acrylic resin, cellulose resin, polyester, polyamide and the like. The stabilizing agents reduce oxidation and degradation, stabilize the viscosity or buffer the pH of the paste. For example, triethanolamine is a common stabilizer. Wetting agents and surfactants are well known in the thick film paste art and can include triethanolamine and phosphate esters. In addition to the foregoing, oxidation resistant additives can be included in the paste to reduce oxidation of nickel metal. For example, the incorporation of boron-containing additives, including borate glasses, is known to inhibit the oxidation of nickel.

The different components of the thick film paste are mixed in the desired proportions in order to produce a substantially homogenous blend wherein the functional phase is well dispersed throughout the paste. Typically, the thick film paste will include from about 5 to about 95 weight percent, such as from about 60 to 85 weight percent, of the functional phase, including the nickel powders of the present invention.

Some applications of thick film pastes require higher tolerances than can be achieved using standard thick-film technology, as is described above. As a result, some thick film pastes have photo-imaging capability to enable the formation of lines and traces with decreased width and pitch. In this type of process, a photoactive thick film paste is laid down substantially as is described above. The paste is then dried and exposed to ultraviolet light through a photomask and the exposed portions of the paste are developed to remove unwanted portions of the paste. This technology permits higher density interconnections and conductive traces to be formed. The combination of the foregoing technology with the nickel powders of the present invention permits the fabrication of devices with increased circuit density and tolerances as compared to conventional technologies using conventional powders.

Examples of thick-film pastes are disclosed in U.S. Pat. Nos. 4,172,733; 3,803,708; 4,140,817; and 3,816,097 all of which are incorporated herein by reference in their entirety.

The nickel metal powder of the present invention is particularly advantageous for many applications of thick film pastes. Nickel is significantly less expensive than the noble metals that are used in thick film pastes for many applications. Nickel also has a linear thermal expansion coefficient of about 13.3 ppm/° C., which closely matches that of ceramic substrate materials such as alumina or ceramic dielectrics. Nickel metal is also advantageous because nickel metal resists leaching when soldered. Some other metals can leach significantly when the metal is soldered. Nickel metal is also advantageous because of its high conductivity.

One of the disadvantages of nickel metal that has limited its widespread use is that nickel must be sintered in a reducing atmosphere due to the strong tendency of nickel to oxidize at relatively low temperatures (e.g., at about 600° C. or lower) in oxygen-containing atmospheres, such as air. This presents a significant problem, particularly in the manufacture of multilayer ceramic capacitors that include an oxide dielectric (e.g., $BaTiO_3$) that must be sintered at high temperatures in an oxygen-containing atmosphere to avoid reduction of the oxide ceramic. The nickel metal powders of the present invention alleviate a number of these problems through the unique combination of high crystallinity and low surface area.

As is discussed above, the nickel metal powders according to the present invention have a small average particle size, are substantially spherical in shape, have a narrow particle size distribution and have a reduced number of ultrafine particles on the surface of the particles. Due to this unique combination of properties, the metal powders disperse and flow in a paste better than conventional nickel metal powders which are not small and spherical.

One of the limitations for the application thick film pastes by screen printing is the difficulty creating lines of narrow width and fine pitch (distance between lines from center to center), and of reduced thickness. The continuing demand for microelectronic components having a reduced size has made these limitations critical in component design. One of the obstacles to screen-printing surfaces having these properties is that conventional metal powders include an undesirable percentage of large particles and also include agglomerates of particles. Either of these conditions can produce conductive traces having an uneven width and an uneven thickness profile. The unpredictable width and thickness of the conductive traces forces manufacturers to design microelectronic devices to account for the variations, which can needlessly occupy valuable space on the surface of the device and waste considerable amounts of paste.

One use for such thick film pastes is in the manufacture of multilayer ceramics, sometimes referred to as multichip modules. The packaging of integrated circuits (IC's) typically utilizes a chip carrier or module to which one or more integrated circuit chips are attached. The module can then be joined to a printed circuit board, which is placed into a device, such as a computer. Such modules can advantageously incorporate multiple wiring layers within the module itself. Multilayer ceramic modules are typically formed by laminating and sintering a stack of ceramic sheets that have been screened with thick film pastes.

Typically, unfired (green) ceramic sheets are punched with via holes, screened with a thick film metal paste, laminated into a three-dimensional structure and sintered in a furnace. The ceramic and metal both densify simultaneously in the same sintering cycle. Alternatively, the multilayer ceramic can be built sequentially wherein alternate layers of metallurgy and dielectric are deposited on the substrate and fired.

Figure 50:
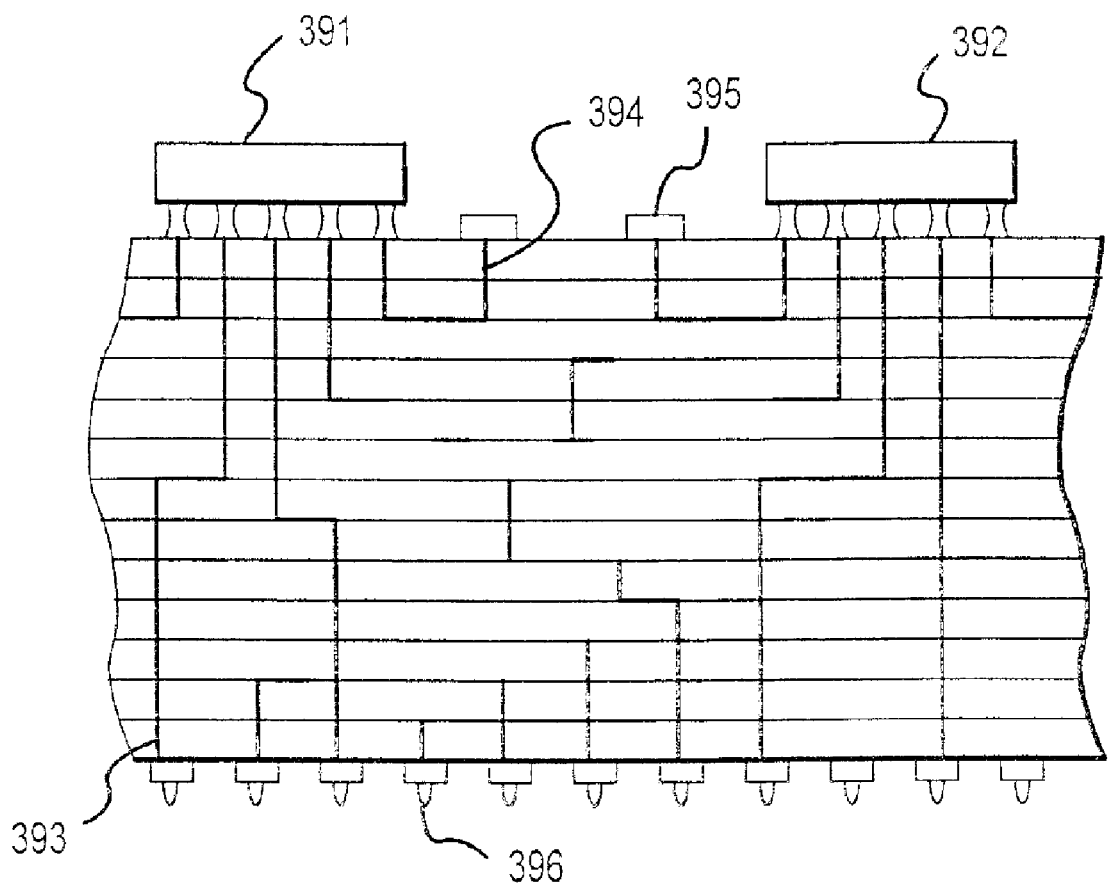
FIG. 50 illustrates a schematic view of a microelectronic device according to an embodiment of the present invention.

A schematic illustration of a multichip module is illustrated in FIG. 50. The module includes two integrated circuit devices 391 and 392. A number of electrically conductive traces, such as traces 393 and 394, are formed on and through the various layers of the device. Interconnection between the two integrated circuit devices 391 and 392 or exterior devices is made by the conductive traces and vias, which can terminate, for example, at wire bonding pads such as pad 395 or at conductive pins, such as pin 396. The multichip module can include any number of layers, and many such modules include 20 or more such layers for interconnection. The layers are typically formed from a dense ceramic substrate, such as an alumina substrate.

Figure 51:
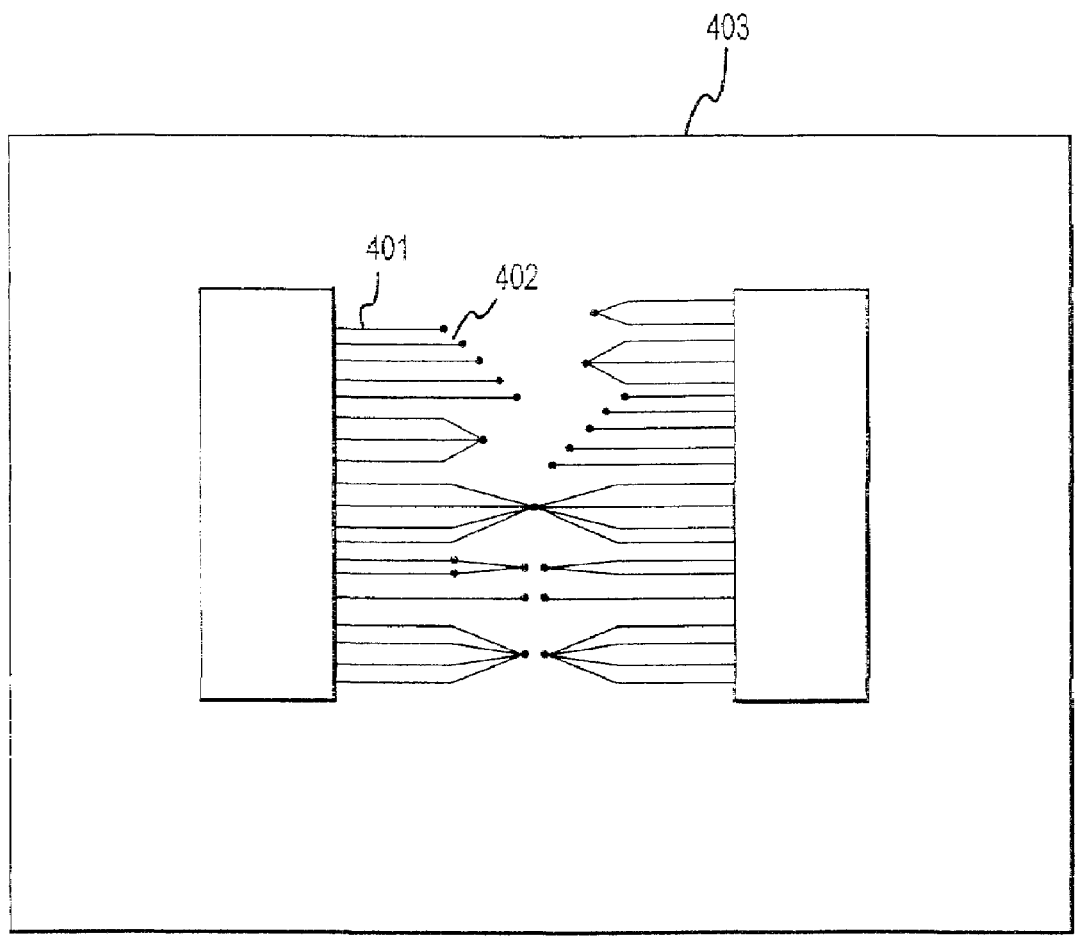
FIG. 51 illustrates a top view of a microelectronic device according to an embodiment of the present invention.

A top view of a multichip module is illustrated in FIG. 51. Electrically conductive traces 401 and 402 are printed on a ceramic substrate 403 in parallel spaced relation. The conductive traces in such a relation have a design pitch, that is, an average center-to-center spacing between the conductive traces. Manufacturers of such devices desire the linewidth and pitch to be as small as possible to conserve available space on the surface of the module. However, presently available powders for forming the conductive traces which contain agglomerates and/or a wide particle size distribution of particles inhibit the reliable manufacture of conductive traces having a narrow linewidth and pitch. For example, the linewidth and pitch for such traces is typically not smaller than about 100 μm. There is a demand in the industry to significantly reduce the linewidth and pitch to significantly lower levels, such as less than about 25 μm and even less than about 15 μm.

To achieve such narrow linewidths and fine pitch, thick film pastes will have to be modified to have improved rheology and more reliable characteristics. The thick film pastes incorporating the nickel metal powders of the present invention can consistently and reliably produce a finer width line and pitch due to the spherical morphology, small particle size and narrow particle size distribution of the nickel metal powders, as well as the unagglomerated state of the powder. These properties will advantageously permit the design of microelectronic devices with conductive traces having a narrower pitch, and thus reduce the overall size of the devices. Thick film pastes utilizing the nickel metal powders of the present invention can be used to produce conductive traces having a significantly reduced linewidth and pitch, such as less than about 25 μm and even less than about 15 μm.

The nickel metal powders of the present invention are also advantageous for use in thick film pastes due to the increased oxidation resistance of the nickel metal powders. The increased oxidation resistance of the nickel metal powders is due to a number of factors. The high crystallinity of the powders reduces the volume of grain boundaries within the particle and thereby reduces the ability of oxygen to diffuse along the grain boundaries and oxidize the metal. The particles can also be coated or otherwise modified to enhance the oxidation resistance, as is discussed above.

As is discussed above, thick film pastes contain a number of organics used as a vehicle to apply the functional phase to a substrate. These pastes are then heated to a low temperature in order to volatilize these organics. The organics are preferably volatilized in an oxidizing atmosphere so that the organics are removed, such as in the form of carbon dioxide. The temperature at which oxidation of the nickel metal particles of the present invention begins to occur can be increased, and therefore, the binder and other organics can be burned out at an increased temperature and/or under a higher partial pressure of oxygen. The metal alloy powders and metal composite powders of the present invention, as discussed above, can also have increased oxidation resistance.

Figure 52:
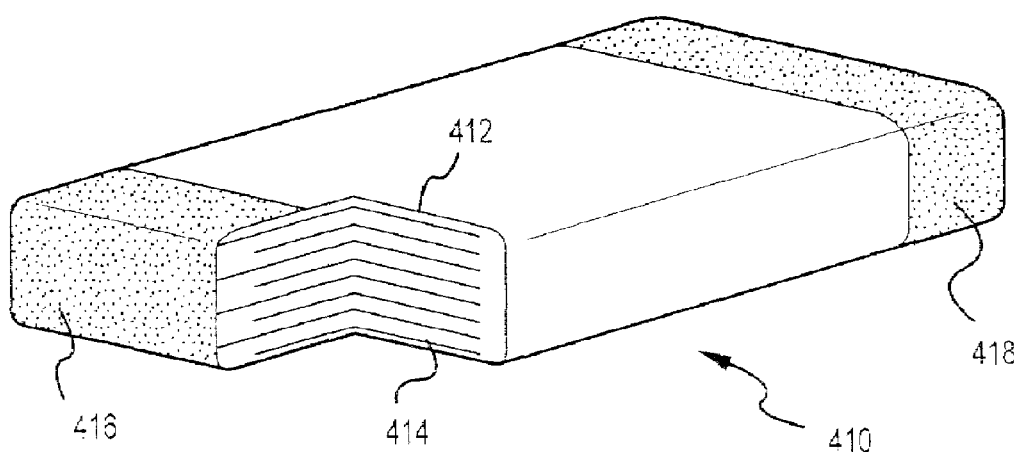
FIG. 52 illustrates a schematic view of a multilayer ceramic capacitor according to an embodiment of the present invention.

The nickel metal powders and pastes according to the present invention are particularly useful for the fabrication of multilayer ceramic capacitors (MLCC's). FIG. 52 illustrates an example of a multilayer ceramic capacitor according to the present invention. The MLCC 410 includes a plurality of ceramic dielectric layers 412 separated by internal electrodes 414. The ceramic dielectric layers can be fabricated from a variety of materials such as titanates (e.g., $BaTiO_3$, $Nd_2Ti_2O_7$, $SrTiO_3$, or $CaTiO_3$), zirconates (e.g. $CaZrO_3$ or $MgZrO_3$) or niobate relaxors (e.g. lead magnesium niobate). Many modifications of these compounds are known to those skilled in the art. Terminations 416 and 418 for electrical connection, typically fabricated using copper metal, are included at opposing sides of the MLCC and alternating electrodes are connected to each termination. Such devices typically utilize metals such as palladium and silver-palladium for the internal electrodes, which are co-fired with the ceramic dielectric. Nickel is a significantly less expensive alternative to these metals.

Designers of MLCC's prefer the internal electrodes to be as thin as possible to maximize capacitance, reduce cost and reduce total volume, without sacrificing electrical integrity. Therefore, the powders within the paste should disperse well, have a small particle size and contain substantially no agglomerates or large particles. Powders that do not meet these criteria force MLCC manufacturers to design the devices with thick internal electrodes to account for the variability. The nickel metal powders according to the present invention are particularly well-suited to permit the design of MLCC's with thinner internal electrodes. Preferably, the average thickness of the internal electrodes is not be greater than about 2 μm and more preferably is not greater than about 1.5 μm.

Another problem typically associated with MLCC's fabricated with nickel electrodes is the sintering of the multilayer structure. Because of the different sintering characteristics of the nickel metal and the dielectric material, many defects can arise in the device such as cracks, delaminations and camber. In order to alleviate some of these defects, thick film paste manufacturers incorporate dispersed metal oxide powders in the thick film paste. However, this is not always sufficient to eliminate the foregoing problems. The composite metal particles of the present invention, as is discussed hereinabove, provide a unique solution to this problem and can significantly increase the yield of devices. Nickel metal particles that are composite particles comprising an intimate mixture of the metal phase and a non-metallic second phase can advantageously reduce the mismatch in sintering characteristics between the metal layer and the dielectric layer. Preferred non-metallic second phases include the metal oxides and it is particularly preferred that a material similar to the dielectric material can be used. For example, where the dielectric layer comprises $BaTiO_3$, it is preferred that the nickel metal particles include a nickel metal phase intimately mixed with a $BaTiO_3$.

An MLCC such as that illustrated in FIG. 52 is typically fabricated by first forming a green body, that is, an unsintered structure which is adapted to be sintered to form the MLCC. Thus, the green body includes a plurality of green ceramic sheets with a thick film paste composition disposed between alternating sheets. For example, sheets of tape cast ceramic can be screen-printed with the metal electrode paste and a multilayer structure built by alternating layers. Individual MLCC green bodies can than be cut from the laminated sheets. The stacked and laminated structure is then heated to remove organics from the thick film paste and ceramic green sheets and sinter and densify the MLCC. An MLCC including a titanate dielectric is typically sintered at about 1100-1300° C. External electrodes can then be applied to complete the device.

Another technology where the nickel metal pastes according to the present invention provide significant advantages is for flat panel displays, such as plasma display panels. Operating under the same basic principle as a fluorescent lamp, a plasma display panel consists of millions of pixel regions on a transparent substrate that mimic individual fluorescent tubes. The light emitted by each region is controlled to form a video display. Plasma displays can be produced in a very large size, such as 20 to 60 inch diagonal screen size, with a very thin profile, such as less than about 3 inches.

Figure 53:
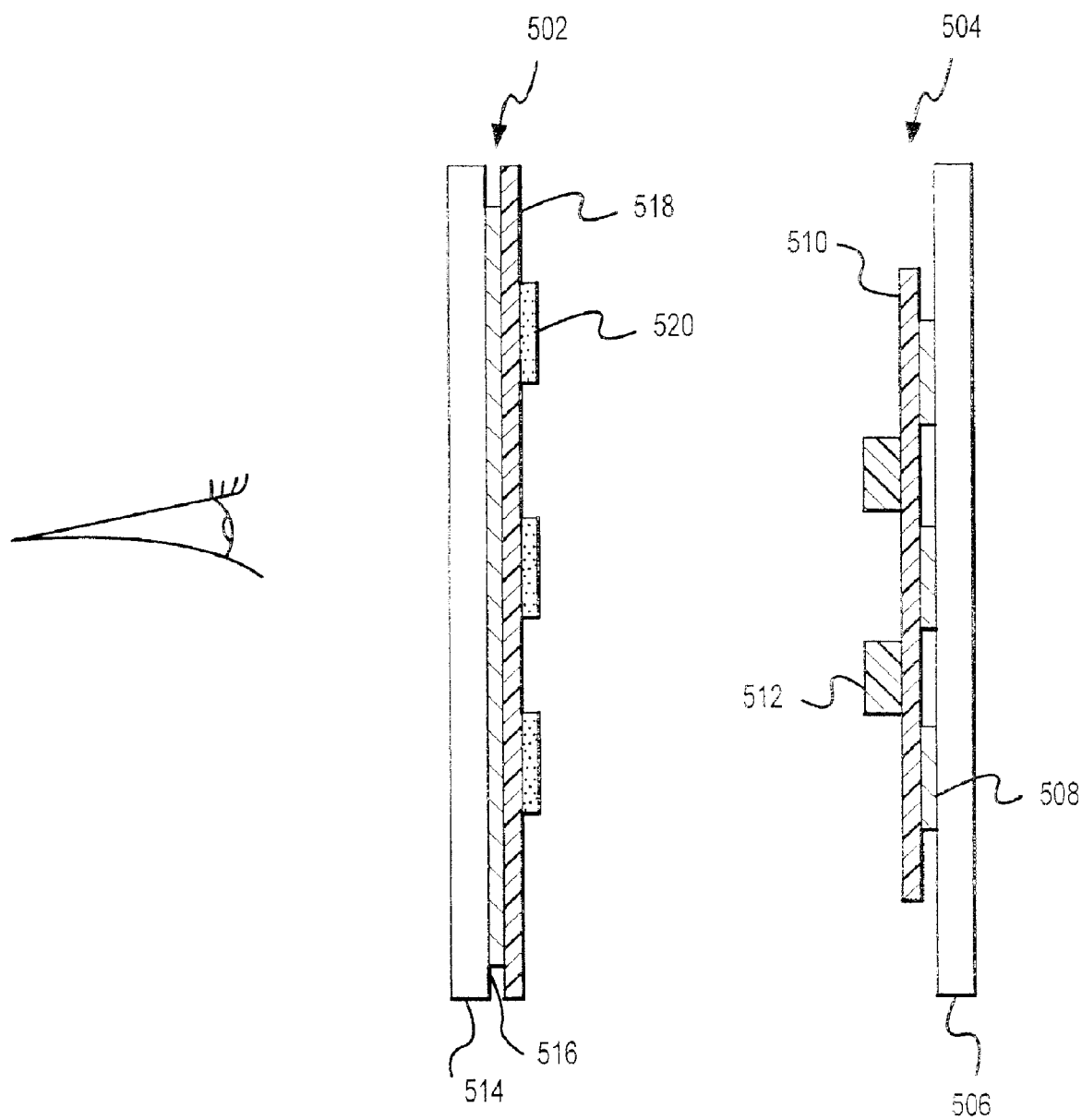
FIG. 53 illustrates a schematic view of a plasma display panel according to an embodiment of the present invention.

Nickel metal is particularly useful for forming the electrodes for a plasma display panel. A cross-section of a plasma display device as illustrated in FIG. 53. The plasma display comprises two opposed panels 502 and 504 in parallel opposed relation. A working gas is disposed and sealed between the two opposing panels 502 and 504. The rear panel 504 includes a backing plate 506 on which are printed a plurality of electrodes 508 (cathodes) which are printed parallel to one another. An insulator 510 covers the electrodes and spacers 512 are utilized to separate the rear panel 504 from the front panel 502.

The front panel 502 includes a glass face plate 514 which is transparent when observed by the viewer. Printed onto the rear surface of the glass face plate 514 are a plurality of electrodes 516 (anodes) in parallel spaced relation. An insulator 518 separates the electrode from the pockets of phosphor powder 520.

Figure 54:
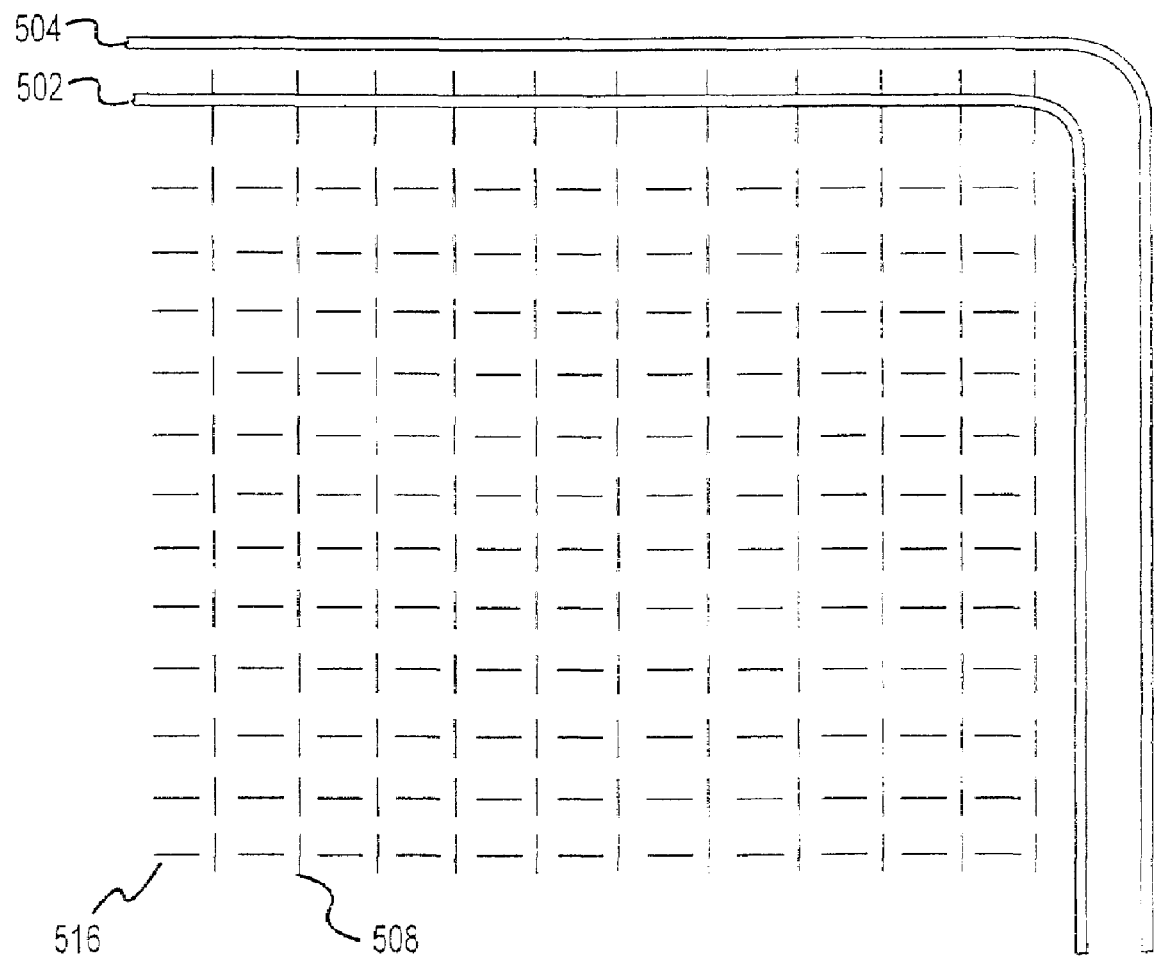
FIG. 54 illustrates another view of a plasma display panel according to an embodiment of the present invention.

A schematic view of the electrode configuration in such a plasma display panel is illustrated in FIG. 54. The plasma display includes a front panel 502 and a rear panel 504 printed on the front panel are a plurality of electrodes 516 in parallel spaced relation. Printed on the rear panel 504 are a plurality of electrodes 508 which intersect the front panel electrodes 516 thus forming an addressable XY grid of electrodes.

Thus, each pixel of phosphor powder can be activated by addressing an XY coordinate defined by the intersecting electrodes 516 and 508. Plasma display panels can have a large surface area, such as greater than 50 diagonal inches, and therefore the uniformity and reliability of the addressing electrodes is critical to the proper function of the plasma display device.

The nickel powder according to the present invention can advantageously be used to form the electrodes, as well as the bus lines, for the plasma display panel. Nickel metal advantageously has a high conductivity and can be fired in air at the temperatures typically used to form the electrode pattern. Typically, a nickel paste is printed onto a glass substrate and is fired in air at from about 450-600° C. Nickel metal is also advantageously resistant to corrosion (etching) from the plasma gas. Additives, such as boron or boron compounds, can also be included in the electrode thick-film paste to enhance the oxidation resistance of the nickel metal.

The nickel metal powder of the present invention has a small average particle size and a narrow size distribution to provide high resolution lines which lead to a high pixel density and precision pattern over a large area. For most flat panel displays, a resolution of at least about 25 to 30 μm is desirable. That is, the average line width and spacing should be no greater than about 30 μm. For higher resolution displays, the resolution should be even higher, such as a resolution of less than 20 μm or even less than 10 μm. The nickel metal powders of the present invention enable such high resolutions over a large area, while maintaining an acceptable yield.

Another class of devices that can advantageously incorporate the nickel metal powders of the present invention is energy storage devices, such as batteries. Nickel particles can be used in various battery designs as an active cathode and/or anode material. For example, nickel powders can be used in nickel-metal hydride batteries and nickel composite powders can be used in other advanced energy storage devices. The ability to control particle characteristics such as particle size, particle size distribution, surface area, morphology, composition and electrochemical reactivity in accordance with the present inventions will enhance the performance of such energy storage devices.

In addition to the foregoing, the powders according to the present invention can be used for thermal spraying applications wherein the powders are agglomerated sprayed onto a substrate to form a thick coating. The homogeneity and high crystallinity of the particles make them particularly well-suited for thermal spraying.

EXAMPLES

A number of examples were prepared in accordance with the various embodiments of the present invention. Examples 1-5 are summarized in Table 1.

TABLE I

Nickel Metal Examples

| SAMPLE | PRECURSOR SOLUTION | CARRIER GAS | IMPACTOR | REACTION TEMPERATURE |
|---|---|---|---|---|
| 1 | 0.5M Ni(NO$_3$)$_2$ | 2 lpm N$_2$ 5 lpm 7% H$_2$/N$_2$ (net 5% H$_2$) | No | 1000° C. |
| 2 | 0.5M Ni(NO$_3$)$_2$ | 2 lpm N$_2$ 5 lpm 7% H$_2$/N$_2$ (net 5% H$_2$) | yes (8.5 μm cutoff) | 1000° C. |
| 3 | 0.5M Ni(NO$_3$)$_2$ | 2 lpm N$_2$ 5 lpm 7% H$_2$/N$_2$ (net 5% H$_2$) | no | 700° C. |
| 4 | 0.5M Ni(NO$_3$)$_2$ | 5% H$_2$/N$_2$ | no | 850° C. |
| 5 | Ni(NO$_3$)$_2$ and Pd(NO$_3$)$_2$ | 2 lpm N$_2$ 5 lpm 7% H$_2$/N$_2$ (net 5% H$_2$) | No | 1000° C. |

| SAMPLE | AVERAGE PARTICLE SIZE | 95% SIZE DISTRIBUTION | POWDER DENSITY | SURFACE AREA |
|---|---|---|---|---|
| 1 | 1.2 μm | 0.4-2.5 μm | 7.13 g/cc (80%) | 2.4 m2/g |
| 2 | 0.8 μm | 0.4-1.2 μm | 7.80 g/cc (88%) | 1.1 m2/g |
| 3 | 1.8 μm | 0.4-3.5 μm | — | — |
| 4 | 1.5 μm | 0.4-3.0 μm | — | — |
| 5 | — | — | — | — |

For each of Examples 1-5, an aqueous solution of 0.5 M Ni(NO$_3$)$_2$·6H$_2$O was formed and an ultrasonic transducer generator operating at a frequency of about 1.6 MHz was utilized to produce an aerosol of liquid droplets from the solution. Nitrogen and hydrogen were used as a carrier gas composition in the concentrations indicated in Table 1. The aerosol was carried in the carrier gas to a heating zone, which consisted of an elongate ceramic tube. The heating zone was heated to the reaction temperature indicated for each example. For each of Examples 1-5, the residence time in the heating zone was about 6-11 seconds.

Figure 55:
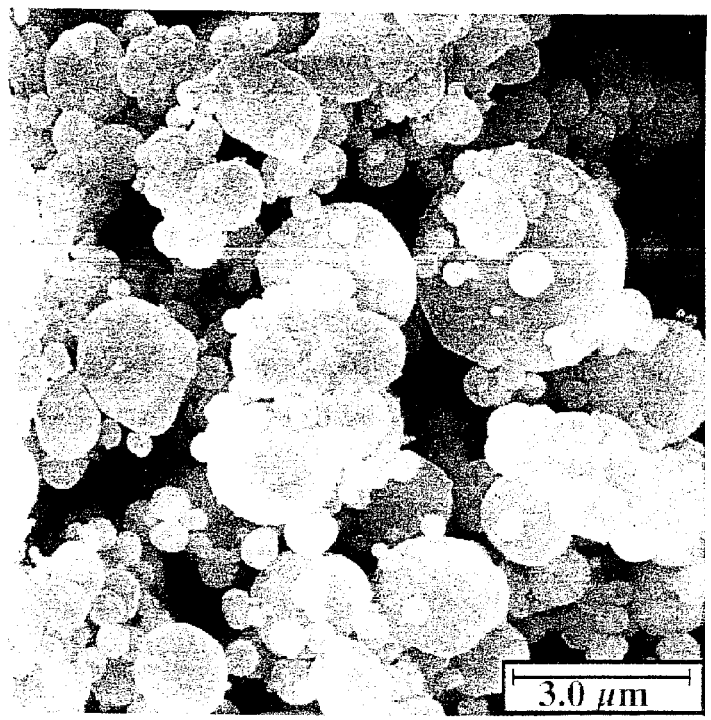
FIG. 55 illustrates a photomicrograph of a nickel metal powder according to an embodiment of the present invention.

Examples 1 and 2 illustrate the effect of narrowing the droplet size distribution of the aerosol, in this case by using an impactor to remove large droplets from the aerosol prior to entering the heating zone. For Example 1, no impactor was used to remove large aerosol droplets. The resulting nickel metal particles had a particle density of about 7.13 g/cm$^3$, which is about 80% of the theoretical density for nickel. The powder produced according to Example 1 is illustrated in FIG. 55. The average size of the particles was about 1.2 µm and some particles greater than about 2.5 µm in size were observed. The particles having a size greater than about 2.5 µm appeared to be hollow shells.

Figure 56:
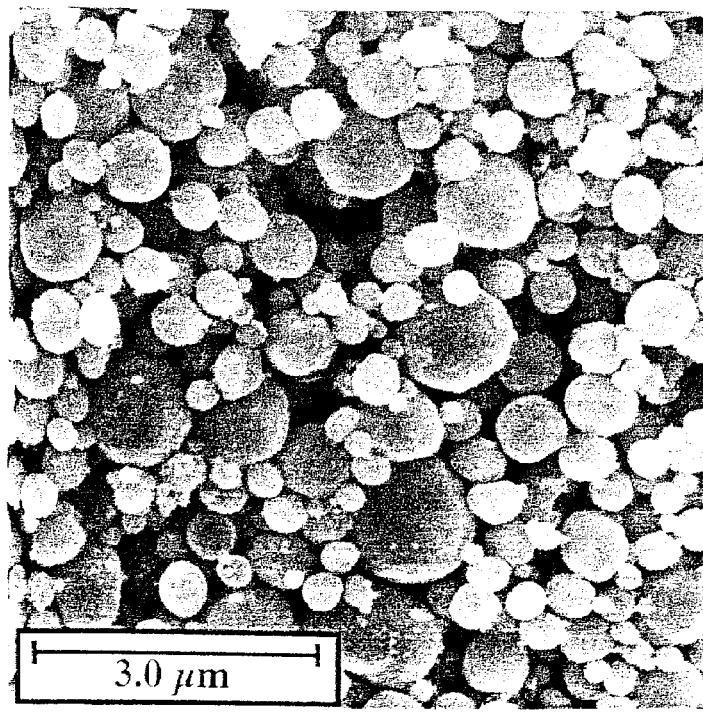
FIG. 56 illustrates a photomicrograph of a nickel metal powder according to an embodiment of the present invention.

Example 2 was substantially identical to Example 1, except that an impactor was used to remove droplets from the aerosol having an aerodynamic diameter of greater than about 8.5 µm, thus narrowing the size distribution of the droplets in the aerosol. The powder produced according to Example 2 is illustrated in FIG. 56. The nickel particles were substantially spherical in shape and had a particle density of about 7.8 g/cm$^3$, which is 88% of the theoretical density for nickel. The average size of the particles was about 0.8 µm and no particles greater than about 2.5 µm in size were observed in the powder and no hollow or broken shells were observed. The surface area was reduced to about 1.1 m$^2$/g.

Thus, the use of an impactor to narrow the size distribution of droplets by removing large droplets from the aerosol reduced the average particle size of the nickel metal particles, increased the particle density and narrowed the size distribution of the powder. In Example 2, at least about 95 percent of the particles had a size of 0.4 µm to 1.2 µm. Thus, 95 percent of the particles had a size of not greater than 1.5 times the average particle size.

Figure 57:
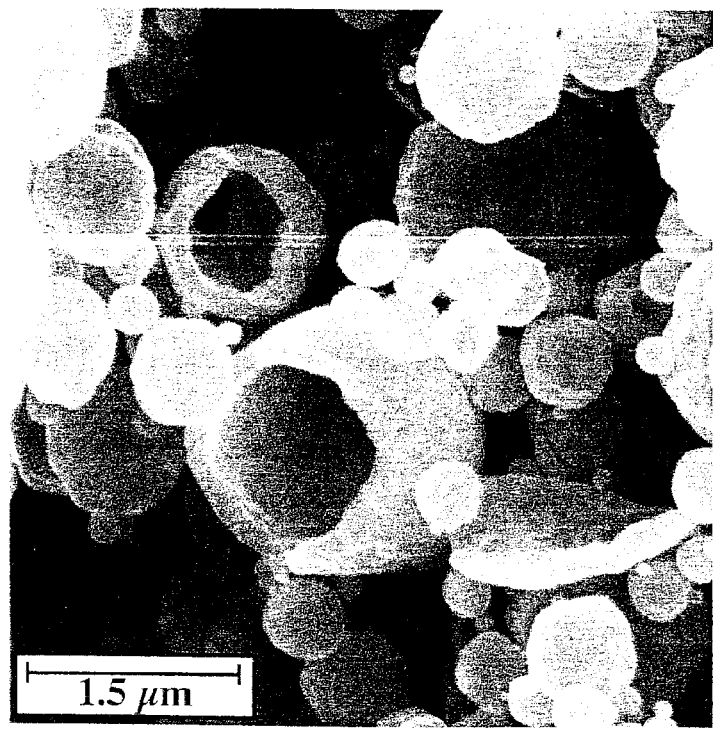
FIG. 57 illustrates a photomicrograph of a nickel metal powder according to an embodiment of the present invention.
Figure 58:
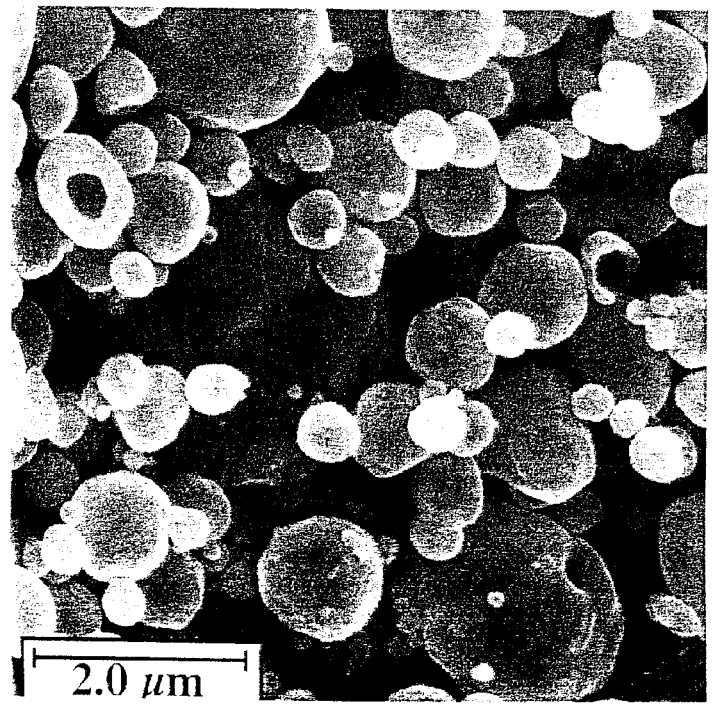
FIG. 58 illustrates a photomicrograph of a nickel metal powder according to an embodiment of the present invention.

Example 3 was essentially identical to Example 1, except that the reaction temperature in the heating zone was about 700° C. The powder produced according to Example 3 is illustrated in FIG. 57. Many hollow and fragmented particles were observed in the powder indicating that a higher reaction temperature is desirable to obtain solid, spherical nickel metal particles. In Example 4, the reaction temperature was increased to about 850° C. The powder produced according to Example 4 is illustrated in FIG. 58. The average particle size was reduced to about 1.5 µm as compared to about 1.8 µm for Example 3, and the number of hollow particles and broken shells observed in the powder was significantly reduced.

Figure 59:
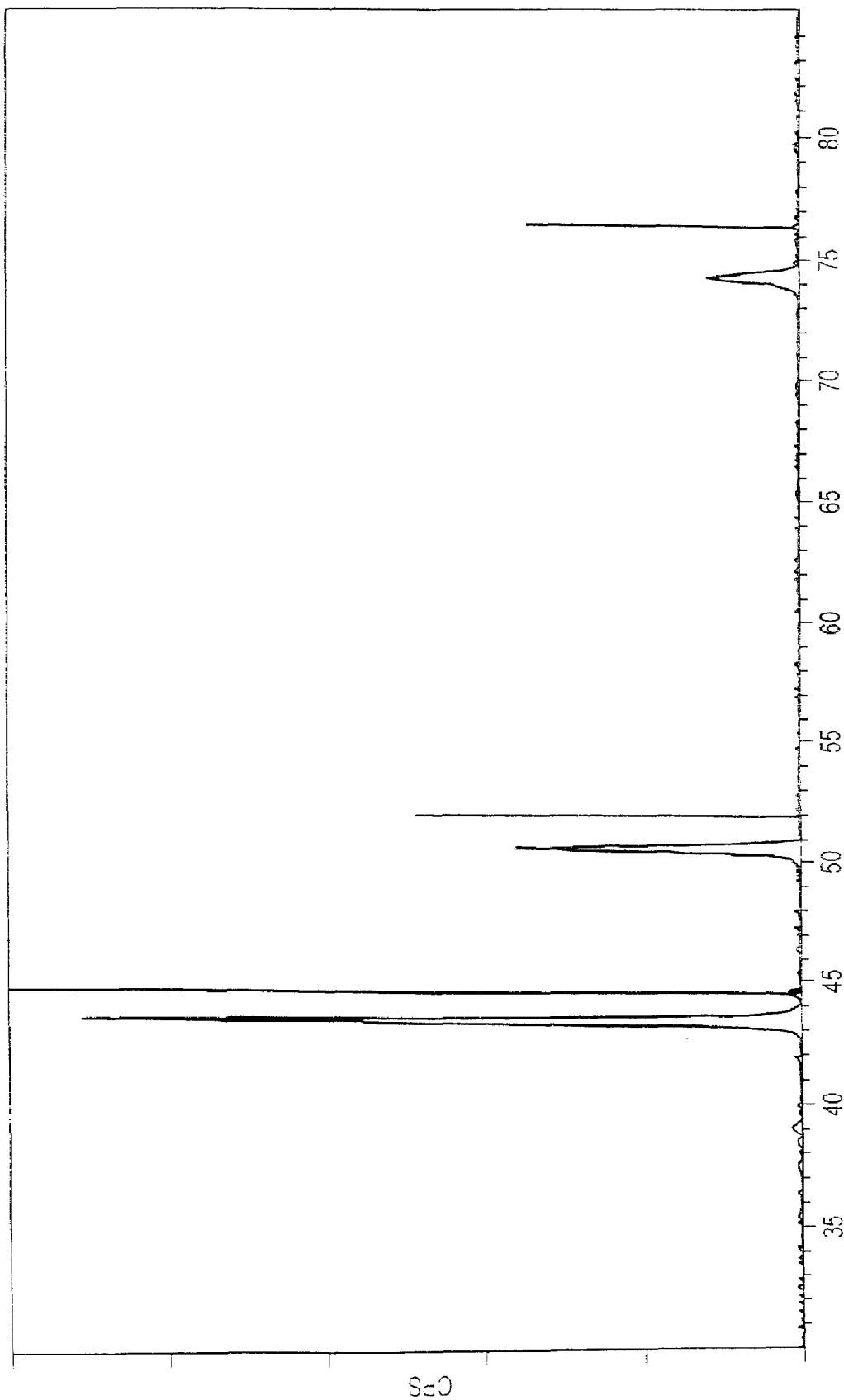
FIG. 59 illustrates an x-ray diffraction pattern of a nickel/palladium alloy produced according to an embodiment of the present invention.

Example 5 illustrates the production of a nickel metal alloy powder according to the present invention. An aqueous solution comprising nickel nitrate and palladium nitrate was utilized to produce substantially phase pure palladium/nickel alloy particles having a Ni/Pd ratio of 70/30. An x-ray diffraction pattern of this powder is illustrated in FIG. 59. The x-ray diffraction pattern illustrates that the alloy has substantially no phase segregation of the Ni and Pd and thus formed a well alloyed, homogenous metal.

Figure 60:
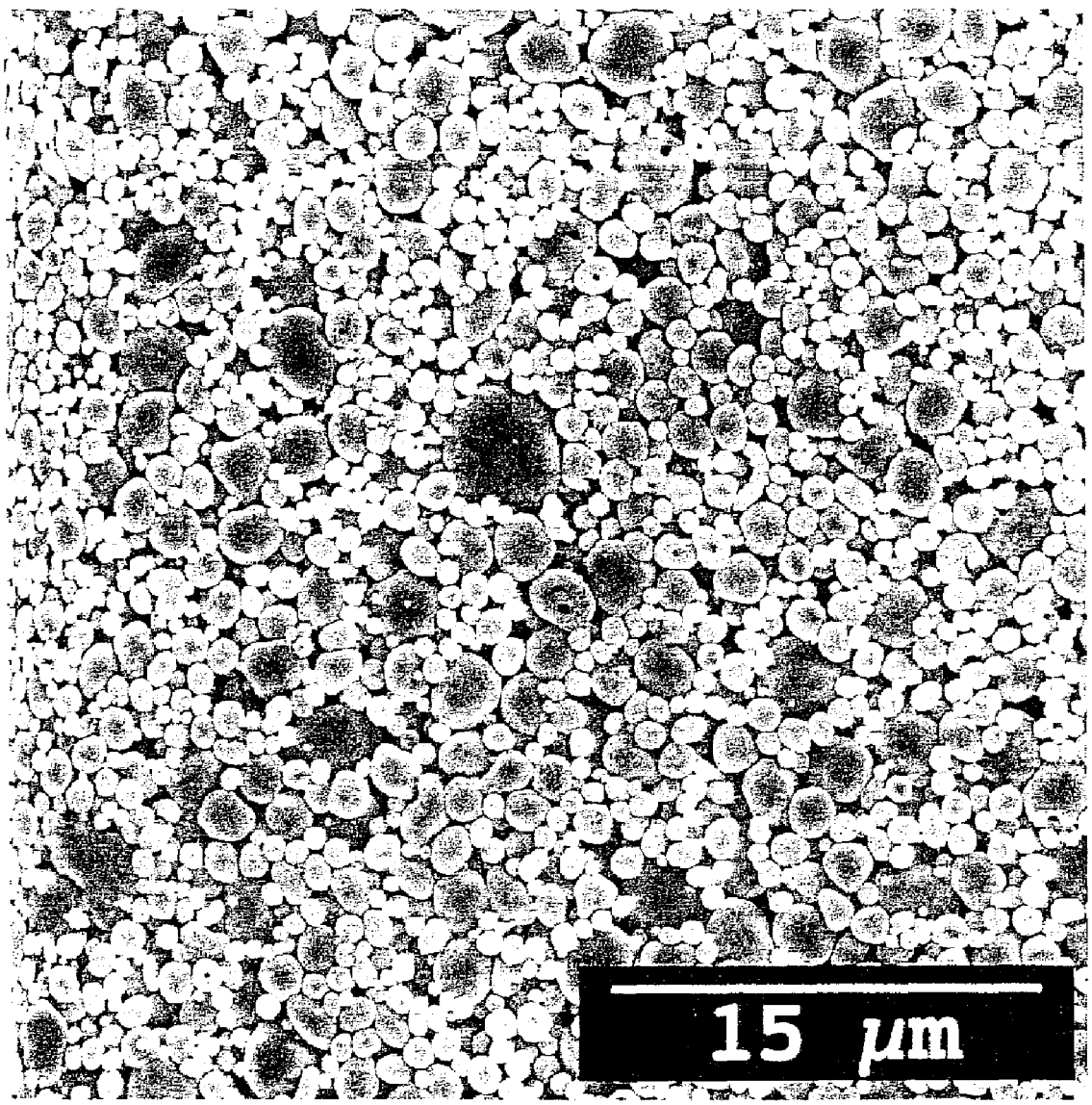
FIG. 60 illustrates a photomicrograph of a nickel metal powder according to an embodiment of the present invention.
Figure 61:
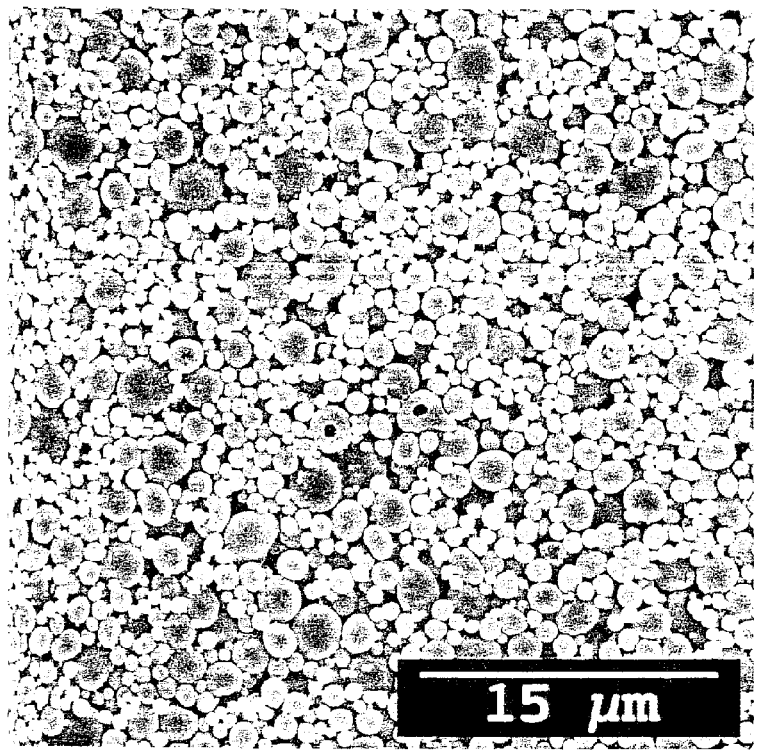
FIG. 61 illustrates a photomicrograph of a nickel metal powder according to an embodiment of the present invention.
Figure 62:
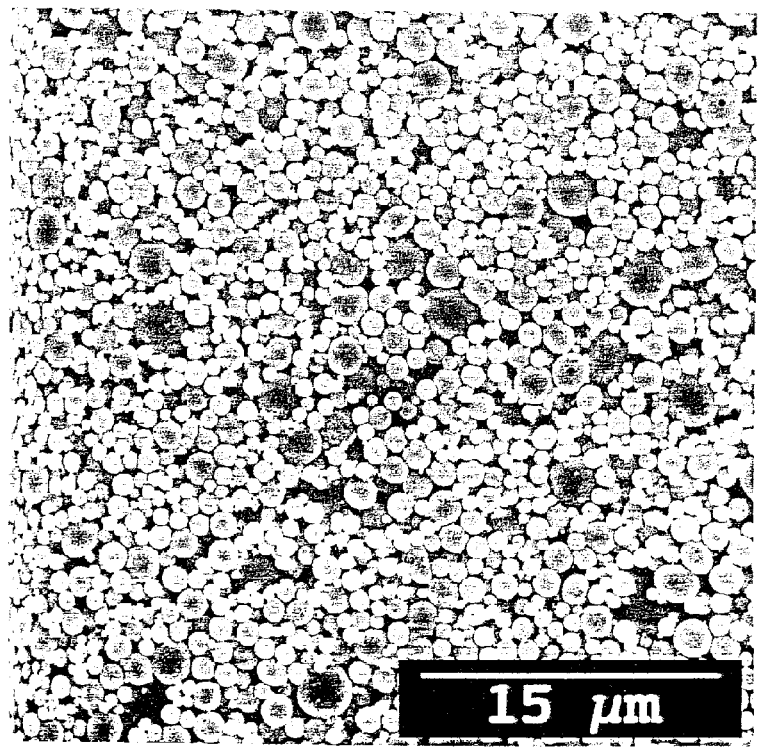
FIG. 62 illustrates a photomicrograph of a nickel metal powder according to an embodiment of the present invention.

A further set of examples were prepared to determine the effect of varying the reactor temperature above 1000° C. These examples are summarized in Table II. In each of Example 6-8, an aerosol was generated using an ultrasonic transducer at 1.6 MHz. Powder from Examples 6, 7 and 8 are illustrated in FIGS. 60, 61 and 62 respectively.

TABLE II

Effect of Reactor Temperature

| Example | Precursor Solution | Carrier Gas | Reaction Temperature |
|---|---|---|---|
| 6 | 10 w/o Ni | 2.1% H$_2$/N$_2$ | 1000° C. |
| 7 | 10 w/o Ni | 2.45% H$_2$/N$_2$ | 1200° C. |
| 8 | 10 w/o Ni | 2.1% H$_2$/N$_2$ | 1400° C. |

It can be seen from the photomicrographs illustrated in FIGS. 60-62 that as the temperature increased, the particles become smaller in average particle size and fewer hollow shells were produced. The powder produced at 1400° C. (FIG. 62), contained few broken shells and the particles are spherical and substantially dense.

An additional set of examples were prepared to examine the affect of varying hydrogen concentration at different reaction temperatures. These examples are summarized in Table III.

TABLE III

Effect of Carrier Gas Composition

| Example | Precursor Solution | Carrier Gas | Stoichiometric Ratio | Reaction Temperature | Observed Phases |
|---|---|---|---|---|---|
| 9  | 10 w/o Ni | 0.7% H$_2$  | 2.2 | 1000° C. | NiO |
| 10 | 10 w/o Ni | 1.4% H$_2$  | 4.4 | 1000° C. | NiO |
| 11 | 10 w/o Ni | 1.75% H$_2$ | 5.5 | 1000° C. | Ni + NiO |
| 12 | 10 w/o Ni | 2.1% H$_2$  | 6.9 | 1000° C. | Ni |
| 13 | 10 w/o Ni | 1.4% H$_2$  | 4.2 | 1200° C. | NiO |
| 14 | 10 w/o Ni | 2.1% H$_2$  | 6.7 | 1200° C. | Ni + NiO |
| 15 | 10 w/o Ni | 2.45% H$_2$ | 8.6 | 1200° C. | Ni |
| 16 | 10 w/o Ni | 1.75% H$_2$ | 5.7 | 1400° C. | NiO |
| 17 | 10 w/o Ni | 2.1% H$_2$  | 7.2 | 1400° C. | Ni |

The carrier gas for Examples 9-17 included nitrogen plus hydrogen, the volume percent hydrogen as indicated in Table III. The stoichiometric ratio indicated in Table III represents the ratio of available hydrogen to the amount of hydrogen theoretically required to convert all of the nickel to nickel metal. The amount of hydrogen that was required to completely form nickel metal was from 2.1 to 2.45 volume percent of the carrier gas. This corresponds to from about 6 to about 9 times the theoretically calculated stoichiometric amount of hydrogen required to reduce all of the NiO to Ni.

As a result of these examples, it was determined that at least about 2.5 volume percent hydrogen should be used in the carrier gas at all temperatures to ensure the complete reduction of NiO to Ni. This corresponds to at least about 9 times the stoichiometric amount of hydrogen in the system.

Another set of examples were prepared to determine the effect of varying the precursor concentration of nickel nitrate in the precursor solution. Powder batches were formed using solutions including 10 weight percent, 20 weight percent and 30 weight percent nickel. An impactor was used to remove large droplets from the aerosol, as in Example 2. The results are illustrated in Table IV.

TABLE IV

| Effect of Precursor Concentration | | | | |
|---|---|---|---|---|
| Example | Precursor Solution | Reactor Temperature | Collection Rate | Collection Efficiency |
| 18 | 10 w/o Ni | 1200° C. | 0.67 g/hr | 31% |
| 19 | 20 w/o Ni | 1200° C. | 0.55 g/hr | 17% |
| 20 | 30 w/o Ni | 1200° C. | 0.03 g/hr | 2% |

Figure 63:
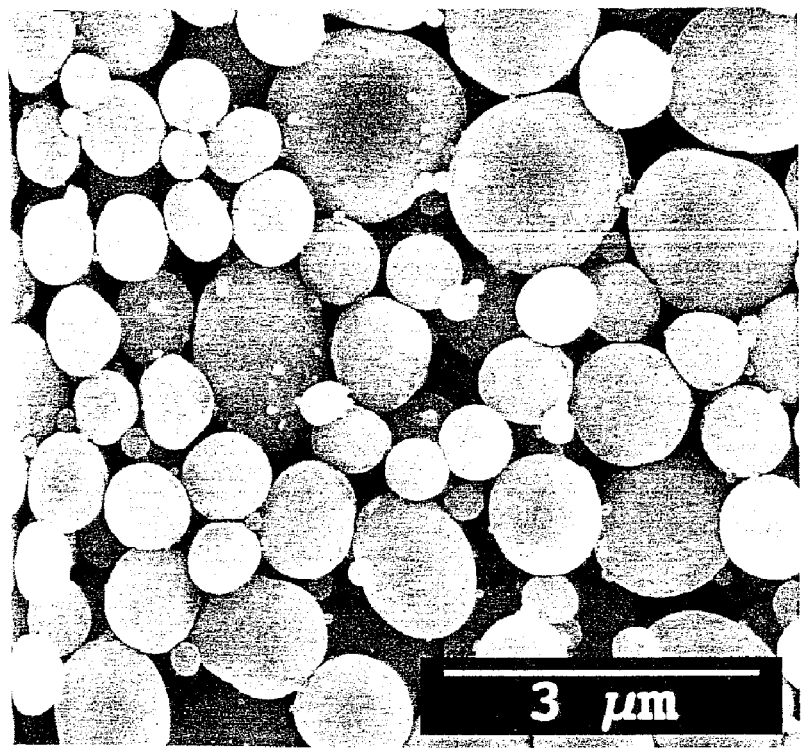
FIG. 63 illustrates a photomicrograph of a nickel metal powder according to an embodiment of the present invention.
Figure 64:
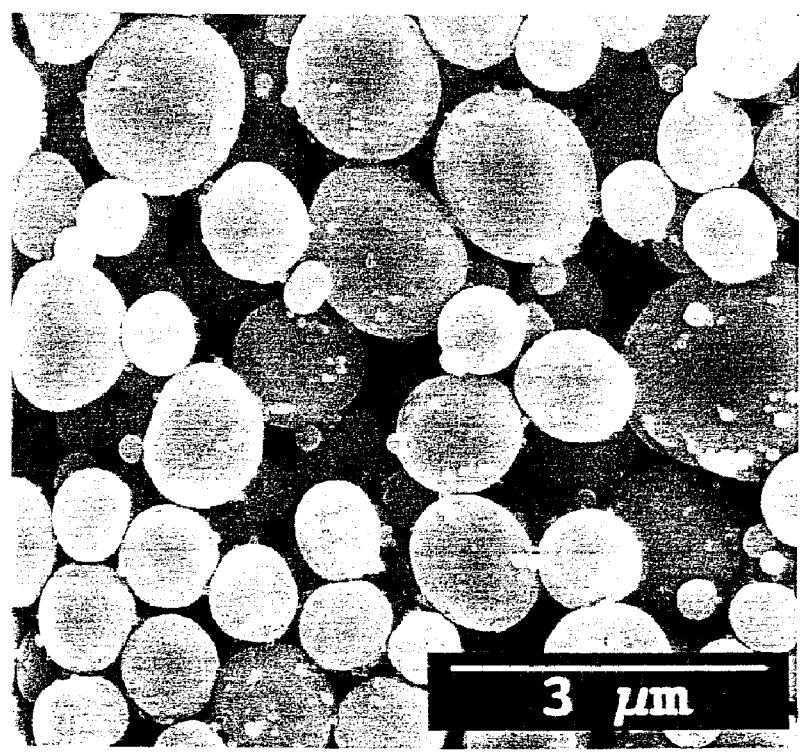
FIG. 64 illustrates a photomicrograph of a nickel metal powder according to an embodiment of the present invention.
Figure 65:
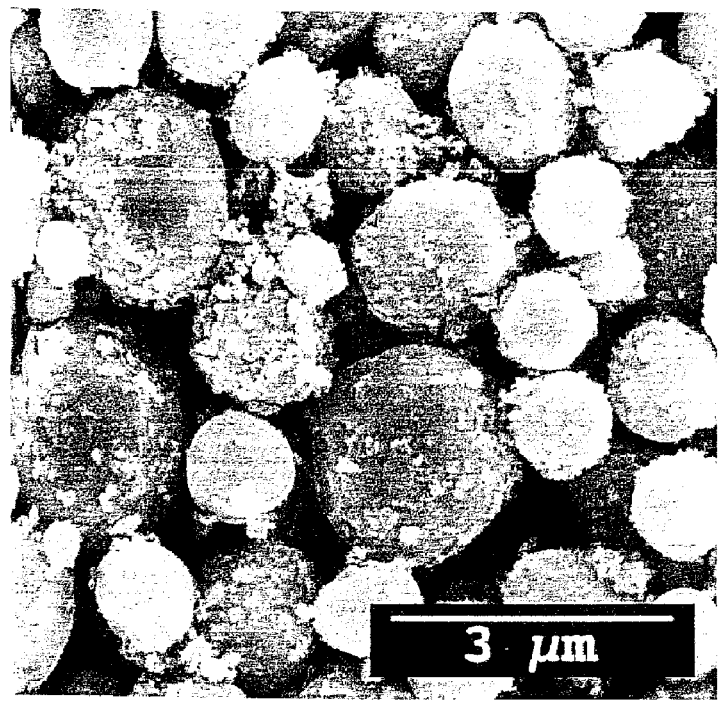
FIG. 65 illustrates a photomicrograph of a nickel metal powder according to an embodiment of the present invention.

As the solution concentration increased, both the collection rate (powder collected per unit of time) and the collection efficiency (percentage of nickel in solution collected as solid particles) decreased. The collection rate and efficiency were poor for the 30 weight percent nickel solution because of difficulty generating an aerosol. The best collection rate and efficiency were for the 10 weight percent solution. FIGS. 63, 64 and 65 illustrate the powders produced at 10 weight percent, 20 weight percent and 30 weight percent solutions, respectively. As the concentration increases, the average particle size clearly increases, as expected. Further, as the concentration increases, more ultrafine particles are attached to the surfaces of the larger particles.

Metal composite particles were also produced in accordance with the present invention using the ferroelectric materials barium titanate and neodymium titanate, which are commonly used in MLCC's. The precursor for the ferroelectrics was prepared by adding either barium or neodymium nitrate to a water solution containing titanium tetraisopropoxide. A fine precipitate was formed and the addition of nitric acid caused the precipitate to decompose and form a soluble solution.

Figure 66:
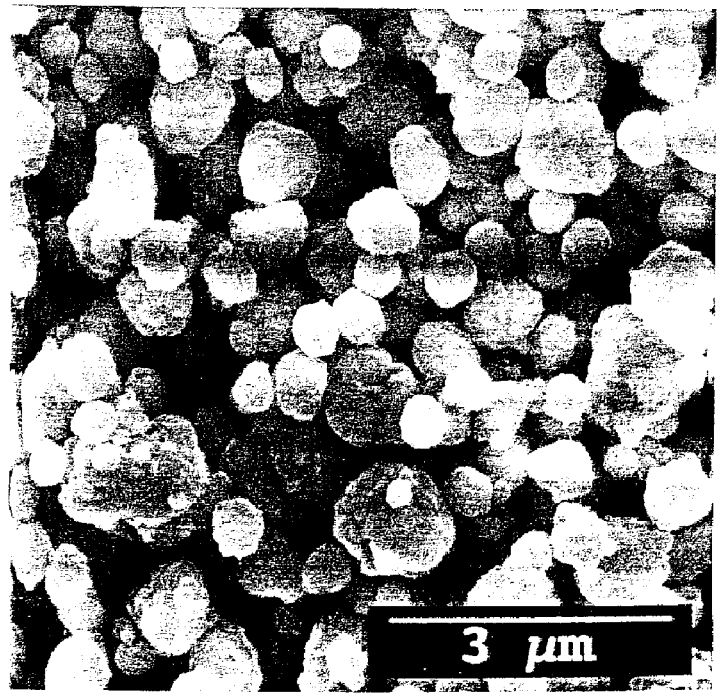
FIG. 66 illustrates a photomicrograph of a nickel metal composite powder according to an embodiment of the present invention.

Solutions containing 25 weight percent of the ferroelectric precursor were formed. The solutions were atomized to form an aerosol, which was carried through a heating zone at a temperature of 1200° C. in a carrier gas including nitrogen and 2.8 volume percent hydrogen. The resulting powders were composed of both the phase pure ferroelectric material and nickel metal. A powder comprising about 75 weight percent nickel and about 25 weight percent barium titanate dispersed therethrough is illustrated in FIG. 66. The metal composite particles are comprised of an intimate mixture of the metal phase and the dielectric phase.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A method for making coated nickel-containing particles, the method comprising:

preparing particles comprising a nickel-containing material, where the particles are dispersed in a flowing aerosol stream; and after the preparing and while the particles remain dispersed in the aerosol stream, processing the particles, wherein the processing comprises forming a coating on the particles, the coating comprising a coating material that is different than the nickel-containing material.

2. The method of claim 1, wherein the coating has an average thickness of not greater than 100 nanometers.

3. The method of claim 1, wherein the coating has an average thickness of not greater than 50 nanometers.

4. The method of claim 3, wherein the coating has an average thickness of at least 5 nanometers.

5. The method of claim 1, wherein the coated nickel-containing particles have a weight average particle size in a range of from 0.1 μm to 5 μm.

6. The method of claim 1, wherein the coating material is an inorganic compound.

7. The method of claim 1, wherein the coating material is a metal phase.

8. The method of claim 7, wherein the metal phase is an elemental metal.

9. The method of claim 7, wherein the metal phase comprises a noble metal.

10. The method of claim 9, wherein the noble metal is platinum.

11. The method of claim 9, wherein the noble metal is gold.

12. The method of claim 7, wherein the metal phase is selected from the group consisting of elemental copper and copper alloys.

13. The method of claim 1, wherein the coating material is a metal oxide.

14. The method of claim 13, wherein the metal oxide is selected from the group consisting of $ZrO_2$, $SiO_2$, $B_2O_5$, $TiO_2$, $Cu_2O$, CuO, $Bi_2O_3$, $V_2O_5$ and $Al_2O_3$.

15. The method of claim 1, wherein the coating material is a dielectric compound.

16. The method of claim 15, wherein the dielectric compound is selected from the group consisting of titanates, silicates, aluminates and tantalates.

17. The method of claim 15, wherein the dielectric compound is selected from the group consisting of barium titanate, neodymium titanate, magnesium titanate, calcium titanate, lead titanate and strontium titanate.

18. The method of claim 15, wherein the dielectric compound is selected from the group consisting of a zirconate and a niobate.

19. The method of claim 15, wherein the dielectric compound is selected from the group consisting of magnesium zirconate and calcium zirconate.

20. The method of claim 1, wherein the coating material is a non-metallic compound.

21. The method of claim 20, wherein the non-metallic compound is a boride.

22. The method of claim 1, wherein the coating material is an organic compound.

23. The method of claim 1, wherein the coating material is polymethylmethacrylate.

24. The method of claim 1, wherein the coating material is polystyrene.

25. The method of claim 1, wherein the coating material is a surfactant.

26. The method of claim 1, wherein the coating material is hydrophobic.

27. The method of claim 1, wherein the coating material is hydrophilic.

28. The method of claim 1, wherein the coating is a monolayer coating.

29. The method of claim 1, wherein the forming comprises chemical vapor deposition.

30. The method of claim 1, wherein the forming comprises physical vapor deposition.

31. The method of claim 1, wherein the forming comprises gas-to-particle conversion.

32. The method of claim 1, wherein the forming comprises contacting the nickel-containing particles with a reactive gas composition.

33. The method of claim 1, wherein the forming comprises reaction at elevated temperature of a precursor selected from the group consisting of metal acetates, metal chlorides, metal alkoxides and metal halides.

34. The method of claim 1, wherein the forming comprises reaction of $SiCl_4$.

35. The method of claim 1, wherein the forming comprises reaction of $Si(OEt)_4$.

36. The method of claim 1, wherein the forming comprises reaction of $Mg(O_2CCH_3)_2$.

37. The method of claim 1, wherein the forming comprises reacting an organic or inorganic molecule with a surface of the particles to form the coating.

38. The method of claim 1, wherein the forming comprises reacting a surface of the particles with a functionalized organo silane compound.

39. The method of claim 38, wherein the functionalized organo silane compound is a halo-silane.

40. The method of claim 38, wherein the functionalized organo silane compound is an amino-silane.

41. The method of claim 38, wherein the functionalized organo silane compound is hexamethyldisilazane.

42. The method of claim 38, wherein the functionalized organo silane compound is trimethylsilylchloride.

43. The method of claim 1, wherein the forming comprises condensing a volatile coating material on the particles.

44. The method of claim 43, wherein the volatile coating material is selected from the group consisting of PbO, $MoO_3$ and $V_2O_5$.

45. The method of claim 1, wherein the preparing comprises forming the particles in a thermal reactor.

46. The method of claim 45, wherein the thermal reactor is a furnace reactor.

47. The method of claim 45, wherein the thermal reactor is a flame reactor.

48. The method of claim 45, wherein the thermal reactor is a plasma reactor.

49. The method of claim 1, comprising:

prior to the preparing, generating the aerosol stream, the aerosol stream as generated comprising droplets of flowable medium comprising liquid and a nickel-containing precursor; and the preparing comprising removing at least a portion of the liquid from the droplets.

50. The method of claim 49, wherein the precursor is dissolved in the liquid in the droplets.

51. The method of claim 50, wherein the precursor is a nickel salt.

52. The method of claim 49 wherein, during the generating, the droplets are formed by a spray nozzle.

53. The method of claim 49, wherein:

the generating comprises sweeping away with carrier gas the droplets from a reservoir of the flowable medium ultrasonically energized by a plurality of ultrasonic transducers underlying the reservoir.

54. The method of claim 53, comprising:

after the forming, cooling the aerosol stream, the cooling comprising passing the aerosol through a perforated conduit while introducing a quench gas into the perforated conduit through openings in a wall of the perforated conduit.

55. A method for making a nickel-containing product feature, the method comprising:

making the coated nickel-containing particles according to claim 1; and after the making, processing the coated nickel-containing particles to make a feature of a product comprising nickel from the coated nickel-containing particles.

56. The method of claim 55, wherein the product is a microelectronic device.

57. The method of claim 55, wherein the product is a multilayer ceramic.

58. The method of claim 57, wherein the feature is a conductive trace.

59. The method of claim 58, wherein the conductive trace has a line width of less than 25 μm.

60. The method of claim 55, wherein the product is a multilayer ceramic capacitor and the feature is an internal electrode of the multi-layer ceramic capacitor.

61. The method of claim 60, wherein the internal electrode has an average thickness of not greater than 2 μm.

62. The method of claim 55, wherein the product is a flat panel display.

63. The method of claim 62, wherein the flat panel display is a plasma display panel.

64. The method of claim 63, wherein the feature is an electrode of the plasma display panel.

65. The method of claim 63, wherein the feature is a bus line of the plasma display panel.

66. The method of claim 55, wherein the product is an energy storage device.

67. The method of claim 66, wherein the energy storage device is a battery.

* * * * *